United States Patent [19]
Iwasaki et al.

[11] Patent Number: 5,725,963
[45] Date of Patent: *Mar. 10, 1998

[54] MAGNETORESISTANCE EFFECT ELEMENT

[75] Inventors: Hitoshi Iwasaki; Yuichi Ohsawa; Reiko Kondoh, all of Yokohama; Susumu Hashimoto, Ebina; Atsuhito Sawabe, Yokosuka; Yuzo Kamiguchi; Masashi Sahashi, both of Yokohama, all of Japan

[73] Assignee: Kabushiki Kaisha Toshiba, Kawasaki, Japan

[*] Notice: The term of this patent shall not extend beyond the expiration date of Pat. No. 5,549,978.

[21] Appl. No.: 652,849

[22] Filed: May 23, 1996

Related U.S. Application Data

[62] Division of Ser. No. 144,258, Nov. 1, 1993, Pat. No. 5,549,978.

[30] Foreign Application Priority Data

| Oct. 30, 1992 | [JP] | Japan | 4-315648 |
| Mar. 12, 1993 | [JP] | Japan | 5-78919 |
| Mar. 15, 1993 | [JP] | Japan | 5-53605 |
| Mar. 15, 1993 | [JP] | Japan | 5-53612 |

[51] Int. Cl.$^6$ ................................. G11B 5/127
[52] U.S. Cl. ............... 428/611; 428/622; 428/627; 428/629; 428/632; 428/639; 428/641; 428/660; 428/667; 428/670; 428/678; 428/692; 428/900; 428/928; 360/113; 324/252
[58] Field of Search ........................ 428/611, 622, 428/627, 629, 632, 639, 641, 660, 667, 670, 678, 692, 900, 928; 360/113; 324/252

[56] References Cited

U.S. PATENT DOCUMENTS

| 4,663,685 | 5/1987 | Tsang | 360/113 |
| 4,835,069 | 5/1989 | Sawada et al. | 428/694 T |
| 5,001,586 | 3/1991 | Aboaf et al. | 360/113 |
| 5,057,380 | 10/1991 | Hayashi et al. | 428/692 |
| 5,068,147 | 11/1991 | Hori et al. | 428/336 |
| 5,159,513 | 10/1992 | Dieny et al. | 360/113 |
| 5,236,791 | 8/1993 | Yahisa et al. | 428/694 |
| 5,301,079 | 4/1994 | Cain et al. | 360/113 |
| 5,304,975 | 4/1994 | Saito et al. | 338/32 R |
| 5,408,377 | 4/1995 | Gurney et al. | 360/113 |
| 5,422,571 | 6/1995 | Gurney et al. | 324/252 |
| 5,465,185 | 11/1995 | Heim et al. | 360/113 |

FOREIGN PATENT DOCUMENTS

| 2-61572 | 3/1990 | Japan . |
| 4-49606 | 2/1992 | Japan . |
| 4-214207 | 8/1992 | Japan . |
| 4-280483 | 10/1992 | Japan . |
| 4-339309 | 11/1992 | Japan . |
| 4-321913 | 11/1992 | Japan . |
| 4-360009 | 12/1992 | Japan . |
| 4-358310 | 12/1992 | Japan . |
| 6-60336 | 3/1994 | Japan . |

OTHER PUBLICATIONS

Physical Review B. vol. 45. No. 14, Apr. 1, 1992, pp. 7795–7804, W.F. Egelhoff, Jr., et al., "Antiferromagnetic Coupling In FE/CU/FE and CO/CU/CO Multilayers on CU(111)".

*Primary Examiner*—Stevan A. Resan
*Attorney, Agent, or Firm*—Oblon, Spivak, McClelland, Maier & Neustadt, P.C.

[57] ABSTRACT

It is an object of the present invention to provide a magnetoresistance effect element which has a film with a spin valve structure or an artificial lattice film having good soft magnetic characteristics, and which can be applied to a high-sensitivity magnetic head. The present invention provides a magnetoresistance effect element including a stacked film formed on a substrate by sequentially stacking a ferromagnetic film containing as its main constituents at least one elements selected from the group consisting of Co, Fe, and Ni, a nonmagnetic film, and the ferromagnetic film, wherein the two ferromagnetic films are not coupled with each other, and the closest packed plane of each ferromagnetic film is oriented in a direction perpendicular to the film surface.

14 Claims, 47 Drawing Sheets

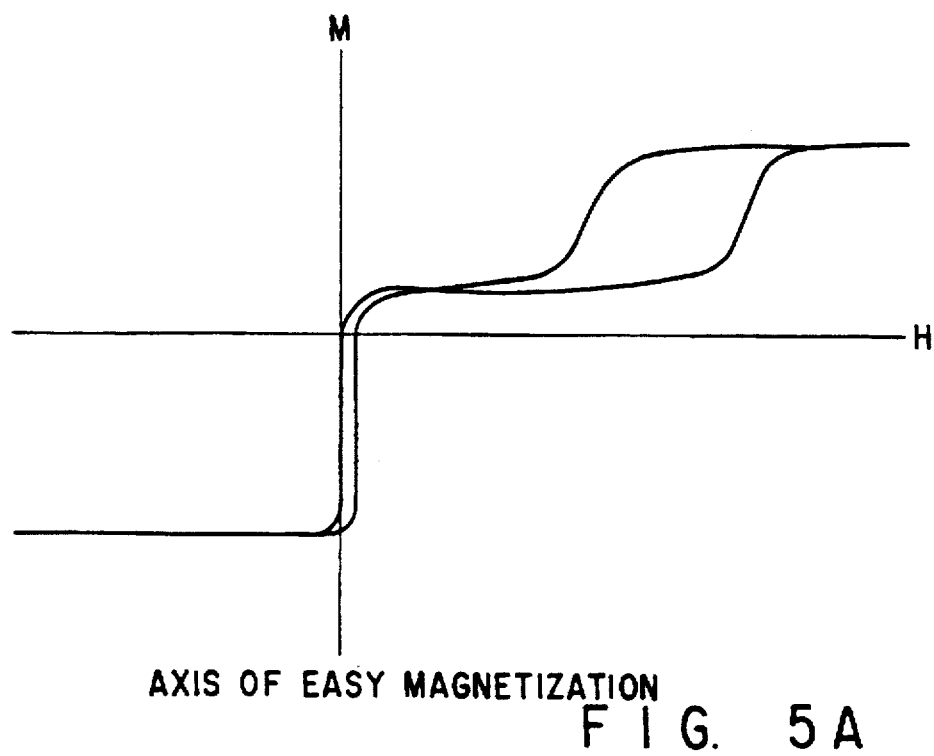
AXIS OF EASY MAGNETIZATION
F I G. 5 A
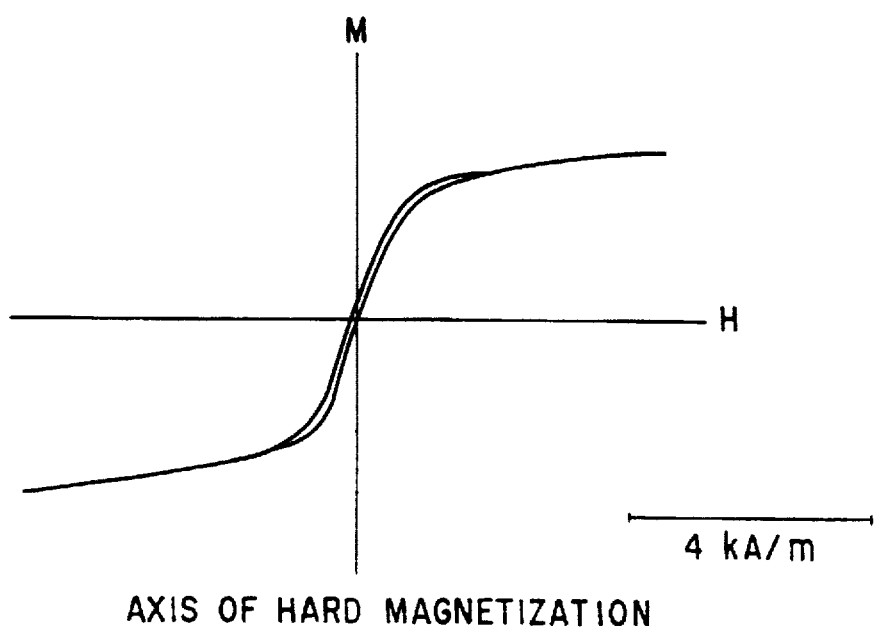
4 kA/m
AXIS OF HARD MAGNETIZATION
F I G. 5 B

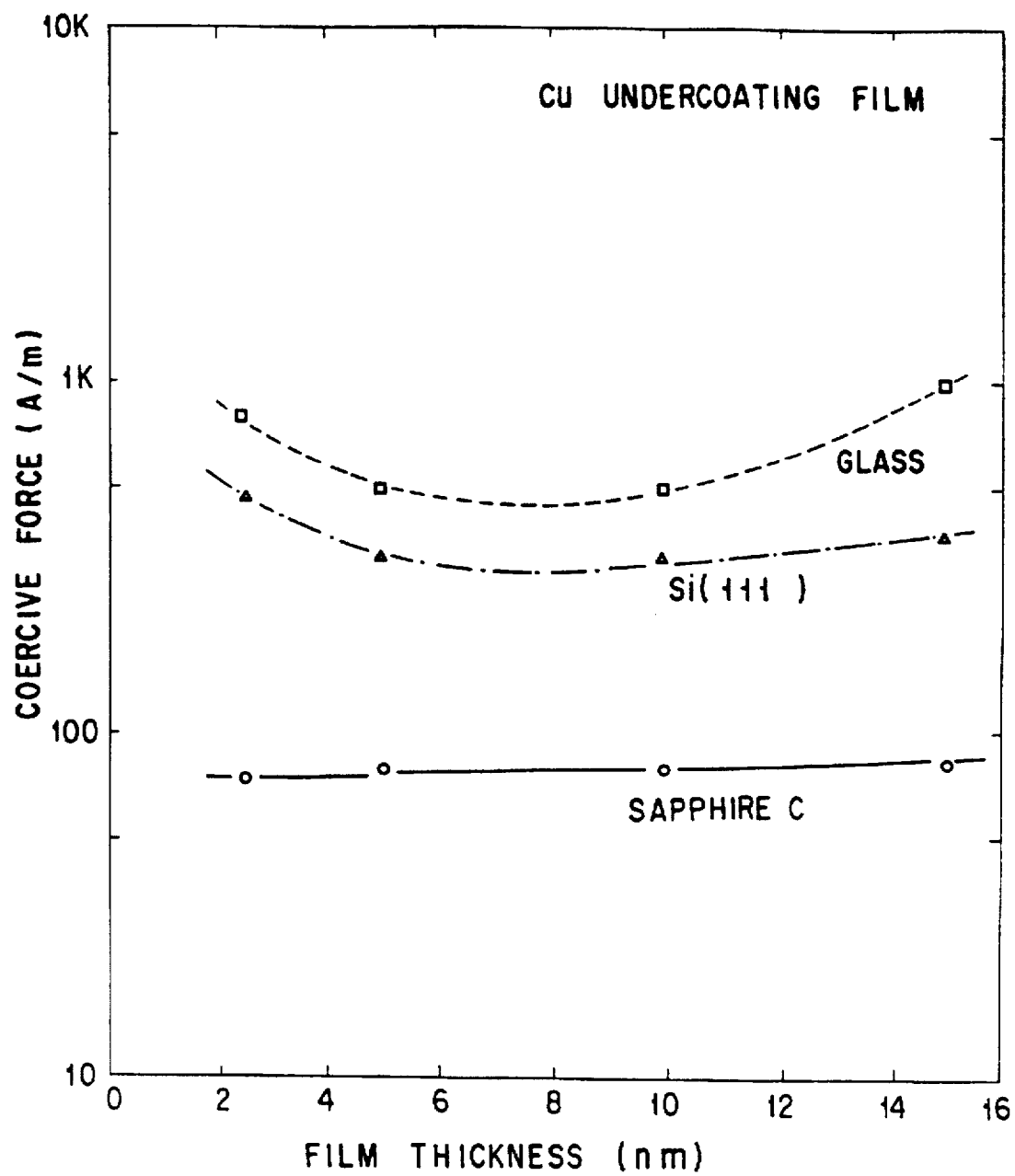
F I G. 8

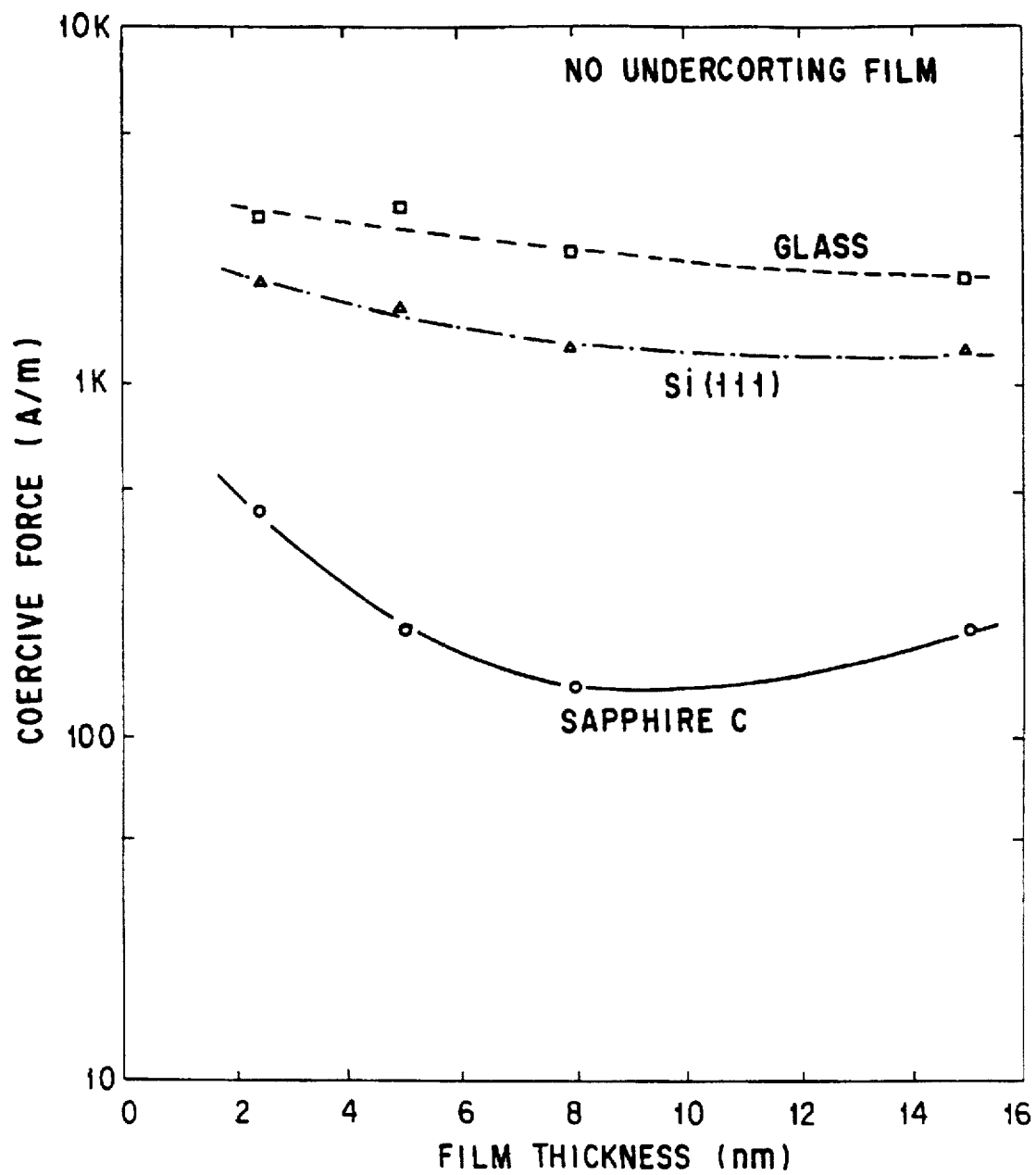
F I G. 9

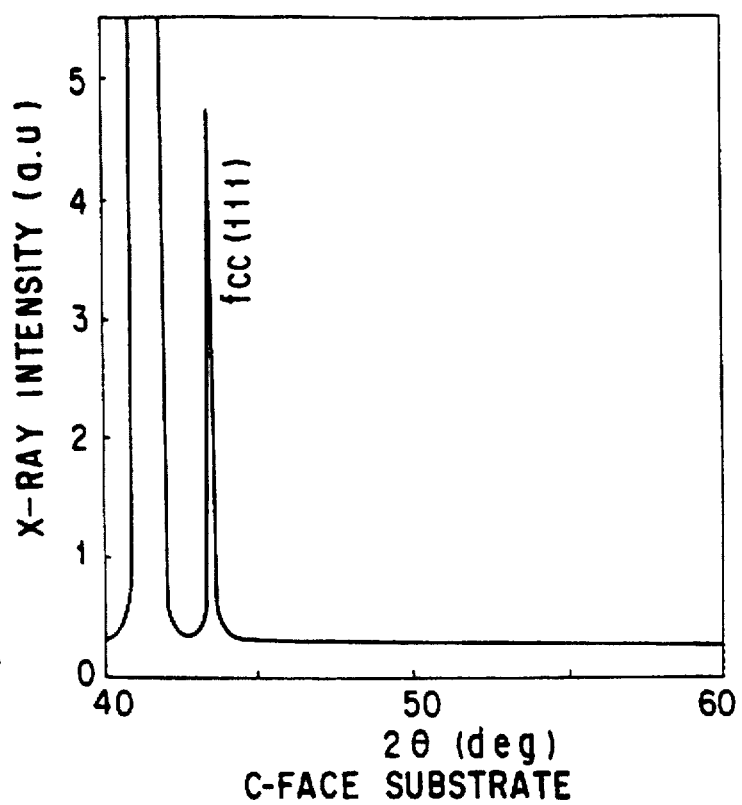
F I G. 11A
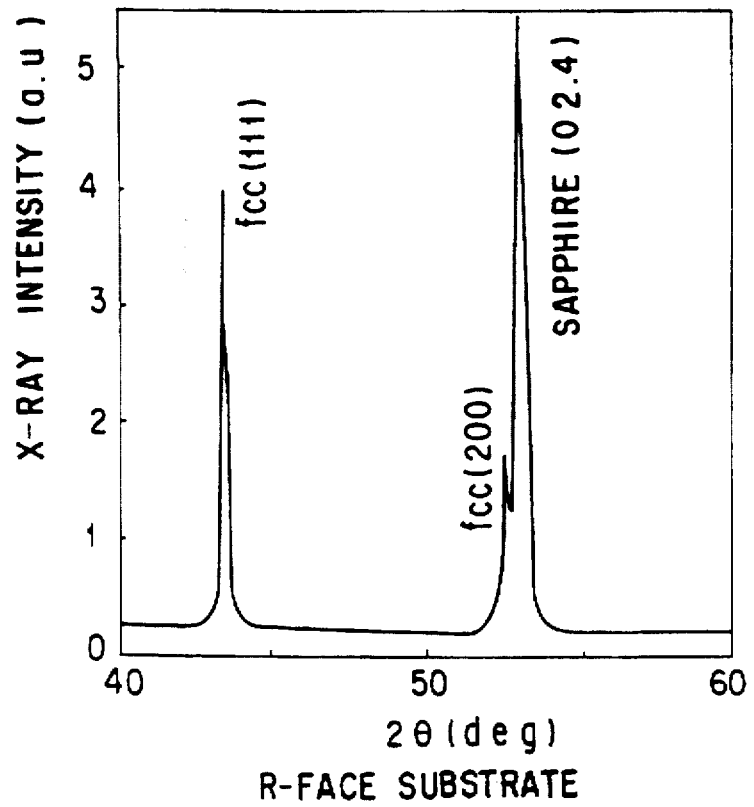
F I G. 11B

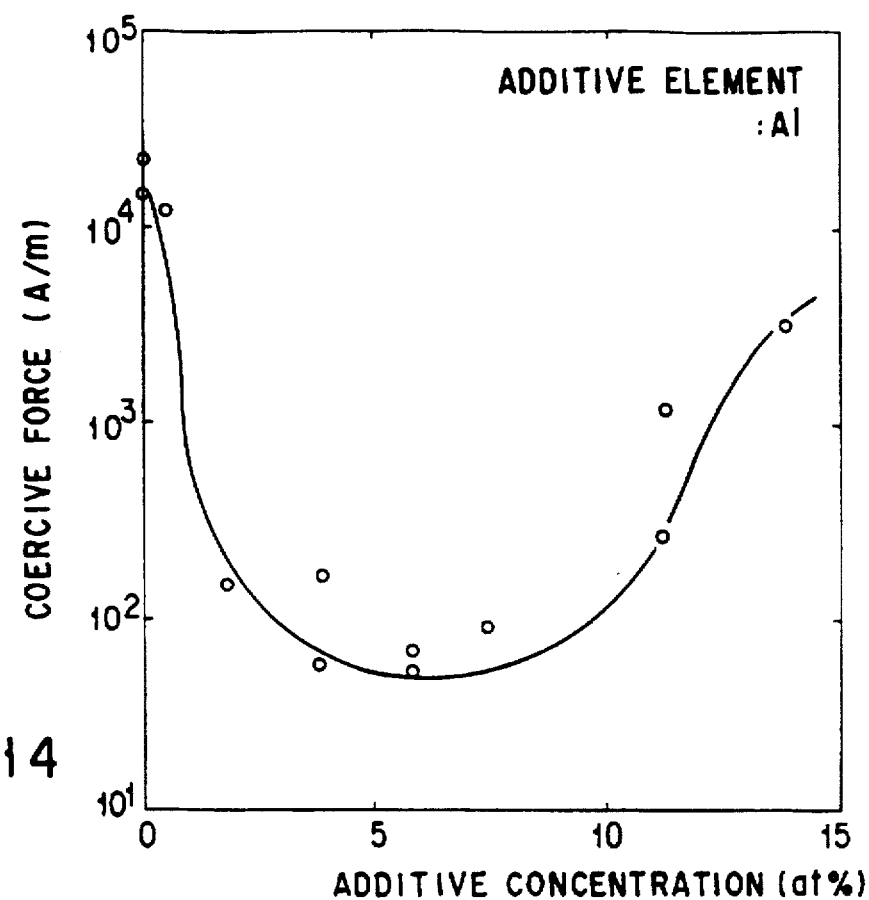
F I G. 14
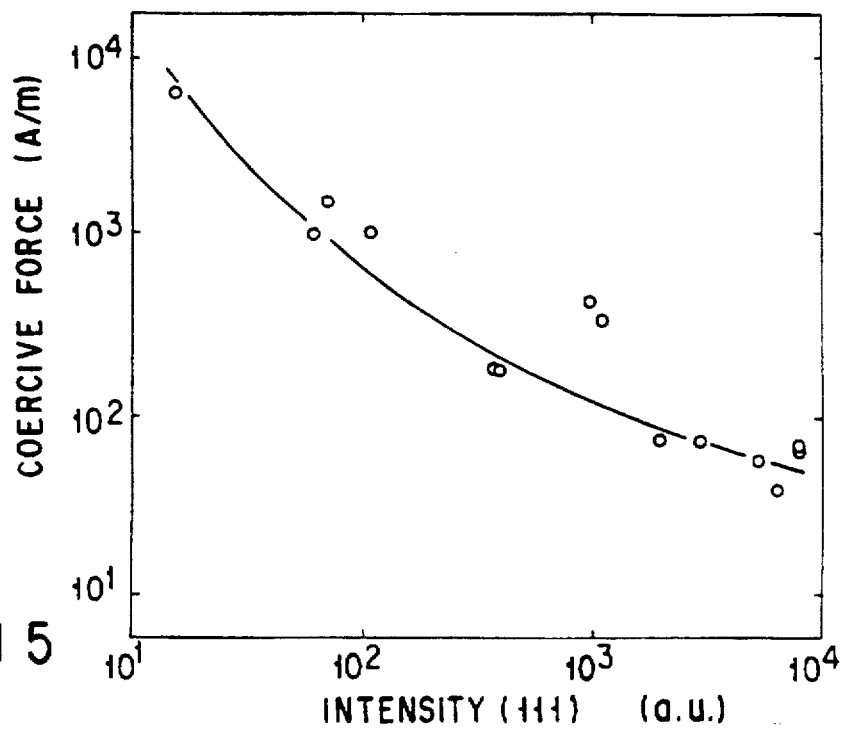
F I G. 15

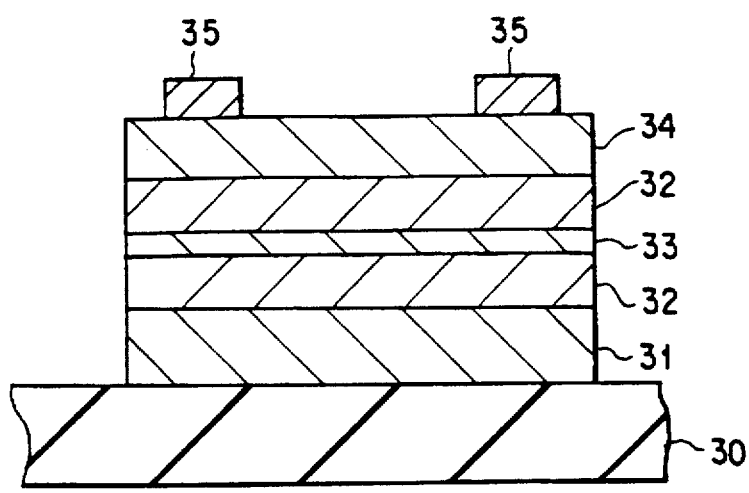
F I G. 18
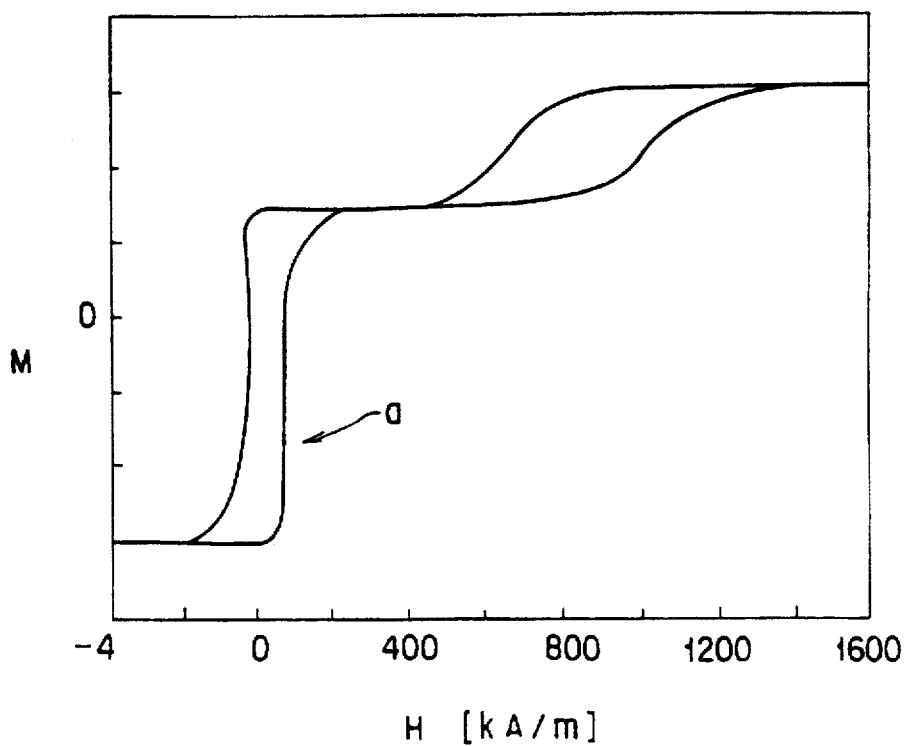
F I G. 19

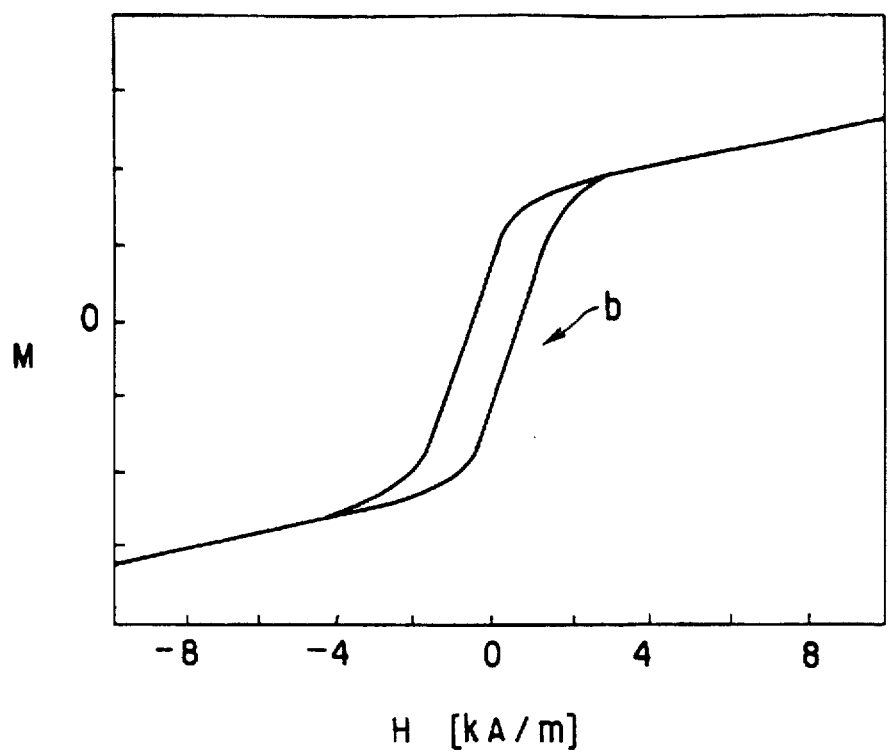
F I G. 20
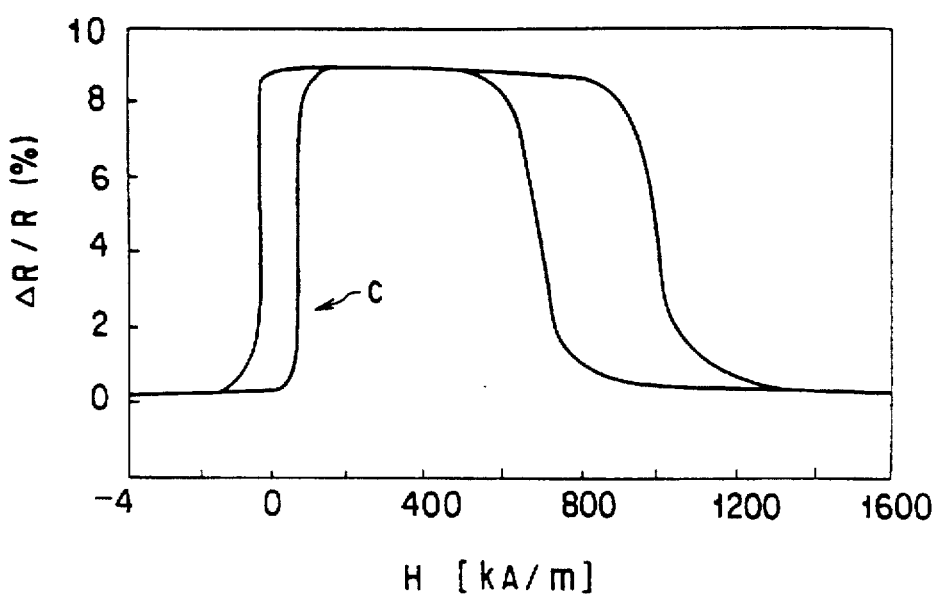
F I G. 21

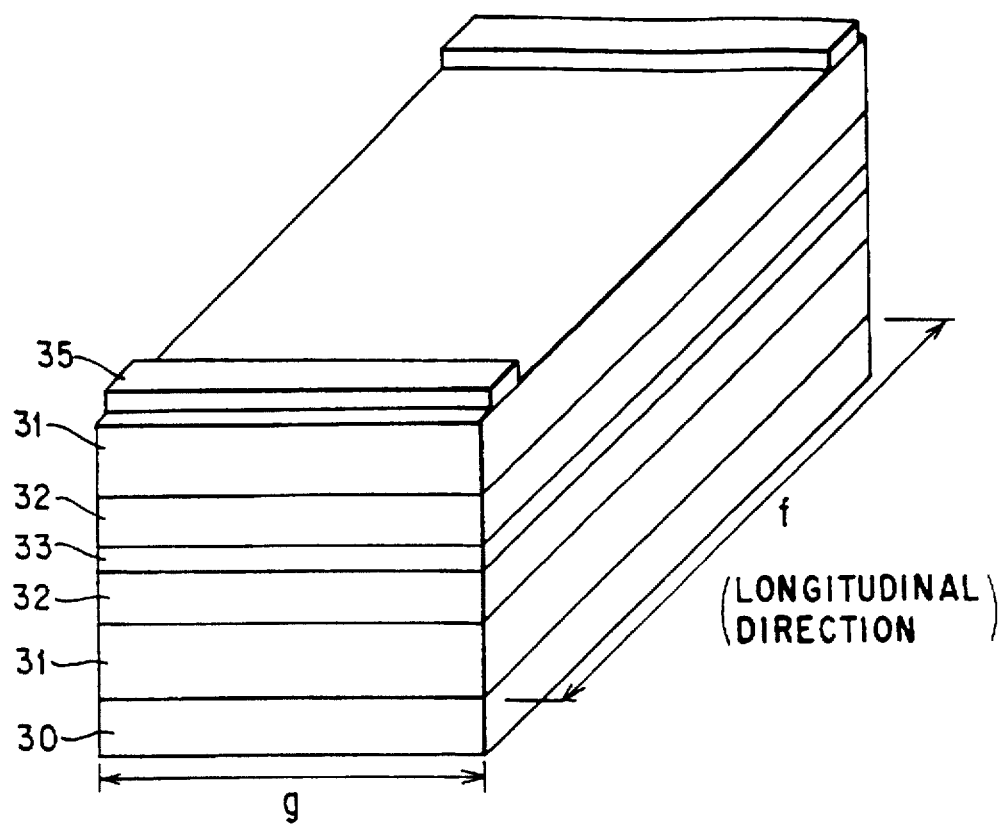
F I G. 26
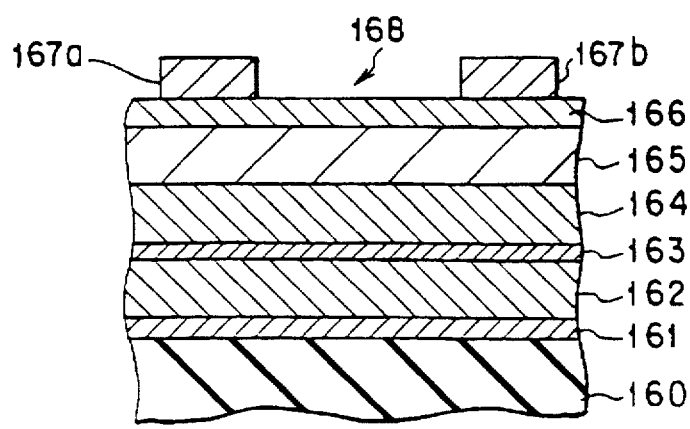
F I G. 27

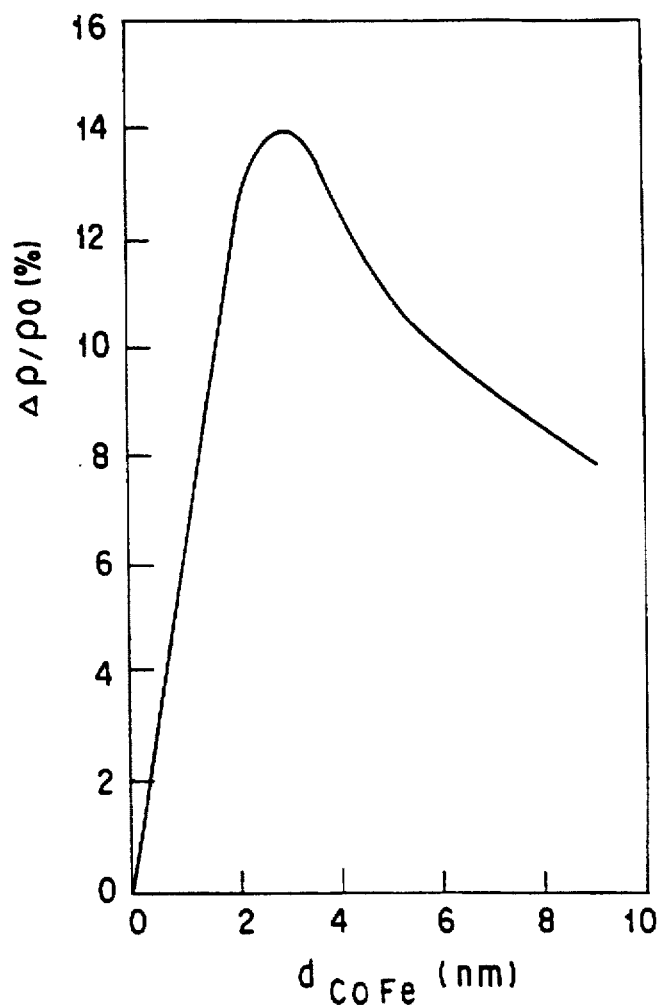
F I G. 28
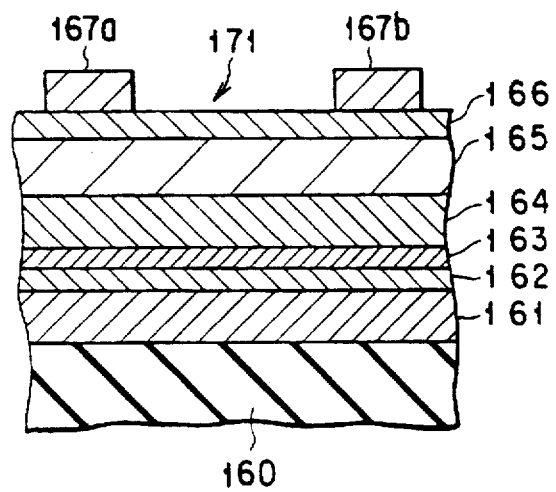
F I G. 29

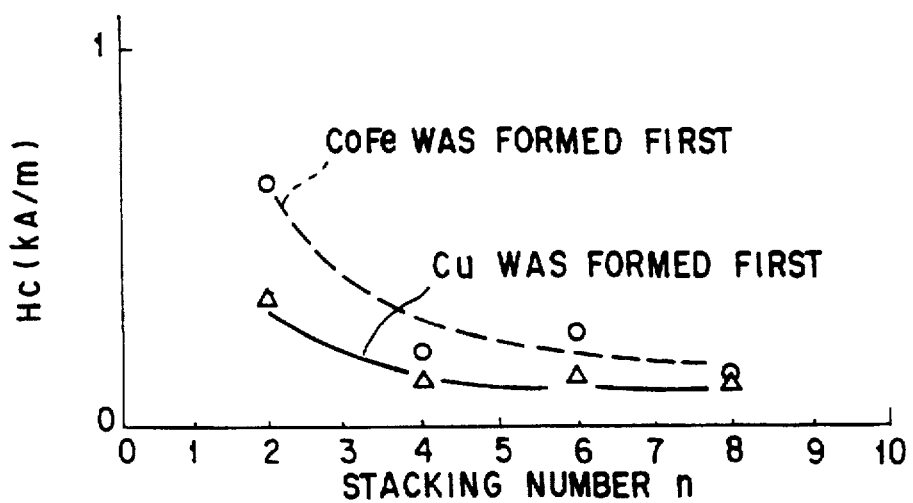
F I G. 34
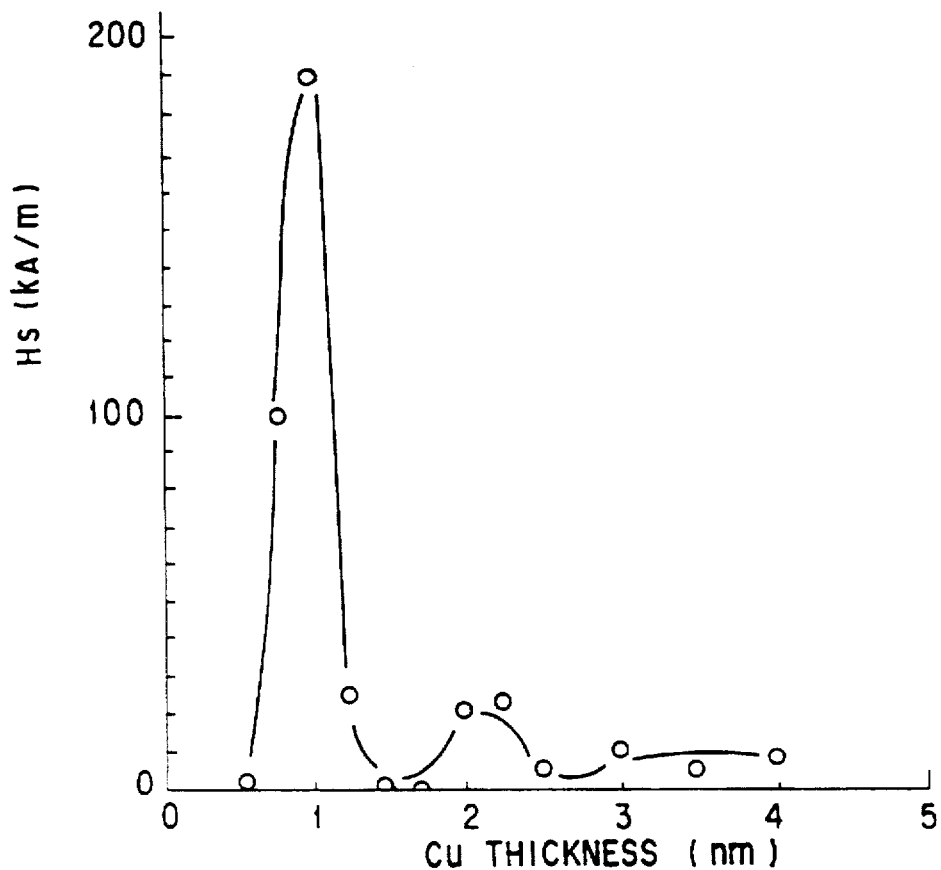
F I G. 35

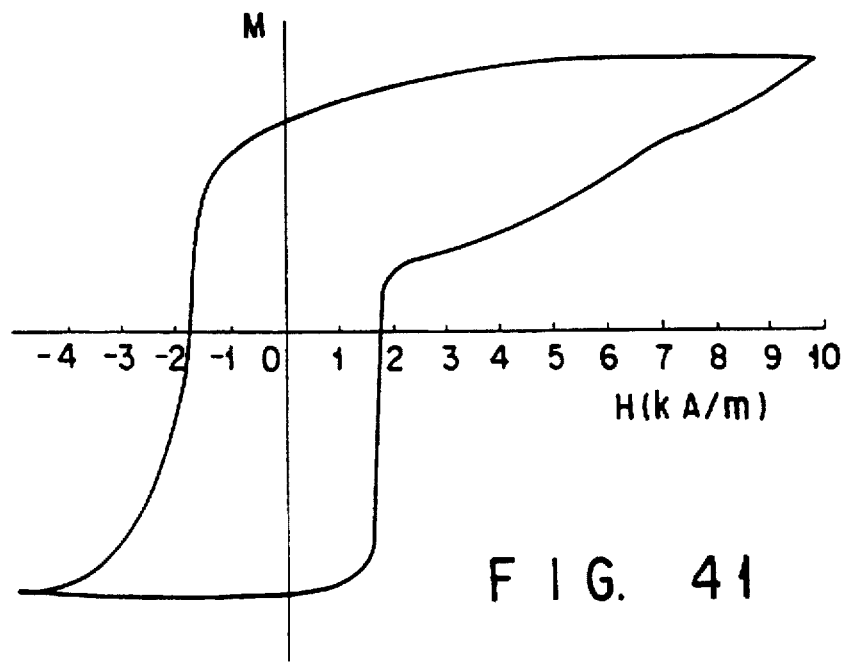
F I G. 41
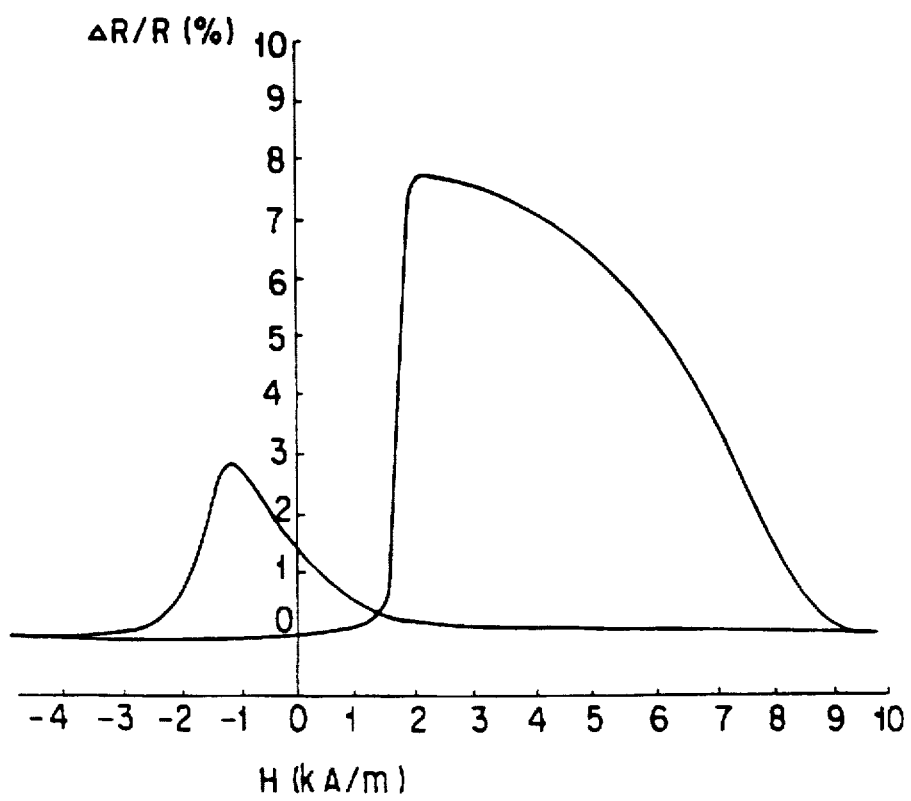
F I G. 42

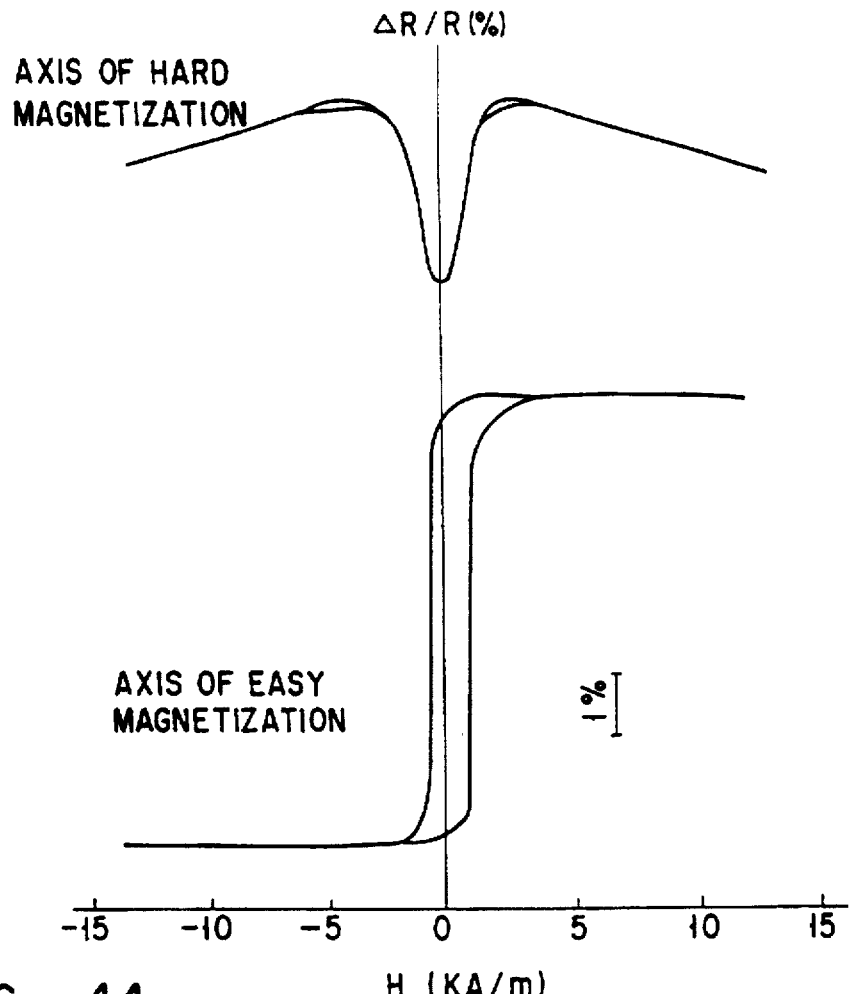
F I G. 44
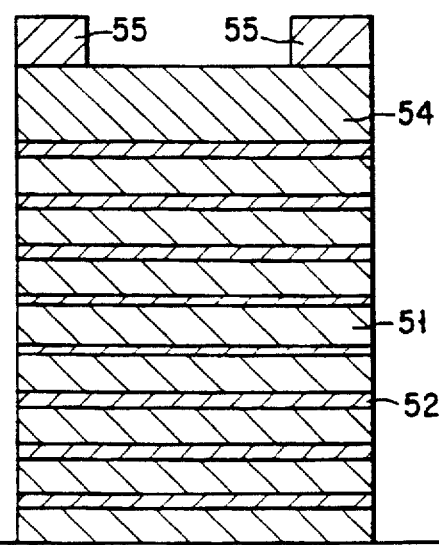
F I G. 45

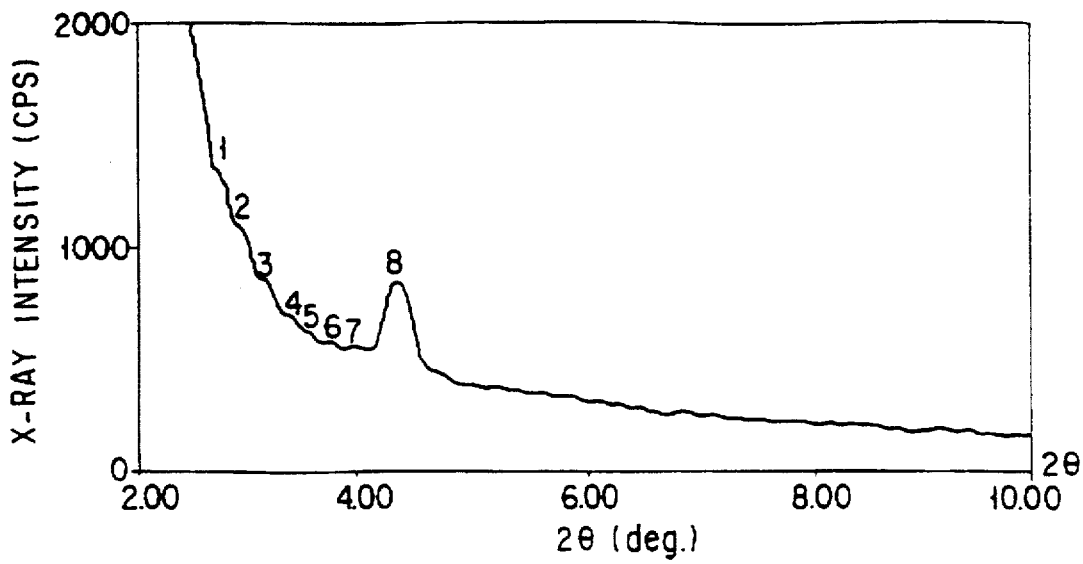
X-RAY DIFFRACTION CURVES OF CoFe/Cu ARTIFICIAL
LATTICE FILM ON MgO(110)-FACE SUBSTRATE
SMALL-ANGLE REFLECTION (PERIODIC STRUCTURE OF FILM)
F I G. 49A
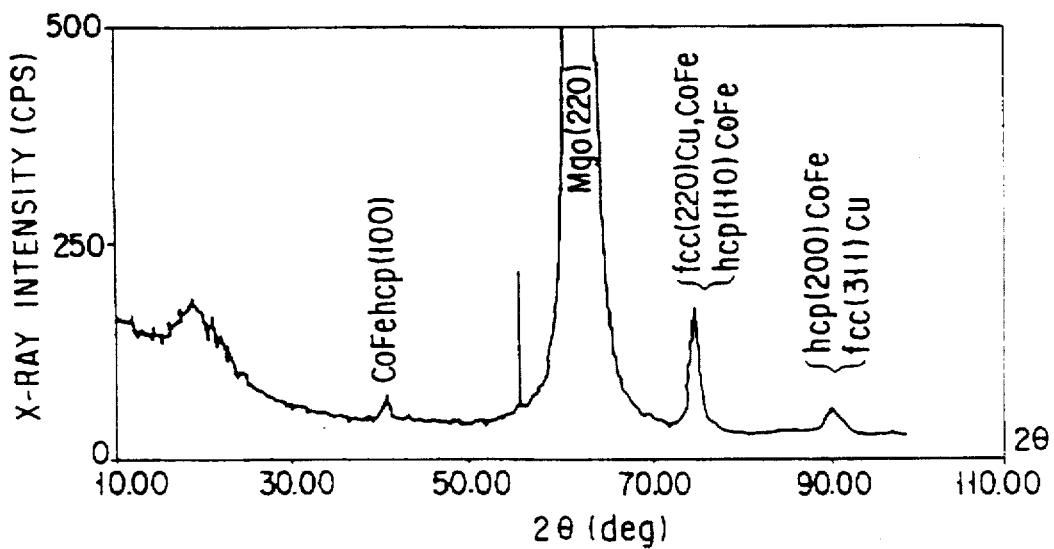
X-RAY DIFFRACTION CURVES OF CoFe/Cu ARTIFICIAL
LATTICE FILM ON MgO(110)-FACE SUBSTRATE
MEDIUM-ANGLE REFLECTION (CRYSTAL STRUCTURE OF FILM)
F I G. 49B

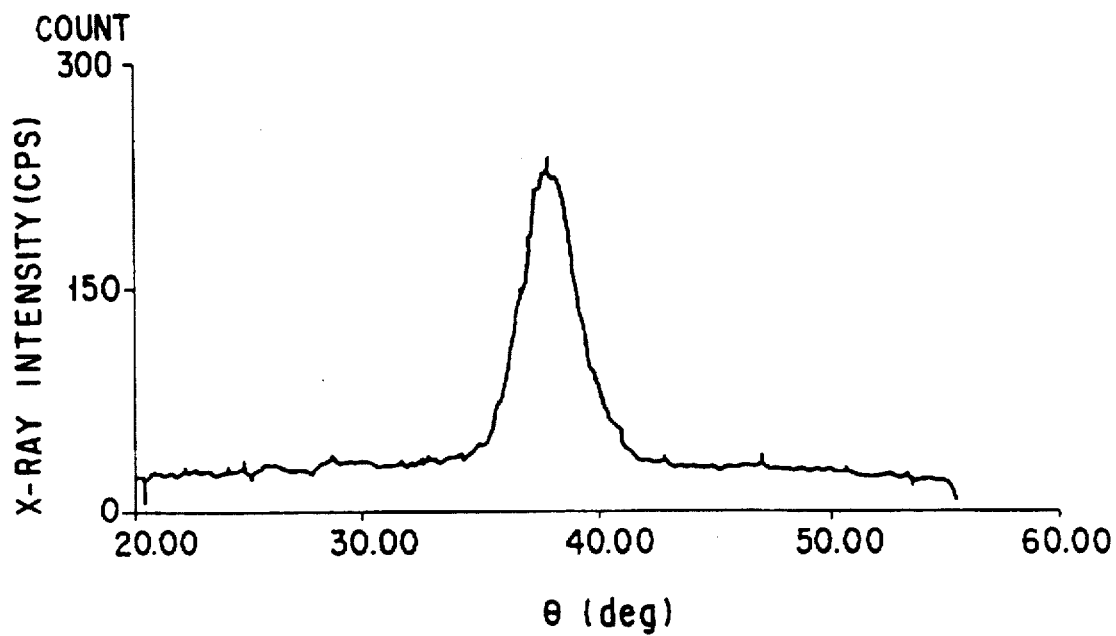
F I G. 50A
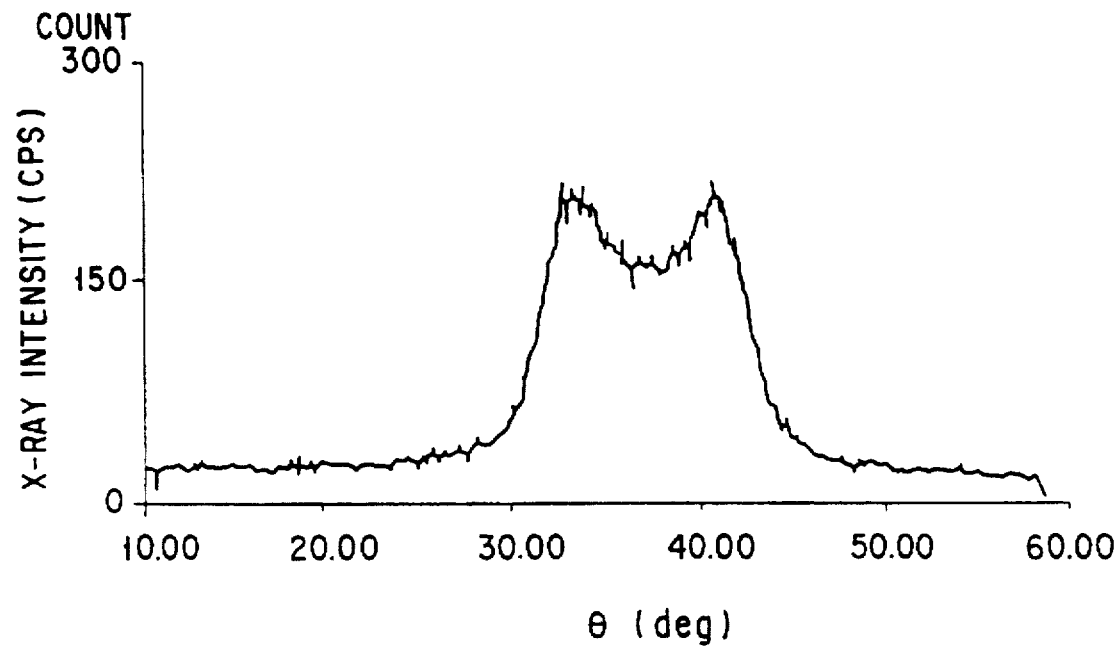
F I G. 50B

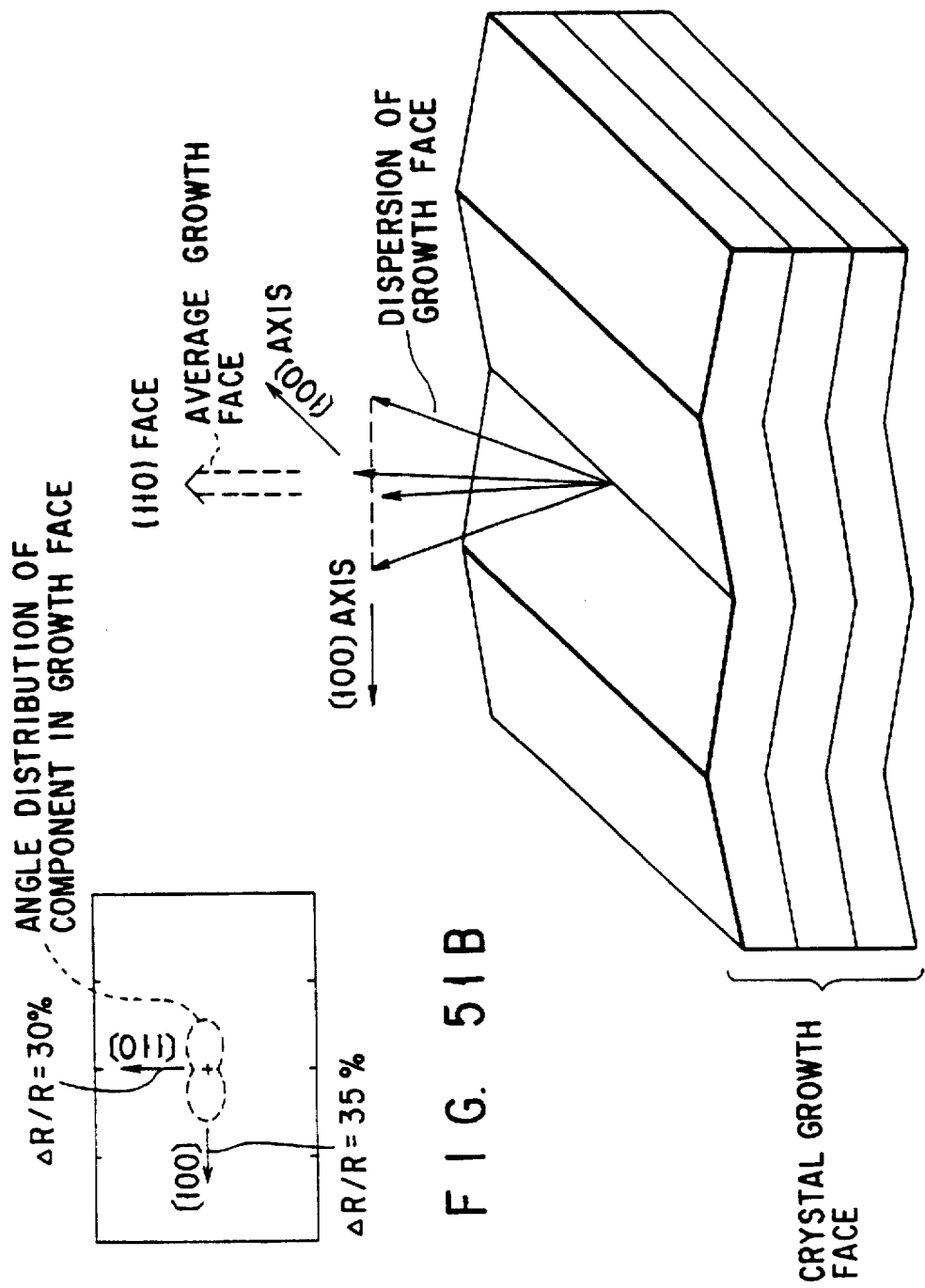

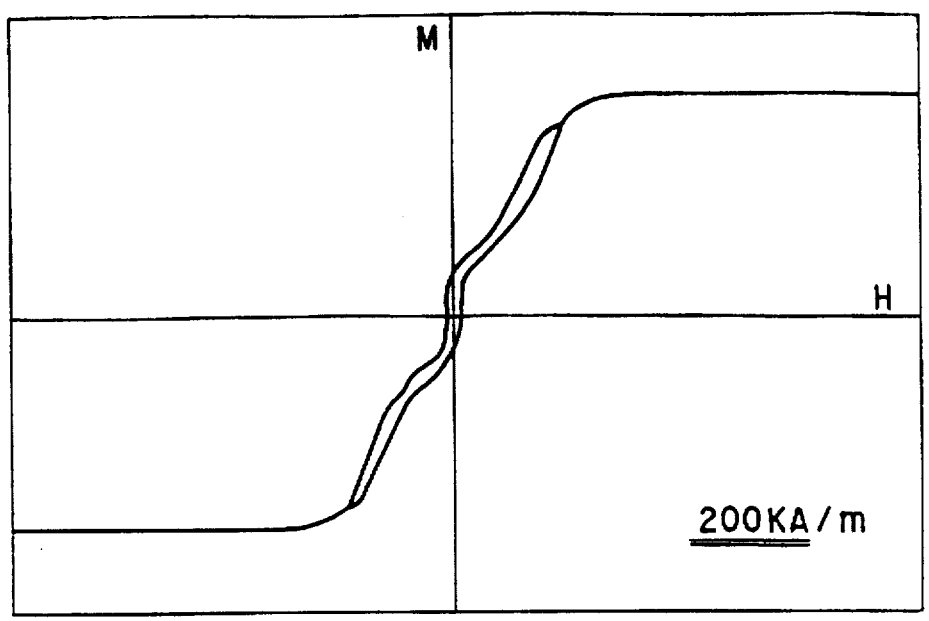
F I G. 52 A
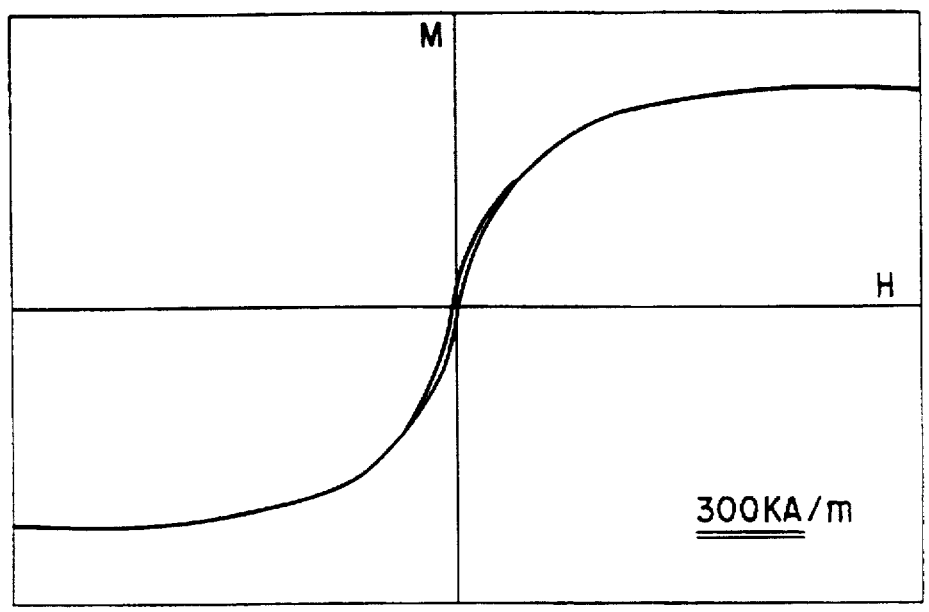
F I G. 52 B

SUBSTRATE BIAS-DEPENDENCY OF RESISTANCE CHANGE RATE ON MgO (110)-FACE SUBSTRATE

*: STACKING NUMBER 13

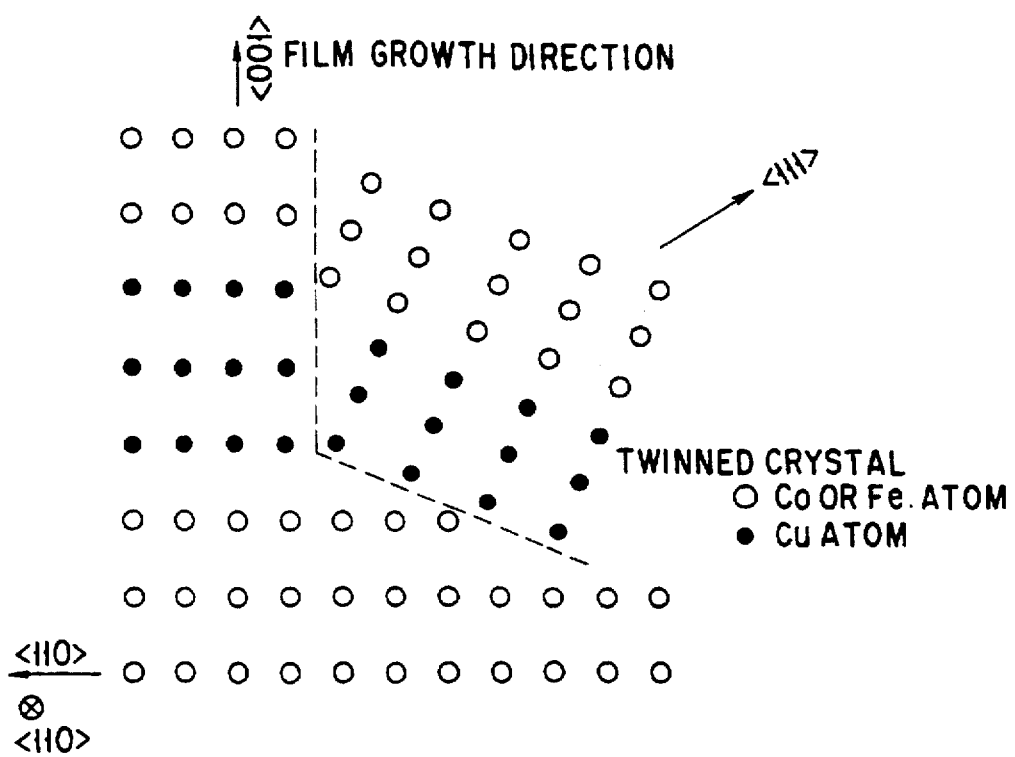
F I G. 56
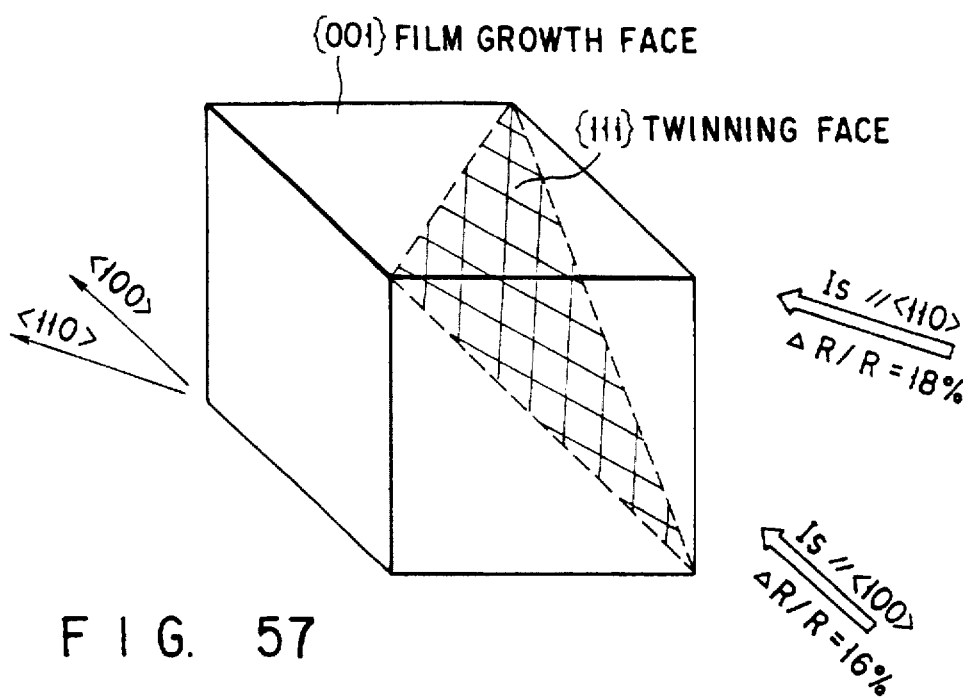
F I G. 57

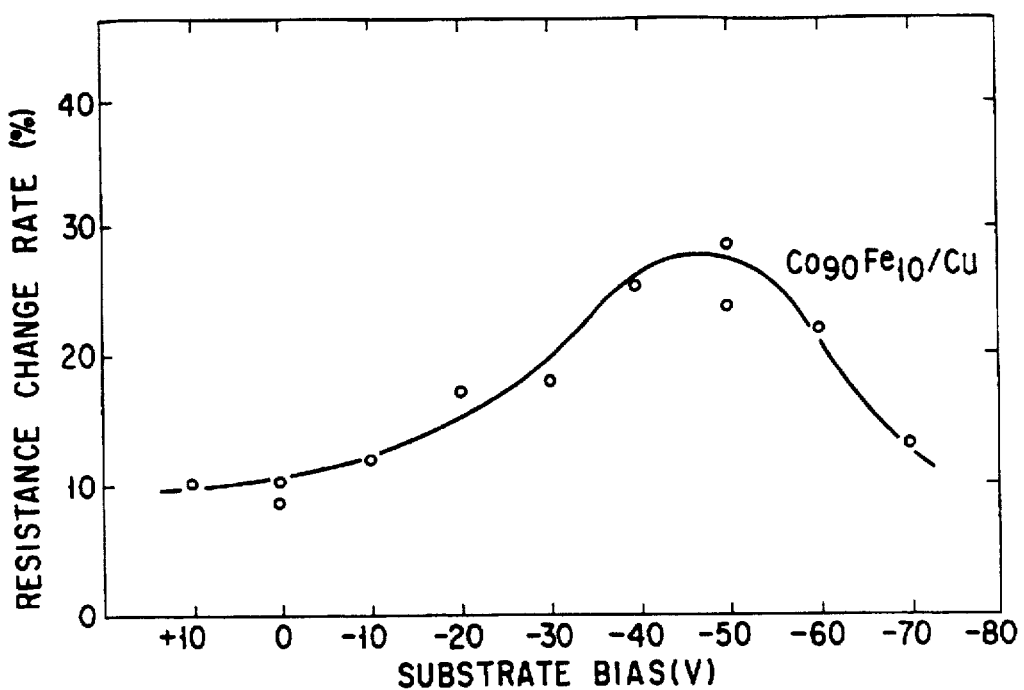
F I G. 58
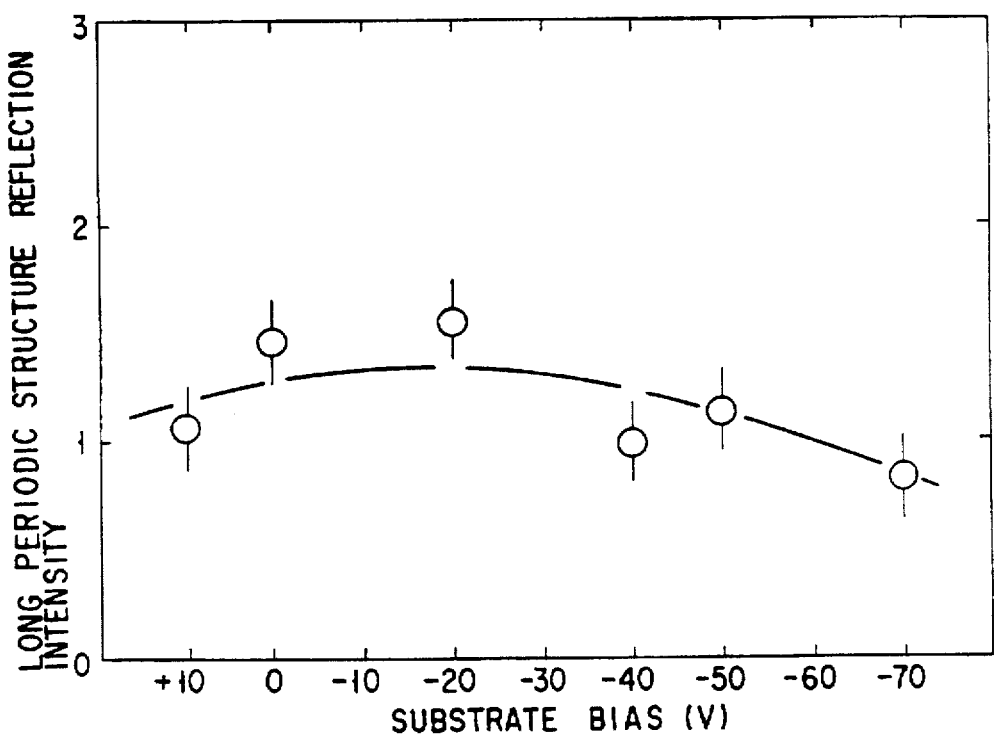
F I G. 59

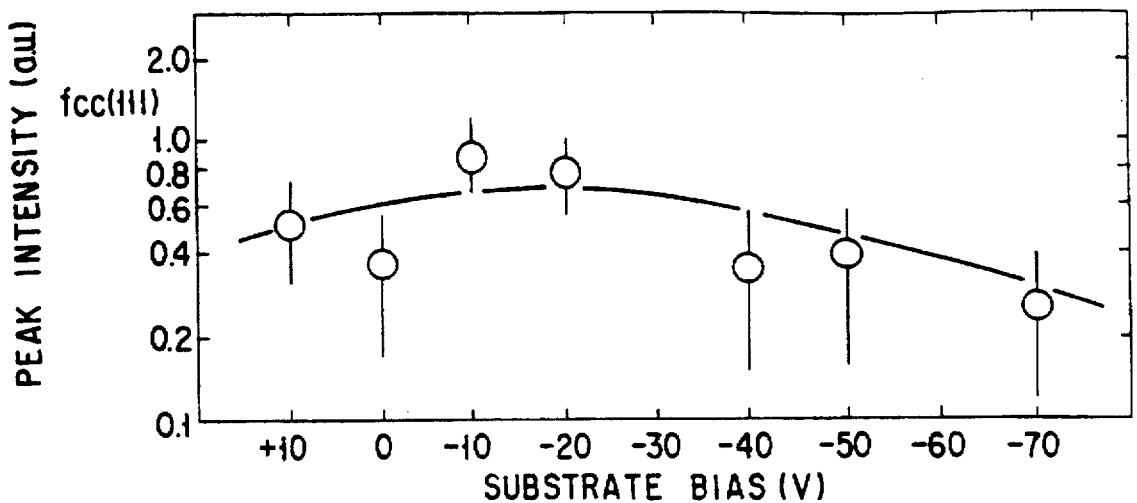
F I G. 60
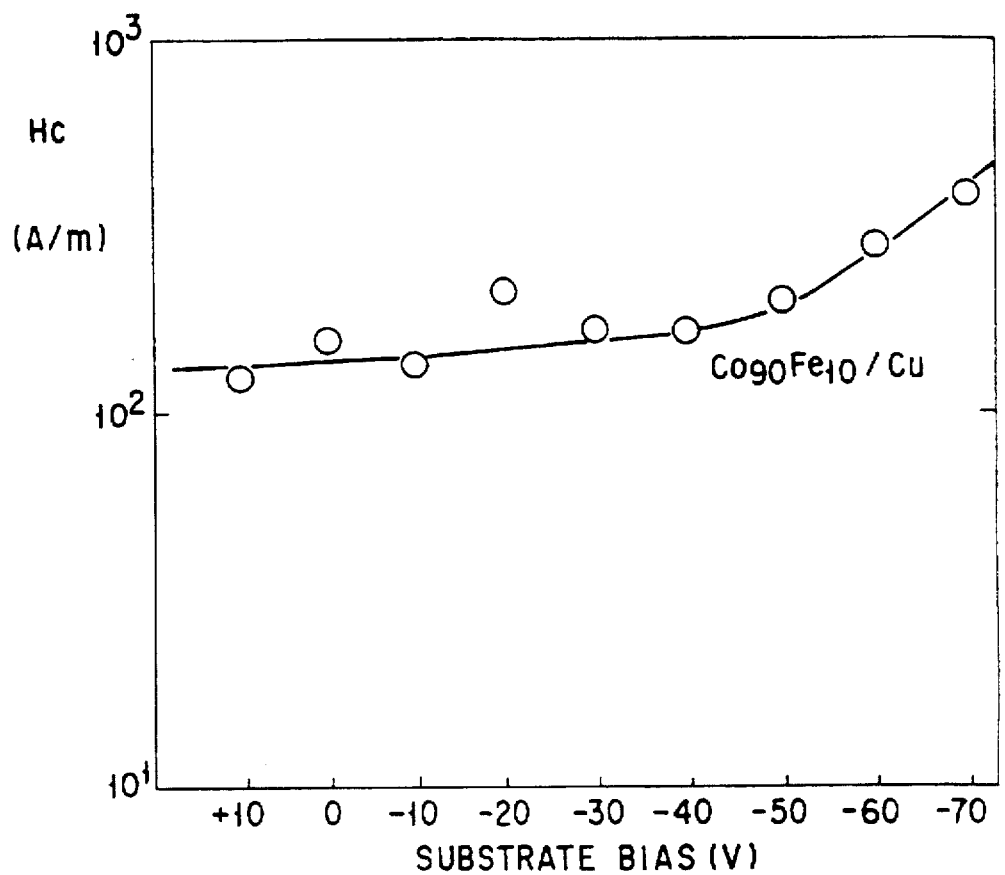
F I G. 61

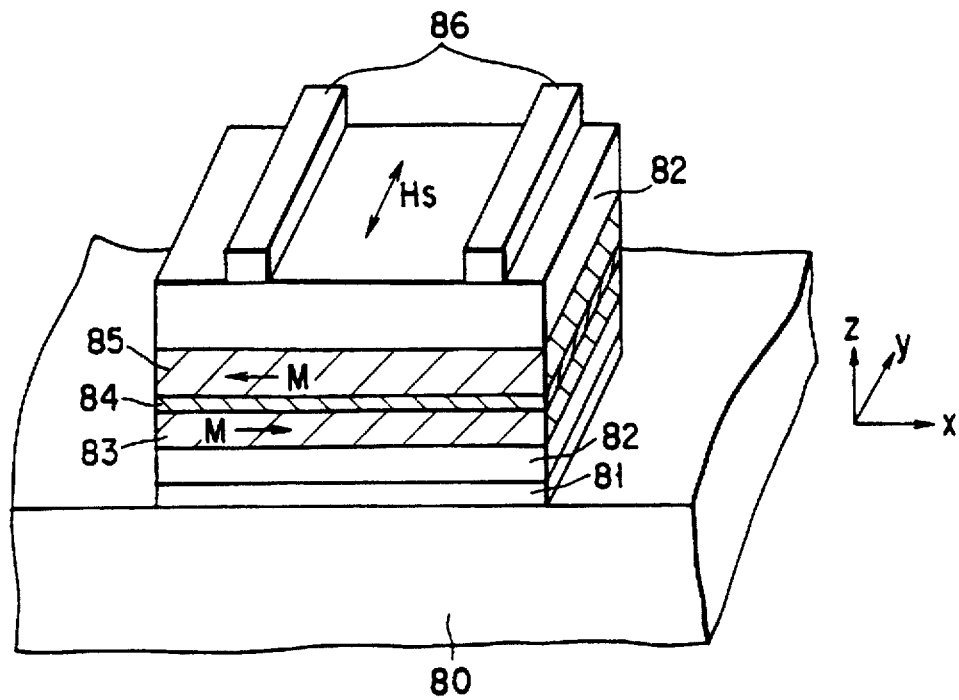
M INDICATES DIRECTION OF MAGNETIC MOMENT
WHEN SIGNAL MAGNETIC FIELD IS 0.
F I G. 62
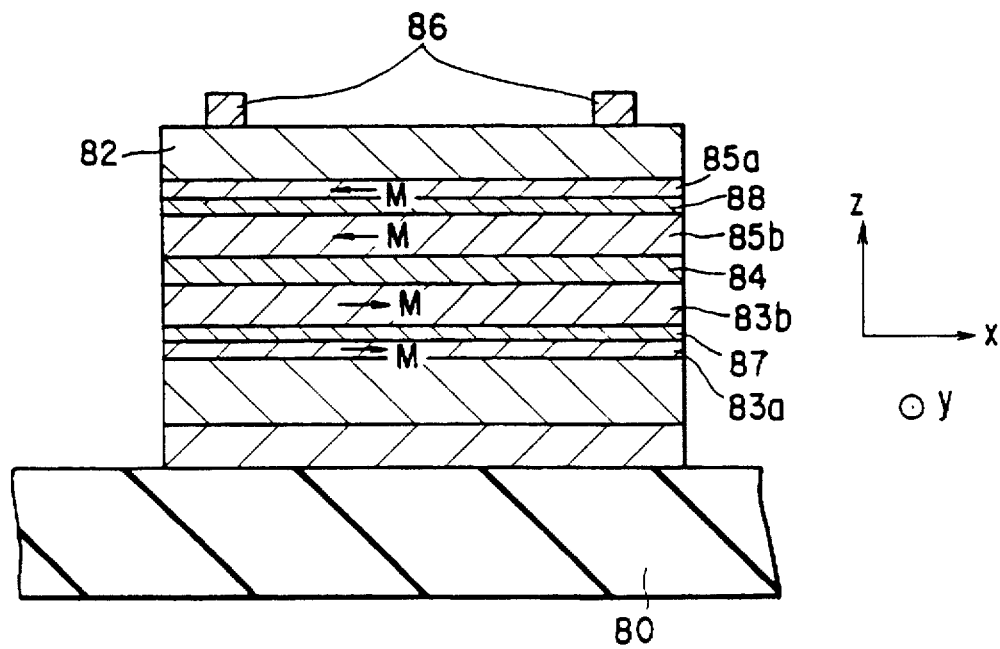
F I G. 63

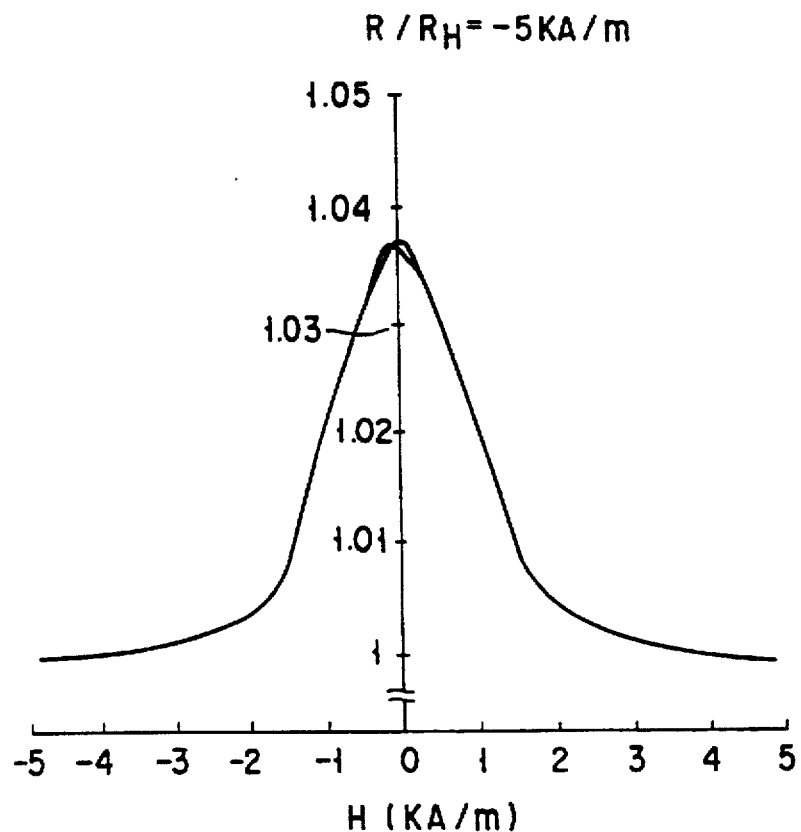
F I G. 68
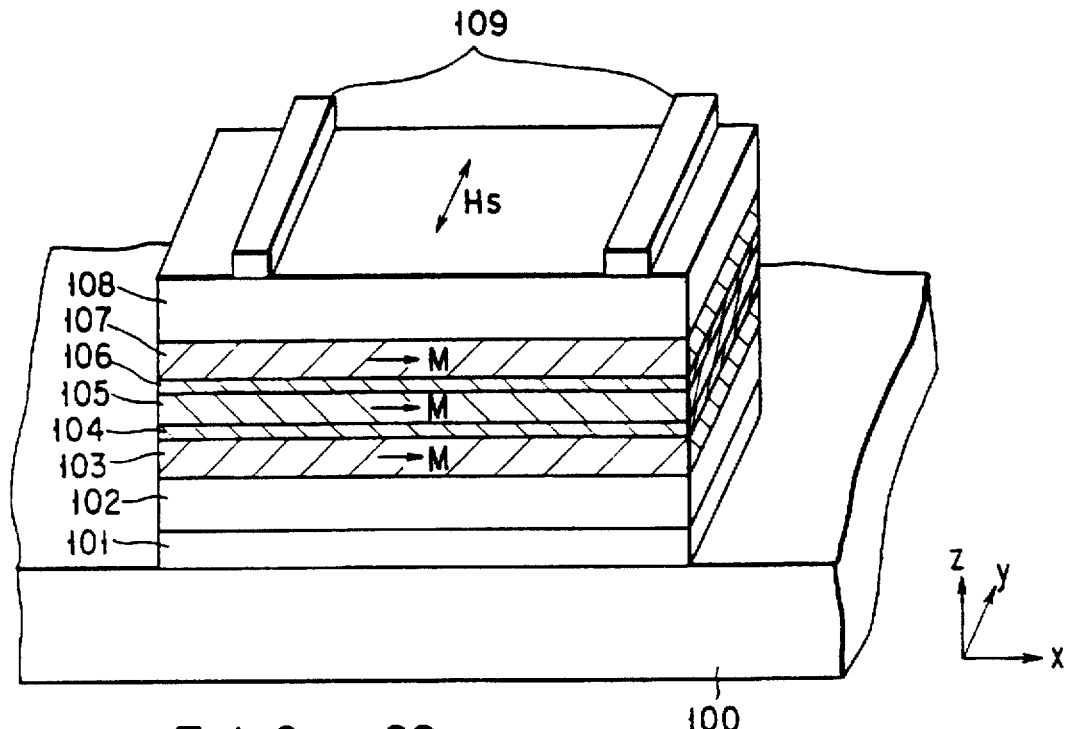
F I G. 69

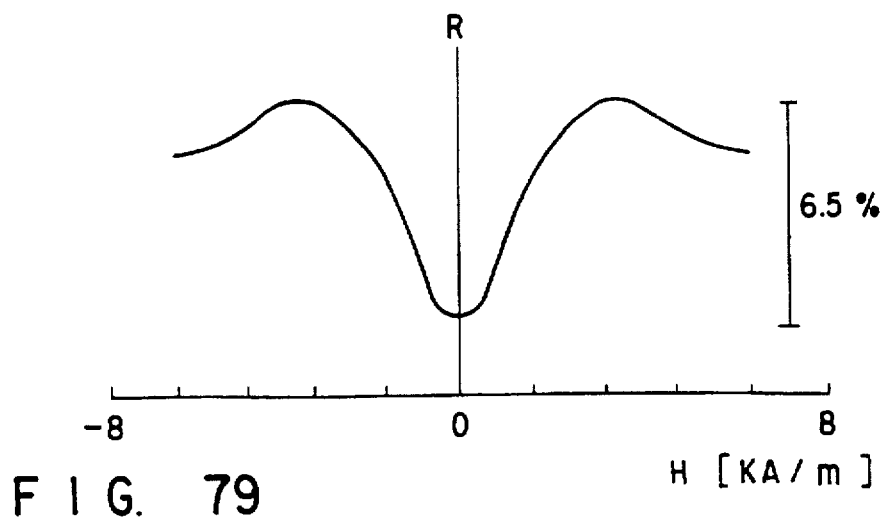
F I G. 79
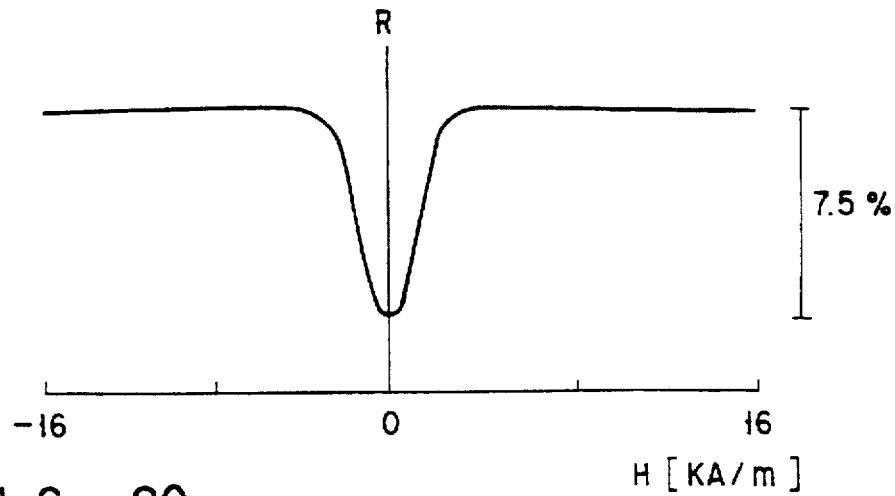
F I G. 80
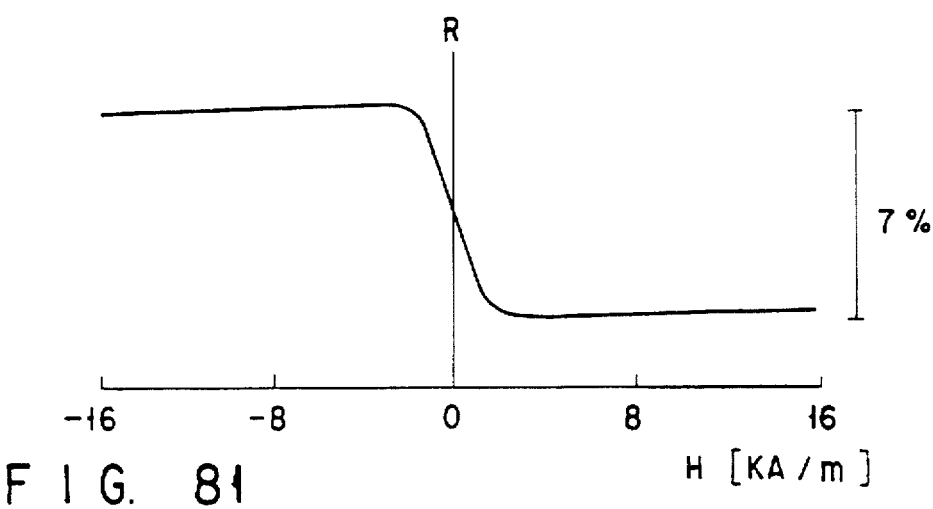
F I G. 81

MAGNETORESISTANCE EFFECT ELEMENT

This is a Division, of application Ser. No. 08/44,258, filed on Nov. 1, 1993, now U.S. Pat. No. 5,549,978.

BACKGROUND OF THE INVENTION

1. Field of the Invention

The present invention relates to a magnetoresistance effect element for use in a magnetic head and the like.

2. Description of the Related Art

Generally, to read out information recorded in a magnetic recording medium, a reading magnetic head with a coil is moved relative to the recording medium, and a voltage induced in the coil by electromagnetic induction generated upon the movement is detected. A method using a magnetoresistance effect head to head out information is also known [IEEE MAG-7, 150 (1971)]. This magnetoresistance effect head makes use of a phenomenon in which the electrical resistance of a certain kind of a ferromagnetic substance changes according to the intensity of an external magnetic field, and is known as a high-sensitivity head for a magnetic recording medium. Recently, as magnetic recording media have been decreased in size and increased in capacity, the relative velocity between a reading magnetic head and a magnetic recording medium during information reading has decreased. Therefore, development of a magnetoresistance effect head capable of extracting a high output even at a low relative velocity has been desired increasingly.

Conventionally, an NiFe alloy to be abbreviated as a permalloy hereinafter) has been used in a portion (to be referred to as an MR element hereinafter) of a magnetoresistance effect head in which the resistance changes in response to an external magnetic field. The permalloy, even one with good soft magnetic characteristics, has a maximum rate of change in magnetic resistance of about 3%, and this value is too low to use the permalloy as the MR element for a small-size, large-capacity magnetic recording medium. For this reason, a demand has arisen for an MR element material with a highly sensitive magnetic resistance change.

In recent years, it has been confirmed that a multilayered film formed by alternately stacking ferromagnetic metal films and nonmagnetic metal films, such as Fe/Cr or Co/Cu, under certain conditions, i.e., a so-called artificial lattice film gives rise to a very large change in magnetic resistance by using antiferromagnetic coupling between adjacent ferromagnetic films, and a film which exhibits a maximum rate off change in magnetic resistance exceeding 100% has been reported [Phys. Rev. Lett., Vol. 61, 2472 (1988)] [Phys. Rev. Lett., Vol. 64, 2304 (1990)].

Another type of a structure has also been reported, in which although ferromagnetic films do not experience antiferromagnetic coupling, an exchange bias is applied to one of two ferromagnetic films sandwiching a nonmagnetic film by using some means other than antiferromagnetic coupling between adjacent ferromagnetic films, thereby locking the magnetization of the film, while the magnetization of the other ferromagnetic film is reversed by an external magnetic field. This forms a state in which the two ferromagnetic films are antiparallel to each other on both the sides of the nonmagnetic film, realizing a large change in magnetic resistance. This type is herein termed a spin valve structure [Phys. Rev. B., Vol. 45806 (1992)] [J. Appl., Phys., Vol. 69, 4774 (1991)].

In either of the artificial lattice film or the spin valve structure, the resistance change characteristics and the magnetic characteristics of the multilayered film change largely in accordance with the type of the ferromagnetic film. For example, in a spin valve structure using Co, such as Co/Cu/Co/FeMn, a high resistance change rate of 8% results, but the coercive force is as high as approximately 20 Oe, i.e., no good soft magnetic characteristics can be obtained. In contrast, in a spin valve structure using the permalloy, such as NiFe/Cu/NiFe/FeMn, although a good value of 1 Oe or less has been reported as the coercive force, the resistance change rate is not so high, about 4% [J. Al. Phys., vol. 69, 4774 (1991)]. That is, the soft magnetic characteristics of the stacked film are good, but its resistance change rate decreases. Therefore, neither a constituent element nor a film structure of a stacked film which satisfies both the soft magnetic characteristics and the resistance change rate has been reported yet.

In addition, the above two types of the films have the following problems.

The artificial lattice film has a higher resistance change rate $\Delta R/R$ (ignoring a magnetic field range) than that of the spin valve structure. However, a saturation magnetic field Hs of the artificial lattice film is large because antiferromagnetic coupling is strong, so the film suffers poor soft magnetic characteristics. In addition, since this RKKY-like antiferromagnetic coupling is sensitive to an interface structure, stable film formation is difficult to perform, and deterioration with time readily takes place.

A film with the spin valve structure can achieve good soft magnetic characteristics when an NiFe film is used as the ferromagnetic film. Since, however, the number of interfaces between the ferromagnetic films and the nonmagnetic film is two, the $\Delta R/R$ is lower than that of the artificial lattice film. Even if a stacked film is constituted by ferromagnetic, nonmagnetic, and antiferromagnetic films in order to increase the number of interfaces, since the antiferromagnetic film with a high resistance is present in this stacked film, spin-dependent scattering is suppressed. Therefore, no increase in the $\Delta R/R$ can be expected.

In addition, when a signal magnetic field is applied in the direction of the axis of hard magnetization of ferromagnetic films suitable for a magnetic head, the magnetization of only one of the ferromagnetic films is rotated. As shown in FIG. 1, therefore, the angle defined between the magnetization of a ferromagnetic film 2 on an antiferromagnetic film 1 and the magnetization of a ferromagnetic film 4 on a nonmagnetic film 3 can be changed to only about 90° by the application of the signal magnetic field. Note that a change in the angle of up to 180° occurs in the direction of the axis of easy magnetization. Consequently, the $\Delta R/R$ decreases to about half that in the axis of easy magnetization. Assume, for example, that the exchange bias magnetic field of the ferromagnetic film 2 on the antiferromagnetic film 1 is weakened by some method to make it possible to use the magnetization rotations of both the ferromagnetic films 2 and 4. In this case, if the film thickness of the nonmagnetic film 3 is decreased to increase the resistance change mate, ferromagnetic coupling acts between the two ferromagnetic films. Therefore, the magnetizations between the two ferromagnetic films point in the same direction when the signal magnetic field is 0. Consequently, even if magnetizations rotate upon application of the signal magnetic field, only a slight change results in the angle between the magnetizations of the two ferromagnetic films, and so the resistance change is also subtle.

Furthermore, the ferromagnetic coupling acting between the two ferromagnetic films when the film thickness of the nonmagnetic film is decreased causes deterioration in permeability. The NiFe film having good soft magnetic characteristics has a normal anisotropic magnetoresistance effect. However, in a system in which a sense current is flowed in a direction perpendicular to a signal magnetic field, when the signal magnetic field is 0 and the magnetizations of two ferromagnetic films point in the same direction, the anisotropic magnetoresistance effect obtained by the signal magnetic field and the resistance change obtained by spin-dependent scattering cancel each other out, as shown in FIG. 2.

Common problems of the artificial lattice film and the spin valve structure will be described below. First, in order to obtain a high sensitivity in a magnetic head, a current to be supplied must be increased as large as possible. If the current is increased in either of the film structures, however, the magnetization directions of some ferromagnetic films are disturbed by a magnetic field produced by this current, preventing a highly sensitive resistance change with respect to the magnetic field. More specifically, the magnetization readily points in the direction of the current magnetic field in the vicinities of the uppermost and lowermost layers of the stacked film, so the current magnetic field is strong in these portions.

Second, there are serious problems such as the Barkhausen noise suppression and operating point bias, to be solved in applying the film to a magnetic head.

As described above, no existing magnetoresistance effect elements with the artificial lattice film or the spin valve structure using spin-dependent scattering can exhibit both good soft magnetic characteristics and a high resistance change rate ΔR/R, which are essential to obtain a high sensitivity, even upon supply of a large current.

SUMMARY OF THE INVENTION

The present invention has been made in consideration of the above situation and has as its object to provide a magnetoresistance effect element which has a film with a spin valve structure or an artificial lattice film having good soft magnetic characteristics, and which can be applied to a high-sensitivity magnetic head.

In a magnetoresistance effect element which has a film with a spin valve structure or an artificial lattice film having good soft magnetic characteristics, and which can be applied to a high-sensitivity magnetic head, Co, CoFe, CoNi, NiFe, sendust, NiFeCo, $Fe_8N$ and the like may be used as a material of a ferromagnetic film. It is preferable that a thickness of the ferromagnetic film falls in the range of 1 to 20 nm. In the magnetoresistance effect element, a nonmagnetic metal such as Mn, Fe, Ni, Cu, Al, Pd, Pt, Rh, Ru, Ir, Au or Ag and an alloy such as CuPd, CrPt, CuAr, CuNi, as a material CuDi of a nonmagnetic film. It is preferable that a thickness of the nonmagnetic film falls in the range of 0.5 to 20 nm, more preferably 0.8 to 5 nm.

According to the first aspect of the present invention, there is provided a magnetoresistance effect element comprising a stacked film formed on a substrate by sequentially stacking a ferromagnetic film consisting primarily of at least one elements selected from the group consisting of Co, Fe, and Ni, a nonmagnetic film, and above ferromagnetic film, wherein the two ferromagnetic films are not coupled with each other, and the closest packed plane of each ferromagnetic film is oriented in a direction perpendicular to the film surface. In particular, it is desired that the ferromagnetic films made of $Co_{1-x}Fe_x$ ($0<x\leq0.4$) exhibit high ΔR/R and low Hc.

In the first aspect, "the two ferromagnetic films are not coupled with each other" means that essentially no antiferromagnetic exchange coupling exists between the two ferromagnetic films in other words antiparallel magnetization alignment must be stabilized by another method (e.g. the use of a bias film). The term "closest packed plane" means (111) plane for fcc phase, and (001) plane for hcp phase.

In the first aspect of the invention, the method of orienting the closest packed plane of the ferromagnetic film in the directing perpendicular to the film surface can be selected from: a method of adding to the material of the ferromagnetic film at least one element selected from the group consisting of Pd, Al, Cu, Ta, In, B, Nb, Hf, Mo, W, Re, Ru, Rh, Ga, Zr, Ir, Au, and Ag (of these elements, Pd, Cu, Au and Ag are particular desirable since they cause virtually no decrease in resistance change rate), a method of using the C face of a sapphire substrate as the substrate on which the ferromagnetic film is formed, and a method of forming, between the substrate and the ferromagnetic film, an undercoating film made of a material selected from the group consisting of material having fcc lattice, such as materials which fcc (face centered cubic) Bravais lattice or rhombohedral Bravais lattice (e.g., Cu, Ni, CuNi, NiFe, NiO, Ge, Si, GaAs), Ti, a magnetic amorphous metal (e.g., CoZrNb, CoHfTa or the like), and a nonmagnetic amorphous material.

More specific examples of the material of the above undercoating film are, when a ferromagnetic film having an fcc phase, such as a $Co_{90}Fe_{10}$ film, is used as the Co-based ferromagnetic film, a metal system having the fcc phase, such as a Cu-based alloy, such as Cu-Ge-Zr, Cu-P, Cu-P-Pd, Cu-Pd-Si, Cu-Si-Zr, Cu-Ti, Cu-Sn, Cu-Ti-Zr, and Cu-Zr; an Au-based alloy, such as Au-Dy, Au-Pb-Sb, Au-Pd-Si, and Au-Yb; an Al-based alloy, such as Al-Cr, Al-Dy, Al-Ga-Mg, and Al-Si; a Pt-base alloy, a Pd-based alloy, such as Pd-Si and Pd-Zr, a Be-based alloy, such as Be-Ti, Be-Ti-Zr, and Be-Zr; a Ge-based alloy, such as Ge-Nb and Ge-Pd-Se; an Ag-based alloy, an Rh-based alloy, an Mn-based alloy, an Ir-based alloy, and a Pb-based alloy; an alloy system consisting primarily of these metals having the fcc phase; a material having a diamond structure, such as Ge, Si, and diamond; and a material having a zinc-blende structure, such as GaAs, Ga-Al-As, Ga-P, and in-P. It is possible to use a material consisting primarily of at least one substance selected from these substances or a material formed by also adding other elements to any of these substances. Of the above materials, substances other than the single-element metal have an effect of suppressing the shunt current component because the substances themselves have specific resistances much higher than that of the ferromagnetic film. The increase in the specific resistance by the addition of other elements to the single-element metal can be obtained by various combinations. Examples are a Cu-based alloy, such as Cu-Ni, Cu-Cr, and Cu-Zr, and other alloys, such as Au-Cr, Fe-Mn, Pt-Mn, and Ni-Mn.

Examples of the nonmagnetic amorphous material are a nonmagnetic metal material, such as a nonmagnetic single-element metal or alloy and a material containing a non-metal as an additive, amorphous Si, such as hydrogenated Si, and a nonmagnetic nonmetallic material, such as amorphous carbon, e.g., hydrogenated carbon, glassy carbon, and graphite carbon.

The film thickness of the undercoating film is not particularly limited, but it is preferably 100 nm or less. This is so because even if the thickness of the undercoating film is increased to be larger than the above value, no larger effect can be obtained, and, conversely, the proportion of a current flowing through the undercoating film increases in the overall element, resulting in a decrease in resistance change rate. For nonmagnetic amorphous undercoating film, since it is possible to grow this undercoating film in the form of a layer regardless of the type of the material of the substrate, a smooth surface can be obtained stably. In addition, the nonmagnetic amorphous undercoating film and hence has no adverse magnetic effect on the stacked film, i.e., the MR element which is formed on the undercoating film and in which the nonmagnetic film is interposed between the ferromagnetic films.

When the undercoating film is formed, it may have improved crystal orientation but may have a reduced surface smoothness and, hence, a decrease in the resistance change rate. Hence, it is desirable that the undercoating film be made of two films, the first of which improves crystal orientation in the closest packed plane, and the second of which is made of Ti, Ta, Zr or nonmagnetic amorphous metal for enhancing the plane smoothness and which is interposed between the first undercoating film and the substrate when the first undercoating layer is made of a material having fcc phase or magnetic amorphous metal. With this arrangement, there can be provided a magnetoresistance effect element having both good soft magnetic characteristics resulting from the improvement in the crystal orientation in the closest packed plane and the high rate of change in magnetic resistance. In addition, in this two-layered structure, the use of a second undercoating film having the same crystal system as that of the ferromagnetic film and consisting of a material having a higher specific resistance than that of the ferromagnetic film makes it possible to decrease the shunt current component of the current flowing through the element as well as achieving the above effect. When the undercoating film has a stacked structure of two or more layers, it is desirable that the film thickness of this stacked film do not exceed 100 nm.

As the method of forming the undercoating film as described above, it is possible to apply various film formation processes, such as a conventional sputtering process using RF discharge at 13.56 MHz, or 100 MHz or higher, ion beam sputtering processes using various ion sources, e.g., an ECR ion source and a Kaufmann ion source, a vacuum deposition process using an electron beam evaporation source or a Knudesen cell, a thermal CVD process, CVD processes using various plasmas, and an MOCVD process or an MOMBE process using an organometallic compound as a material. It is important in all of these film formation processes to control water and oxygen by evacuation of up to an ultra-high vacuum and realization of a very high purity of a material gas. More specifically, the contents of $H_2O$ and $O_2$ are reduced to preferably the order of ppm or less, and more preferably the ppb order.

In the first aspect of the invention, the material of the ferromagnetic film contains as its main constituents at least one elements selected from the group consisting of Co, Fe, and Ni. In particular, $Co_{100-x}Fe_x$ ($5 \leq x \leq 0.4$) is preferred. This is so because it can readily achieve low Hc and high resistance change, while magnetic films without Co does not show much higher $\Delta R/R$ than NiFe films and magnetic films composed of only Co dose not show the remarkable improvement of the soft magnetic properties, such as low Hc, because of large crystal magnetic anisocropy, regardless of the closest packed plane orientation.

As for the crystal orientation of the ferromagnetic film, a half-width of a rocking curve of a reflection peak of a (111) plane, as the closest packed plane, in an X-ray diffraction curve is preferably less than 20°, and most preferably 7° or less.

Representative examples of the substrate material are a single-crystal substance, such as MgO, sapphire, diamond, graphite, silicon, germanium, SiC, BN, SiN, AlN, BeO, GaAs, GaInP, GaAlAs, and BP, a polycrystalline substance of any of these single-crystal substances, a sintered body containing any of these single-crystal substances as its main constituent; and a single-crystal substance, a polycrystalline substance, and a sintered body of a magnetic or nonmagnetic metal. The substrate material is selected in accordance with the type of the ferromagnetic film and the material of the undercoating film. Use of the C face of a sapphire substrate as the substrate is most preferable because it is well lattice-matched with Co-based magnetic film and likely to have a smooth surface. When a single-crystal substrate, such as a sapphire substrate, is used, the thickness of the ferromagnetic film is preferably 20 nm or less. This is so because if the thickness of the ferromagnetic film exceeds 20 nm, the (111) orientation is degraded.

In the magnetic film which is (111)-oriented, Hc increases abruptly when the magnetization direction inclines slightly from the (111) plane. Therefore, even if the (111) orientation is realized, the magnetization direction sometimes falls outside the range of the (111) plane, so Hc does not decrease if undulations are present on the substrate surface. For this reason, the surface roughness of the substrate is preferably less than 5 nm.

Note that the arrangement of the magnetoresistance effect element of the first aspect is non limited to the above arrangement but may be one formed by alternately stacking nonmagnetic films and ferromagnetic films a plurality of number of times.

The second aspect of the present invention provides a magnetoresistance effect element comprising a stacked film formed on a substrate by sequentially stacking a ferromagnetic film consisting primarily of at least one element selected from the group consisting of Co, Fe, and Ni, a nonmagnetic film, and above ferromagnetic film, wherein the material of the ferromagnetic film contains at least one element selected from the group consisting of Pd, Al, Cu, Ta, In, B, Nb, Hf, Mo, W, Re, Ru, Rh, Ga, Zr, Ir, Au, and Ag. Of these elements which cause virtually no decrease in resistance change rate are particularly desirable for three reasons. First, they do not form an intermetallic compound. Second, the ferromagnetic film will be lattice-matched well with the intermediate nonmagnetic film (Cu or the like). Third, large spin-dependent scattering can be expected to occur due to so-called "bulk scattering." In the second aspect, a content of the additional element is set within the range in which a CoFe alloy exhibit a ferromagnetic property at room temperature. For example, it is preferable that a content of the additional element is less than 6.5 at % in a case of Al, Ga, or In, that a content of the additional element is less than 10 at % in a case of Nb, Ta, Zr, Hf, B, Mo, or W, and that a content of the additional element is less than 40 at % in a case of Cu, Pd, Au, Ag, Re, Ru, Rh, or Ir.

The arrangement of the magnetoresistance effect element of the second aspect of the invention is not limited to the above arrangement but may be one formed by alternately stacking nonmagnetic films and ferromagnetic films a plurality of number of times.

The third aspect of the present invention provides a magnetoresistance effect element comprising a stacked film formed on a substrate by sequentially stacking a ferromagnetic film, a nonmagnetic film and another ferromagnetic film, wherein each ferromagnetic film is comprised off five or less layers, a ferromagnetic film having a resistivity of 50

μΩ.cm or more is formed on upper layer of the stacked film and/or between the substrate and lower layer of the stacked film.

In the third aspect, the high-resistance magnetic film means a ferromagnetic film or a magnetic film having ferrimagnetism. In addition, the ferromagnetic film is limited to the stacked film constituted by five or less layers. This is because, if the interface between the ferromagnetic film and the nonmagnetic film increases, the interface between the high-resistance magnetic film and the ferromagnetic film become less active, failing to the effect of the increase in the ratio ΔR/R.

By stacking the films such that the high-resistance magnetic film is in contact with the ferromagnetic film, occurrence of magnons in the interface can be prevented. If, however, the resistivity of the material of this high-resistance magnetic film is less than 50 μΩ.cm, a current flows mainly through the high-resistance magnetic film, undesirably decreasing the resistance change rate. In other words, it is possible to prevent the current from being shunted to the high-resistance magnetic film by using a ferromagnetic film or a magnetic film having ferromagnetism which has a resistivity of 50 μΩ.cm or more.

As a material of the high-resistance magnetic film, Ni, Fe, Co, NiFe, NiFeCo, CoFe, Co-based alloy, containing an additional element such as Ti, V, Cr, Mn, Zn, Nb, Tc, Hf, Ta, W, Re, and the like may be used.

In the third aspect, the high-resistance magnetic film is preferably a high-resistance soft magnetic film. As the high-resistance soft magnetic film, it is possible to use a high-resistance amorphous film consisting of, e.g., CoZrNb, a fine-crystal high-resistance soft magnetic film consisting of, e.g., FeZrN or CoZrN, or a film consisting of a material in which x of NiFeX is one element selected from the group consisting of Rh, Nb, Zr, Hf, Ta, Re, Ir, Pd, Pt, Cu, Mo, Mn, W, Ti, Cr, Au, and Ag. Of these films, the amorphous film or the film consisting of the material consisting of CoZrN or NiFeNb and having an fcc phase is desirable because the film promotes the fcc (111) orientation of the ferromagnetic film formed on it.

The film thickness of the high-resistance magnetic film preferably ranges between 0.5 nm or more. This is because if the film thickness is less than 0.5 nm, the magnetism of the high-resistance magnetic film itself is weakened to make prevention of occurrence of magnons difficult. In the case where the high-resistance magnetic film is inferior to the adjacent ferromagnetic film in terms of soft magnetic characteristic, it desirably has a thickness of 10 nm or less. This is because a film thickness exceeding 10 nm has an influence on the magnetization process of the ferromagnetic film, and this makes it difficult to obtain soft magnetic characteristics.

In the third aspect of the invention, usable examples of the material of the ferromagnetic film are Co, CoNi, CoFe, NiFe, and NiFeCo. The film thickness of the ferromagnetic film preferably ranges from 1 to 20 nm.

In the third aspect, the high-resistance magnetic film can be formed as the uppermost layer.

The arrangement of the magnetoresistance effect element according to the third invention is not limited to the above arrangement but may be one formed by alternately stacking nonmagnetic films and ferromagnetic films five times or less. The magnetoresistance effect element of the third invention is also suitable for the spin valve structure.

The fourth aspect of the present invention provides a magnetoresistance effect element comprising a stacked film formed on a substrate by sequentially stacking a ferromagnetic film, a first nonmagnetic film and another ferromagnetic film, wherein each ferromagnetic film is comprised of five or less layers, a second nonmagnetic film having a resistivity twice or less that of the ferromagnetic film is formed on upper layer of the stacked film and/or between the substrate and lower layer of the stacked film; and the magnetic film in contact with the second nonmagnetic film has a thickness of less than 5 nm.

In the fourth aspect, the material of the second nonmagnetic film preferably has the same crystal structure as that of the material of the ferromagnetic film (e.g., when the ferromagnetic film consists of a material having the fcc phase, the first nonmagnetic film also consists of a material having the fcc phase). In this case, it is preferable that the difference in lattice constant between the material of the second nonmagnetic film and the material of the ferromagnetic film be 5% or less. This is so because the ferromagnetic film can be epitaxially grown by increasing the crystal matching properties between the ferromagnetic film and the second nonmagnetic film, and this can suppress scattering of electrons in the interface.

In the fourth aspect, as the material of the second nonmagnetic film, it is possible to use a material consisting primarily of at least one element selected from the group consisting of Mn, Fe, Ni, Cu, Al, Pd, Pt, Rh, Ir, Au, and Ag. It is also possible to interpose a second undercoating film between the substrate and the second nonmagnetic film. Cu, Ag, Au, CuPd, CuPt, CuAu, or CuNi may be used as a material of the first nonmagnetic film. It is preferable that a thickness of the first nonmagnetic film falls the range of 0.5 to 20 nm.

In the fourth invention, when two or more ferromagnetic films are present, it is desirable that the grain size of the crystal of the material constituting the ferromagnetic films be large in the direction of the film thickness so as not to interfere with crystal growth in each ferromagnetic film. If the ferromagnetic film is constituted by six or more, the spin-dependent scattering interface increases, and the advantage of the invention will not be attained in effect.

The film thickness of the second nonmagnetic film preferably ranges between 0.2 and 20 nm. If the film thickness of the second nonmagnetic film is less than 0.2 nm, a probability that electrons flowing into the second nonmagnetic film undergo inelastic scattering in the interface with the substrate increases, and this makes it difficult to effectively extend the mean free path. If, on the other hand, the film thickness exceeds 20 nm, no larger effect can be obtained, and a current flowing only through the second nonmagnetic film increases to make it difficult to obtain a high change rate.

In the spin valve type magnetoresistance effect element according to the fourth aspect, the nonmagnetic film is so stacked as to contact at least the ferromagnetic film whose magnetization is not locked by the antiferromagnetic film. By stacking the nonmagnetic film in contact with the ferromagnetic film, electrons flow into the nonmagnetic film even if the thickness of the ferromagnetic film is less than 5 nm, and this can keep the effective mean free path of electrons long.

When the magnetoresistance effect element of the fourth aspect of the invention is applied to a sensor, the material of the first nonmagnetic film has a resistivity preferably twice or less, and more preferably lower that of a CoFe alloy as the material of the ferromagnetic film for the reason explained below. That is, if the bulk resistivity of the first nonmagnetic film is significantly higher than that of the ferromagnetic film, electrons flowing into the nonmagnetic film undergo scattering, and consequently the effective mean free path can no longer be kept long.

The resistivity of the material of the first non-magnetic film is preferably ¼ or more the resistivity of the ferromagnetic film, since if the resistivity of the material of the second nonmagnetic film is less than ¼ the resistivity of the ferromagnetic film, a current easily flows into the second nonmagnetic film.

In the fourth aspect, the first nonmagnetic film may be formed as the uppermost layer.

The arrangement of the magnetoresistance effect element of the fourth aspect is not limited to the above arrangement but may be one formed by alternately stacking second nonmagnetic films and ferromagnetic films a plurality of number of times. In addition, the magnetoresistance effect element of the fourth invention can have either the spin valve structure or the artificial lattice film structure.

The fifth aspect of the present invention provides a magnetoresistance effect element comprising a stacked film formed on a substrate by sequentially stacking a ferromagnetic film, a nonmagnetic film, and another ferromagnetic film, and a thin film formed on upper layer of the stacked film and/or between the substrate and lower layer of the stacked film, and having a resistivity higher than that of the ferromagnetic film and a mean free path longer than that of the ferromagnetic film.

In the fifth aspect, examples of the material of the thin film are a semimetal, such as Bi, Sb, and carbon, a semiconductor degenerated by doping at a high concentration, and an oxide semiconductor, such as $SnO_2$ and $TiO_2$. The film thickness of the thin film is preferably 1 to 50 nm for the reason explained below. That is, if the film thickness of the thin film is less than 1 nm, the effect of increasing the mean free path of electrons cannot be obtained satisfactorily. If the film thickness exceeds 50 nm, on the other hand, no larger effect can be obtained, and a current flowing through the thin film increases to make it difficult to obtain a high change rate.

In the fifth invention, the mean free path means the average of the distances electrons travel without scattered by any other thing.

In the fifth aspect, if the resistivity of the thin film is lower than that of the ferromagnetic film, a current flows into the thin film, weakening the magnetoresistance effect. Therefore, the thin film is formed to have a resistivity higher than that of the ferromagnetic film.

In the fifth aspect, in order to increase the resistivity of the entire stacked film, the film thickness of ferromagnetic film in contact with the thin film is set at preferably 5 nm or less, whereas the film thickness of the ferromagnetic film not in contact with the thin film is set to fall within the range of 2 to 20 nm in order to keep a required mean free path.

The arrangement of the magnetoresistance effect element of the fifth aspect is not limited to the above arrangement but may be one formed by alternately stacking nonmagnetic films and ferromagnetic films a plurality of number of times.

The sixth aspect of the present invention provides a magnetoresistance effect element comprising an undercoating film formed on a substrate and having the fcc phase, and a stacked film obtained by sequentially stacking a ferromagnetic film formed on the undercoating film and consisting of a CoFe alloy, a nonmagnetic film, and another ferromagnetic film, wherein the undercoating film consists of a material with a larger lattice constant than that of the material of the ferromagnetic film.

Note that no decrease in Hc was found when a Co film was formed on a glass substrate via a Cu undercoating film. This indicates that the effect of improving soft magnetism using an undercoating film is achieved when a ferromagnetic film consists of an alloy obtained by adding Fe to Co. It was found that a low Hc was realized especially when the concentration of Fe to be added to Co was 5% to 40%. This is so because if the Fe concentration is less than 5%, the hcp phase is mixed, and, if the Fe concentration exceeds 40%, the bcc phase is mixed easily and the lattice mismatching occurs. Examples of elements to be added to CoFe are Ni, Pd, Al, Cu, Ta, In, B, Zr, Nb, Hf, Mo, W, Re, Ru, Ir, Rh, Ga, Au, and Ag. The Hc reducing effect can be achieved similarly when these elements were added.

In the sixth aspect of the invention, the undercoating film preferably consists of a material with a higher resistivity than that of the CoFe alloy constituting the ferromagnetic film. It is also preferable that a film for improving smoothness be formed between the substrate and the undercoating film. As the film for improving smoothness, a film consisting of, e.g., Cr, Ta, Zr, Ti or the like can be used.

It is also preferable that the undercoating film thickness is less than 20 nm because the sense current in the undercoating film can keep small.

Note that the arrangement of the magnetoresistance effect element according to the sixth invention is not limited to the above arrangement but may be one formed by alternately stacking nonmagnetic films and ferromagnetic films a plurality of number of times.

The seventh aspect of the present invention provides a magnetoresistance effect element comprising a unit stacked film formed on a substrate and constituted by (a first ferromagnetic film/a first nonmagnetic film)$_n$ (n≧1)/a first ferromagnetic film, and a second ferromagnetic film formed on the unit stacked film via a second nonmagnetic film having a thickness different from that of the first nonmagnetic film, wherein the magnetizations of the individual ferromagnetic films of the unit snacked film are ferromagnetically coupled with each other. The second ferromagnetic film may be above unit stacked film or may be single layered ferromagnetic film.

In the seventh aspect, the first nonmagnetic film of the unit stacked film preferably has a thickness of 2 nm or less, by which no RKKY-like antiferromagnetic coupling is caused, since the magnetizations of the individual ferromagnetic films in the unit stacked film can be kept in a ferromagnetically coupled state. As an example, if the material of the ferromagnetic film is CoFe and the material of the first nonmagnetic film is Cu, the thickness of the first nonmagnetic film is set at a value not in the vicinity of 1 nm. It is preferable that a thickness of the second nonmagnetic film falls the range of 0.5 to 20 nm.

In addition, it is desirable that the ferromagnetic film and the first nonmagnetic film the grown while maintaining the lattice matching, i.e., the ferromagnetic film and the nonmagnetic film be lattice-matched to cause no excess scattering in the interface between them. This can prevent an increase in the resistance.

Note that the arrangement of the magnetoresistance effect element of the seventh aspect is not limited to the above arrangement but may be one formed by alternately stacking nonmagnetic films and ferromagnetic films a plurality of number of times. Note also that the magnetoresistance effect element of the seventh aspect is applicable to bosh the spin valve structure and the artificial lattice film structure.

The eighth aspect of the present invention provides a magnetoresistance effect element comprising a stacked film formed on a substrate by sequentially stacking a ferromagnetic film, a nonmagnetic film, and another ferromagnetic film, wherein each of magnetization of two adjacent ferromagnetic films is rotated in the reverse direction each other when a bias magnetic field in the reverse direction is applied to each of two ferromagnetic films by using a bias magnetic film as at least one bias magnetic field.

In the eighth aspect of the invention, the method of applying the bias magnetic fields to cause the each magnetization direction of the two ferromagnetic films to rotate in the reverse direction can be used a method using exchange coupling from an antiferromagnetic film and also using a hard magnetic film, or a method using an exchange bias produced by stacking a ferromagnetic film onto the ferromagnetic film in the stacked film as a biasing means to be applied to one ferromagnetic films and can be used a method using a bias magnetic field generated by a current, static coupling (a demagnetizing field) generated when a fine pattern is processed as a biasing means to be applied to another ferromagnetic film.

More specifically, antiferromagnetic films are stacked on the individual ferromagnetic films, and the ferromagnetic films are magnetized by using the antiferromagnetic films in a way which produces a difference of 180° in the direction of the bias magnetic field between the two adjacent ferromagnetic films. This magnetization can be achieved by, e.g., a method in which the direction of the application of the static magnetic field in the formation of the antiferromagnetic films is changed by 180° from that in the formation of the ferromagnetic films. In this case, it is desirable that the magnitude of the bias magnetic field to be applied to the neighboring ferromagnetic films be a minimum value required to form a single domain in the ferromagnetic film, e.g., 5 kA/m or less. In addition, the two antiferromagnetic films preferably have different Neel temperature in order to easily apply a bias magnetic field in different direction each other to each of ferromagnetic film.

The following method is also usable as an alternative. That is, an exchange bias magnetic field generated by stacking the antiferromagnetic film is used in application of the bias magnetic field to one ferromagnetic film. In application of the bias magnetic field to the other ferromagnetic film, another ferromagnetic film is stacked on the remaining film surface of the antiferromagnetic film, and a static coupled magnetic field (a demagnetizing field) generated when this ferromagnetic film whose magnetization is locked by the antiferromagnetic film is formed into a fine pattern is used. This new ferromagnetic film preferably has a two-layered structure formed by stacking a ferromagnetic film A (e.g., a film consisting of a material with a high crystallinity, such as NiFe or CoFe) suitable for application of the exchange bias, on the side in contact with the antiferromagnetic film, and a ferromagnetic film B (e.g., a Co-based amorphous ferromagnetic film or a nitride or carbide fine-crystal ferromagnetic film) suitable for generating the static coupled magnetic field onto the ferromagnetic film A, so as to cause ferromagnetic exchange coupling between them. With this two-layered structure, it is possible to adjust the Bs or the resistance (e.g., to increase the Bs and increase the resistance) of the ferromagnetic film B by controlling the film thickness, the composition, and the formation conditions of the ferromagnetic film B, thereby adjusting the strength of the static coupled bias magnetic field or a shunt bias (operating point bias) generated when a portion of a sense current flows through the ferromagnetic film B. When using NiFe films with the anisotropic magnetoresistance as a ferromagnetic film it is preferable that a sense current is made to flow in a direction perpendicular to a direction of a signal current.

In applying a bias magnetic field to a ferromagnetic film by using an antiferromagnetic film, a problem arises if the bias magnetic field is too large. However, this large bias magnetic field can be decreased by interposing, between the antiferromagnetic film and the ferromagnetic film, a stacked film of a ferromagnetic film and a nonmagnetic film in which the ferromagnetic film is present on the antiferromagnetic film side.

In the conventional spin valve film, if the nonmagnetic film is 2 nm or less thick, the ferromagnetic coupling between the ferromagnetic films spaced apart by the nonmagnetic film is strengthened, making it no longer possible to antiparallel magnetization alignment. Nonetheless, in the eighth aspect of the present invention, the bias magnetic field can be strengthened more than the ferromagnetic coupling field described above even if the nonmagnetic film has a thickness of 2 nm or less. As a result, the antiparallel magnetization alignment can be achieved. The spin valve can obtain a higher $\Delta R/R$ than the conventional spin valve.

The magnetoresistance effect element of the eighth to eleventh aspects of the invention is not limited to the embodiment described above. Rather, the element may be one which is formed by alternately stacking nonmagnetic films and ferromagnetic films, a number of times.

The ninth aspect of the present invention provides a magnetoresistance effect element comprising a stacked film on a substrate by sequentially stacking a magnetization-locked film which magnetization substantially can not rotate by a signal magnetic field, nonmagnetic film and a field-detecting film which detects a signal by the change in a magnetization based on the signal magnetic field, wherein, when said signal magnetic field has no intensity, each off the magnetization direction of said magnetization-locked film and said field-detecting film is substantially perpendicular to each other, and a sense current is made to flow in a direction which is substantially identical to the direction of the signal magnetic field.

In the ninth aspect of the invention, the magnetization of the antiferromagnetic film may be locked in various methods. Among these methods are: method of forming the film on the magnetization-locked film in exchange-coupled connection; method of increasing the Hc value; and method of forming a high-Hc ferromagnetic on the magnetization-locked film. One of two alternative methods may be used to make the magnetization directions of two magnetic films intersect with each other. The first method is to impart an easy axis of magnetization to the magnetic-field detecting magnetic film, which intersects with the magnetization direction of the magnetization-locked film. The second method is to apply a small exchange-coupled bias (e.g., 5 kA/m or less) in the direction at right angles to the magnetization direction of the magnetization-locked film. In the second method, it is preferable, for CoFe films with larger anisotropy filed, that the easy axis of the magnetic field detecting film exists in the almost same direction of the magnetization of the magnetization-locked film and the bias field to the magnetic field detecting film is slightly larger than the anisotropy field of the magnetic field detecting film. The second method is useful to enhance the magnetic permeability of CoFe with larger anisotropy field.

The tenth aspect of the present invention provides a magnetoresistance effect element comprising a bias film formed on a substrate, a first ferromagnetic film formed on the bias film to serve as a magnetization-locked film, a nonmagnetic film formed on the first ferromagnetic film, and a second ferromagnetic film formed on the nonmagnetic film to serve as a field detecting film, wherein the magnetization of the first ferromagnetic film is locked, and an angle θ defined between the magnetization direction of the first ferromagnetic film and the magnetization direction of the second ferromagnetic film at nearly 0 signal field is 30° to 60°. The first ferromagnetic film may serve as a field detecting film, and the second ferromagnetic film may serve as a magnetization-locked film by replacing the bias film on the second ferromagnetic film.

As the magnetization locking means in the tenth invention, there is a method in which an exchange bias produced by stacking an antiferromagnetic film onto a ferromagnetic film for locking magnetization or a ferromagnetic film is used as a high-coercive-force film. The means for inclining the magnetization direction of the other ferromagnetic film for signal magnetic field detection from the magnetization locking direction can be selected from a method using the axis of easy magnetization, application of a bias magnetic field from a hard magnetic film adjacent to the ferromagnetic film for signal magnetic field detection, a static magnetic bias generated by a ferromagnetic film stacked on the antiferromagnetic film for magnetization locking, and a current magnetic field from a sense current. The angle of inclination is preferably 30° to 60° To use the magnetic field from the field sense current, it is required to flow the sense current in substantially the same direction as the signal magnetic field. Note that in order to stabilize the magnetization locking direction, the sense current is desirably flowed such that the magnetic field from the sense current is applied in substantially the same direction as the magnetization locking ferromagnetic film.

The eleventh aspect of the present invention provides a magnetoresistance effect element comprising a stacked film formed on a substrate and constituted by (ferromagnetic film/nonmagnetic film), and at least two bias films layered on the uppermost ferromagnetic film in the stacked film and/or under the lowermost ferromagnetic film in the stacked film, wherein a bias magnetic field for the purpose of magnetization-locking is applied to at least one ferromagnetic film, a minimum bias magnetic field required for the purpose of disappearance of a magnetic domain is applied to at least one ferromagnetic film.

In the eleventh aspect, a bias magnetic field generated by some other means may be applied to the particular ferromagnetic film in a direction almost perpendicular to the above bias magnetic field. The ferromagnetic film applied with the bias magnetic field generated by that other means need not have an easy axis of magnetization.

In the eleventh aspect, the bias films may be formed on uppermost ferromagnetic film of the stacked film and between the substrate and the lowermost ferromagnetic film of the stacked film, respectively. Alternatively, the bias films may be formed on uppermost ferromagnetic film or between the substrate and the lowermost ferromagnetic film.

In the eleventh aspect of the invention, it is preferable that the axis of the bias magnetic field and the axis of each magnetization of the ferromagnetic film applied with the bias magnetic field intersect at substantially right angles. Hence, it is possible to enhance the magnetic permeability (μ) of the Co-based alloy film having high Hk.

As the bias magnetic field in this eleventh invention, it is possible to use at least one type of a bias magnetic field selected from the group consisting of an exchange coupled magnetic field from an antiferromagnetic film, an exchange coupled magnetic field or a static coupled magnetic field from a ferromagnetic film, and a current magnetic field.

As a method of generating the exchange coupled magnetic field, a method in which a ferromagnetic film is used as the bias film, and a film which is made to reduce an exchange bias is formed between a ferromagnetic film of the stacked film and the bias film, or a method in which a ferromagnetic film is used as the bias film, and the bias film is directly formed on a ferromagnetic film of the stacked film, may be used. In the former case, it is preferable that a uniaxial magnetic anisotropy (Hk) of the bias film is larger than that of the ferromagnetic film of the stacked film, and that a coercive force (Hc) of the bias film is larger than that of the ferromagnetic film of the slacked film.

In the eleventh aspect, a bias magnetic field by which the magnetization is essentially not moved by a signal magnetic field is applied to one of the uppermost and lowermost ferromagnetic films, and a magnetic field by which a signal magnetic field can be detected and Barkhausen noise can be removed is applied to the other. Stacking of the antiferromagnetic film is suitable for application of the former bias magnetic field. Stacking of the second ferromagnetic film or the antiferromagnetic film is suitable for application of the latter bias magnetic field. Examples of the second ferromagnetic film are a high-resistance soft magnetic film which is given a single domain by some method and in which the magnetization directions are aligned in one direction (e.g., a Co-based amorphous film heat-treated in a rotating magnetic field), a film with a high uniaxial magnetic anisotropy (e.g., a Co(Fe)-based amorphous film heat-treated in a static magnetic field), and a high-coercive-force film. A high-resistance soft magnetic film with a single domain can be realized by widening the second ferromagnetic film to be larger than the other films and stacking a hard magnetic film or an antiferromagnetic film onto the edge portion of the widened film.

The twelfth aspect of the present invention provides a magnetoresistance effect element comprising a stacked film formed on a substrate by alternately stacking at least three ferromagnetic films and at least two nonmagnetic films, wherein the magnetic permeabilities of the uppermost and lowermost ferromagnetic films serving as magnetization-locked films are lower than those of the other ferromagnetic films serving as field detecting films.

In the twelfth aspect, the method of decreasing the magnetic permeabilities of the uppermost and lowermost ferromagnetic films, i.e., the method of locking the magnetizations can be selected from a method using an antiferromagnetic film, a method using a hard magnetic film, and a method using a demagnetizing field, like in the eighth invention.

The thirteenth aspect of the present invention provides a magnetoresistance effect element comprising a magnetoresistance effect element including a high-coercive-force film in which a hexagonal C axis is present in the film surface, and a ferromagnetic film having a coercive force lower than that of the high-coercive-force film.

In the thirteenth aspect, the high-coercive-force film can also be used as a film for applying a bias magnetic field. In addition, high-coercive-force films and intermediate films can be stacked a plurality of number of times.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 5A and 5B are graphs showing the magnetization curves of the magnetoresistance effect element shown in FIG. 3;

FIG. 8 is a graph showing the film thickness dependency of the coercive force when a $Co_{90}Fe_{10}$ film has a Cu undercoating film;

FIG. 9 is a graph showing the film thickness dependency of the coercive force when a $Co_{90}Fe_{10}$ film does not have a Cu undercoating film;

FIG. 11A is a graph showing a θ-2θ scan X-ray diffraction curve on the C face of a sapphire substrate, and FIG. 11B is a graph showing a θ-2θ scan X-ray diffraction curve on the R plane of a sapphire substrate;

FIG. 14 is a graph showing the Al concentration dependency of the coercive force of $(Co_{90}Fe_{10})_{1-x}Al_x$ film/Cu film;

FIG. 15 is a graph showing the closest packed plane reflection intensity dependency of the coercive force of $Co_{90}Fe_{10}$ film/Cu film;

FIGS. 18 and 24 are sectional views each showing a magnetoresistance effect element according to the third invention of the present invention;

FIG. 19 is a graph showing the M-H curves in the axis of easy magnetization of the magnetoresistance effect element shown in FIG. 18;

FIG. 20 is a graph showing the M-H curves in the axis of hard magnetization of the magnetoresistance effect element shown in FIG. 18;

FIG. 21 is a graph showing the R-H curves of the magnetoresistance effect element shown in FIG. 18;

FIG. 26 is a perspective view showing still another example of the magnetoresistance effect element according to the third invention of the present invention;

FIG. 27 is sectional views each showing an example of a magnetoresistance effect element according to the fourth invention of the present invention;

FIG. 2B is a graph showing the relationship between the $\Delta\rho/\rho_0$ and the $d_{CoFe}$ of the magnetoresistance effect element shown in FIG. 27;

FIG. 29 is a sectional view showing a magnetoresistance effect element according to the fifth invention of the present invention;

FIGS. 31, 32, and 45 are graphs each showing the dependency of the coercive force upon the film thickness of a ferromagnetic film in a magnetoresistance effect element according to the sixth invention of the present invention;

FIG. 35 is a graph showing the relationship between the saturation magnetic field Hx and the Cu film thickness in the ferromagnetic film of the magnetoresistance effect element according to the sixth invention of the present invention;

FIGS. 37 and 45 are sectional views each showing a magnetoresistance effect element according to the fourth invention of the present invention;

FIG. 41 is a graph showing the magnetization curves of a conventional magnetoresistance effect element;

FIG. 42 is a graph showing the resistance change characteristics of the conventional magnetoresistance effect element;

FIG. 44 is a graph showing the resistance change characteristics of the ferromagnetic film having the Cu undercoating film in the magnetoresistance effect element according to the seventh invention of the present invention;

FIG. 49A is a graph showing the small angle reflection X-ray diffraction curve of a $Co_{90}Fe_{10}/Cu$ artificial lattice film on an MgO (110)-plane substrate, and FIG. 49B is a graph showing the medium angle reflection X-ray diffraction curve of the $Co_{90}Fe_{10}/Cu$ artificial lattice film on the MgO (110)-plane substrate;

FIG. 50A is a graph showing a rocking curve measured in the direction of the [110] axis for fcc (220) reflection shown in FIGS. 49A and 49B, and FIG. 50B is a graph showing a rocking curve measured in the direction of the [100] axis for fcc (220) reflection shown in FIGS. 49A and 49B;

FIG. 51A is a perspective view showing the in-place distribution of a normal to a crystal orientation plane caused by fluctuations of the crystal orientation plane, and FIG. 51B is a schematic view showing the sense current direction dependency of the resistance change rate;

FIG. 52A is a graph showing the magnetization curves of a 5.5 nm Cu/(1.1 nm Cu/1 nm CoFe)$_{16}$ artificial lattice film in the direction of the [100] axis of an external magnetic field, and FIG. 52B is a graph showing the magnetization curves of the 5.5 nm Cu/(1.1 nm Cu/1 nm CoFe)$_{16}$ artificial lattice film in the direction of the [110] axis of the external magnetic field;

FIG. 56 is a schematic view showing the arrangement of atoms when a twinned crystal defect is introduced to a $Co_{90}Fe_{10}/Cu$ stacked film oriented in the fcc-phase (111) plane;

FIG. 57 is a schematic view showing the sense current direction dependency of the resistance change rate in the state shown in FIG. 56;

FIG. 58 is a graph showing the substrate bias dependency of the resistance change rate of a $Co_{90}Fe_{10}/Cu$ artificial lattice film on a glass substrate;

FIG. 59 is a graph showing the bias dependency of the long periodic structure reflection intensity of a $Co_{90}Fe_{10}/Cu$ artificial lattice film on a glass substrate;

FIG. 60 is a graph showing the bias dependency of the fcc-phase (111)-plane reflection intensity of a $Co_{90}Fe_{10}/Cu$ artificial lattice film on a glass substrate;

FIG. 61 is a graph showing the bias dependency of the coercive force of a $Co_{90}Fe_{10}/Cu$ artificial lattice film on a glass substrate;

FIGS. 62 to 67 are perspective views each showing a magnetoresistance effect element according to the eighth invention of the present invention;

FIG. 68 is a graph showing the resistance change characteristics of the magnetoresistance effect element according to the eighth invention of the present invention;

FIGS. 69 and 70 are perspective views each showing a magnetoresistance effect element according to the 12th invention of the present invention;

FIG. 79 is a graph showing the R-H curve of a stacked film formed at a substrate temperature of about 100° C. according to the 13the invention of the present invention;

FIG. 80 is a graph showing the R-H curve of a stacked film formed at a substrate temperature of about 200° C. according to the 13th invention of the present invention;

FIG. 81 is a graph showing the R-H curve of a stacked film according to the 13th invention of the present invention when the pattern width direction is aligned with the axis of easy magnetization.

DETAILED DESCRIPTION OF THE PREFERRED EMBODIMENTS

Figure 1:
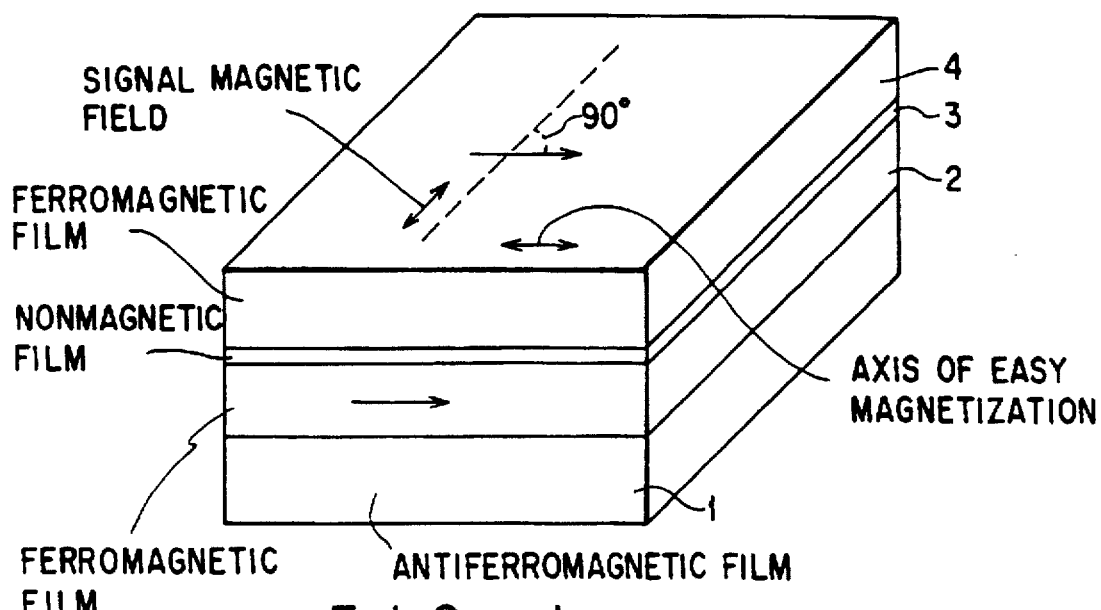
FIG. 1 is a perspective view showing a conventional magnetoresistance effect element.
Figure 2:
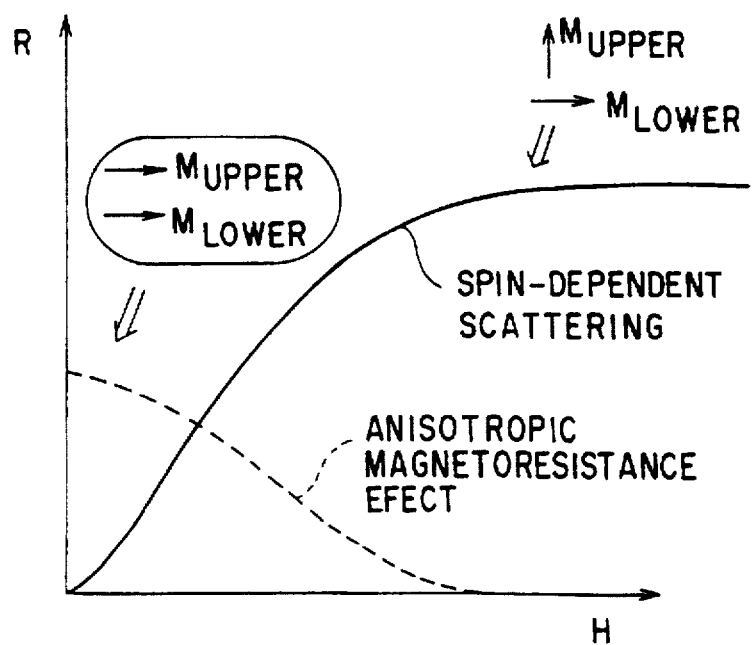
FIG. 2 is a graph showing the R-H curves of the conventional magnetoresistance effect element.

In the first invention of the present invention, good soft magnetic characteristics can be obtained by orienting the closest packed plane, e.g., the fcc-phase (111) plane of a ferromagnetic film containing as its main constituents at least two types of elements selected from the group consisting off Co, Fe, and Ni in a direction perpendicular to the film surface. This is so because no magnetic anisotropy depending on crystal magnetic anisotropy constant $K_1$ appears in the (111) plane. In addition, the magnetization of the ferromagnetic film can be kept in the (111) plane by controlling the surface roughness of a substrate for depositing the ferromagnetic film, and this consequently decreases the coercive force associated with the crystal magnetic anisotropy. Therefore, a good soft magnetism can be obtained. Furthermore, by performing orientation such that the rocking curve half-width becomes less than 20°, preferably 7° or less, there can be provided a high-sensitivity magnetoresistance effect element having good soft magnetic characteristics with a coercive force (Hc) of at most 100 A/m, a high resistance change rate ($\Delta R/R$) exceeding that of a non-oriented film or an oriented film (e.g., at 100)-oriented one), foe example the $\Delta R/R$ of a CoFe film of about 10%, and a high permeability.

On the other hand, it is possible to obtain a high-sensitivity magnetoresistance effect element having soft magnetic characteristics with Hc of at most 100 A/m and $\Delta R/R$ of 5% or more by adding additive elements to a CoFe alloy. In particular the soft magnetic characteristics is improved markedly in the case of Al Ta, Zr or Mr. Although the reason why the soft magnetic characteristics are improved is still unclear it is assumed that the effect obtained by reduction in crystal magnetic anisotropy contributes as well as the improvement in crystal orientation. In the case of Pd, Cu, Au or Ag added in the maximum possible amount of 40 at %, the metal does not form an intermetallic compound, the ferromagnetic film will be lattice-matched well with the intermediate nonmagnetic film (Cu or the like), and spin-dependent scattering can be expected to occur due to so-called "bulk scattering." Hence, the rate ΔR/R can be maintained at a high value.

In the first aspect of the invention, a smooth surface can be obtained for an amorphous nonmagnetic film formed as an undercoating film of the ferromagnetic film regardless of the type of the material of a substrate. This makes it possible to improve the surface smoothness of the ferromagnetic film formed on the amorphous nonmagnetic film and to improve the smoothness of the interface with the nonmagnetic film. Therefore, a high resistance change rate can be obtained stably. In addition, since the undercoating film according to the present invention is a nonmagnetic film, the film has no adverse effect on the ferromagnetic film formed on it. Furthermore, the low coercive force and high ΔR/R can be achieved by forming on the smooth undercoating film and another undercoating film with the effect of the crystal orientation improvement between the ferromagnetic film and the substrate.

In the third aspect of the present invention, a ferromagnetic film which produces a resistance change and a high-resistance soft magnetic film are formed with the exchange coupling. Therefore, as the magnetization of the high-resistance soft magnetic film consisting of, e.g., an amorphous material with good soft magnetic characteristics rotates, the magnetization of the ferromagnetic film also rotates. This improves the soft magnetic characteristics of the ferromagnetic film.

In addition, the use of the high-resistance soft magnetic film suppresses the reduction in the rate of change in magnetic resistance caused by a shunt effect.

In the third aspect, generation of magnons in the interface is prevented by stacking a ferromagnetic film, or a ferromagnetic film in contact with the ferromagnetic film. As a result, it becomes possible to decrease the probability of reversal of electron spins upon collision of magnons against electrons, and this increases the resistance change rate at room temperature. If, however, the specific resistance of the above thin film is low, a large current flows into the stacked thin film, weakening the magnetoresistance effect. In the third invention, therefore, a ferromagnetic film, which has a specific resistance of 50 μΩ.cm or more, is used as the material of the thin film, thereby preventing the shunt current. Consequently, a magnetoresistance effect element with a high resistance change rate and a high sensitivity can be realized.

In the fourth aspect of the present invention, a nonmagnetic film is stacked in contact with at least one of ferromagnetic films. Therefore, even if the thickness of this ferromagnetic film is less than 5 nm, the effective mean free path of electrons can be kept long. For example, if the thickness of a ferromagnetic film is decreased in a spin valve type stacked film, the resistivity increases and the resistance change rate decreases. If, however, the thickness of a ferromagnetic film is decreased and at the same time a nonmagnetic film is stacked in contact with this thin ferromagnetic film, electrons can flow into the nonmagnetic film without undergoing inelastic scattering on the surface of the ferromagnetic film. That is, the thickness of the ferromagnetic film can be decreased while maintaining the long effective mean free path. To obtain the above effect of the present invention, the number of magnetic films must be five or more.

If, however, the thickness of the ferromagnetic film is decreased to be less than 5 nm in the case that the resistivity of the nonmagnetic film is much higher than that of the ferromagnetic film, electrons flow into the nonmagnetic film but immediately undergo scattering inside the film. This shortens the effective mean free path, leading to a decrease in the resistance change rate. That is, by stacking a nonmagnetic film with the resistivity equal to or lower than that of the ferromagnetic film in contact with the ferromagnetic film, a magnetoresistance effect element with a high resistance change rate can be obtained while the thickness of the ferromagnetic film is decreased to be less than 5 nm. Therefore, even if a magnetic film is processed into a fine pattern in correspondence with high-density magnetic recording and reproduction using a narrow track width, this small thickness of the ferromagnetic film can suppress occurrence of domain walls caused by a demagnetizing field, thereby preventing Barkhausen noise. As a result, there can be provided a noise-free, high-sensitivity magnetoresistance effect element suitable for reproduction of high-density recording.

In the fifth aspect of the present invention, by stacking a thin film with a long mean free path in contact with at least one of ferromagnetic films, the effective mean free path of the whole stacked film can be prolonged. For example, the following is known as the physical mechanism of a magnetoresistance effect in a spin valve type stacked film. That is, in the spin valve type stacked film, if the magnetization directions of two ferromagnetic films are parallel to each other, conduction electrons having either a spin parallel to the magnetization of a spin antiparallel to the magnetization can have a long mean free path in the film as a whole, and the film exhibits a low resistivity as a whole. In contrast, if the magnetizations of two ferromagnetic films are antiparallel to each other, no conduction electrons having a long mean free path in the film as a whole can exits any longer, and the resistivity rises. The magnetoresistance effect of the spin valve type stacked film is determined by the difference in length of the mean free path between these two states.

It is known that inside a ferromagnetic film, the mean free path of electrons having a spin parallel to the magnetization is different from that of electrons having a spin antiparallel to the magnetization. For the reason described above, as the mean free path that electrons in the spin direction, along which a longer mean free path is obtained inside a ferromagnetic film, has is increased, the magnetoresistance effect of the spin valve type stacked film can be enhanced. In the fifth invention, therefore, by stacking the thin film with a mean free path longer than that of the ferromagnetic film, the effective mean free path of the ferromagnetic film is extended, and this makes it possible to further enhance the magnetoresistance effect of the spin valve type stacked film. If, however, the resistivity of the thin film is lower than that of the ferromagnetic film, a current flows mainly into the stacked thin film, weakening the magnetoresistance effect. For this reason, the material of the thin film is required to have both a long mean free path and a specific resistance higher than that of the ferromagnetic film.

In addition, when a material with a high resistivity is used as the above thin film having a long mean free path, the specific resistance of the entire spin valve type stacked film can be raised by decreasing the thickness of the ferromagnetic film in contact with the thin film. Consequently, a spin valve type stacked film with a high specific resistance can be obtained, and this makes it possible to extract a high signal voltage with a low current density even in a fine pattern. Therefore, problems such as generation of heat and migration can be avoided.

In the sixth aspect of the present invention, when a $Co_{1-x}Fe_x$ (0<x<1) film as a ferromagnetic film is formed on a nonferromagnetic film consisting of a material having the fcc phase and a lattice constant larger than that of the material of the ferromagnetic film, a proper lattice strain is induced in the CoFe film, and consequently the Hc decreases largely to achieve good soft magnetic characteristics. By further forming a nonmagnetic film, such as a Cu film, another ferromagnetic film having a spin-dependent scattering ability, such as a CoFe film, and an antiferromagnetic film in sequence on the above ferromagnetic film, there can be provided a high-sensitivity magnetoresistance effect element which produces a large resistance change upon application of a slight signal magnetic field. In this case, if the resistivity of the nonferromagnetic film formed on a substrate is higher than that of the ferromagnetic film, a sense current can be prevented from being shunted to this nonferromagnetic film, so a high resistance change rate results. In addition, if the smoothness in each interface suffers to decrease the resistance change rate because the nonferromagnetic film does not grow into layers, a high resistance change rate can be realized by interposing another undercoating film with a function of growing a layered film between the nonferromagnetic film and the substrate.

Furthermore, this lattice strain can be controlled easily by adjusting the film thickness of the ferromagnetic film or the film thickness of the nonferromagnetic film as well as selecting the type of the nonferromagnetic film.

In the seventh aspect of the present invention, a unit stacked film constituted by ferromagnetic films and a first nonmagnetic film has good soft magnetic characteristics and good lattice matching properties. In addition, in this unit stacked film, the resistance in the ferromagnetic coupled state is lower than that in the antiferromagnetic coupled state, and the number of interfaces causing spin-dependent scattering between he ferromagnetic films and the nonmagnetic film is large. For this reason, the increase in ΔR/R due to so-called bulk scattering in the unit stacked film can be expected. Therefore, an artificial lattice film or a film with a spin valve structure using this unit stacked film as a ferromagnetic film unit has good soft magnetic characteristics and shows a high resistance change rate derived from spin-dependent scattering. Consequently, a high-sensitivity magnetoresistance effect element can be obtained.

In the eighth aspect of the present invention, the magnetizations between neighboring ferromagnetic films sharply change from an antiparallel state to a parallel state. In addition, a bias magnetic field from an antiferromagnetic film or the like required to obtain this antiparallel state is suppressed to a minimum field necessary to prevent Barkhausen noise. For this reason, even when a signal magnetic field is applied in the direction of the axis of hard magnetization suitable for a magnetic head (in this direction, an advantage such as good RF characteristics can be obtained), the magnetizations of the two ferromagnetic films rotate to change within the range of a relatively low magnetic field of 0° to 180°. Therefore, a high resistance change rate equivalent to that obtained in the easy axis of magnetization can be obtained within the range of a relatively low magnetic field.

In a conventional spin valve type magnetoresistance effect element, it is desirable that the thickness of a nonmagnetic layer be as small as possible since the resistance change rate increases exponentially as the thickness of the nonmagnetic layer decreases. In practice, however, if the film thickness of the nonmagnetic film sandwiched between ferromagnetic films is less than 2 nm, the ferromagnetic coupling between the upper and lower magnetic layers is enhanced to make realization of an antiferromagnetic magnetization arrangement impossible, and this largely decreases the resistance change rate. In the eighth invention of the present invention in which a bias magnetic field is applied to both the ferromagnetic films, however, the antiferromagnetic magnetization alignment can be realized by adjusting the intensity of an antiparallel bias magnetic field even if the thickness of the nonmagnetic film is less than 2 nm. Therefore, a great increase in the resistance change rate can be expected.

In addition, the bias magnetic field is applied to all magnetic films. This removes domain walls from all the ferromagnetic films, thereby preventing Barkhausen noise.

Furthermore, in a system in which a sense current is flowed in a direction perpendicular to a signal magnetic field, the present invention can achieve both a conventional anisotropic magnetoresistance effect, which cannot be ignored when, e.g., an NiFe film is used, and a resistance change caused by spin-dependent scattering, and this consequently increases the ΔR/R.

In the ninth aspect of the present invention, assuming that the angle defined between the magnetization of a magnetization locking film and the magnetization of a signal magnetic field detecting film is set at about 90° when the signal magnetic field is 0, if the magnetization of the magnetization locking film points in the direction of a positive signal magnetic field, the resistance decreases in the positive magnetic field since the angle defined between the magnetizations of the neighboring ferromagnetic films becomes ferromagnetic. In contrast, in a negative magnetic field, the resistance increases because the angle defined between the magnetizations of the neighboring ferromagnetic films becomes antiferromagnetic. This consequently makes an operating point bias unnecessary. Furthermore, the sense current is applied in the direction of the signal magnetic field to lock the magnetization of at least one ferromagnetic film in that direction by using the antiferromagnetic film or the like. The magnetization of the other ferromagnetic film whose magnetization is, thereby, not locked is inclined in a direction perpendicular to the signal magnetic field by the current magnetic field. This current magnetic field achieves the effect of preventing Barkhausen noise. In this case, the ferromagnetic film whose magnetization is not locked need not have the axis of easy magnetization because of the presence of the current magnetic field.

In the tenth aspect, by inclining the angle defined between the magnetization locking and the signal magnetic field detecting film by 30° to 60°, Barkhausen noise can be removed by a leakage magnetic field from the magnetization locking film while the operating point bias remains unnecessary.

When the sense current is flowed in a direction perpendicular to the signal magnetic field, the direction of the ferromagnetically coupled magnetic field and the direction of the current magnetic field are present on the same axis. If the sense current is flowed such that the direction of the ferromagnetic coupling between the adjacent ferromagnetic films, which cause a decrease in permeability is superposed on the direction of this current magnetic field, the magnetization direction of the magnetic film whose magnetization is not locked is rotated in the magnetization direction of the magnetic film whose magnetization is locked. Therefore, the angle defined between the magnetizations of the two magnetic films decreases from 90°. As a result, even if a material having an anisotropic magnetoresistance effect is used, the sensitivity is increased effectively by the superposition of the anisotropic magnetoresistance effect and the resistance change derived from spin-dependent scattering (in this case, however, the range of the linear response magnetic field is narrowed with respect to the signal magnetic field). If, in contrast, the sense current is flowed such that the direction of the ferromagnetic coupling becomes opposite to the direction of the current magnetic field, the range of the linear response magnetic field can be widened with respect to the signal magnetic field, since the angle defined between the two magnetic layers can be set at about 0° when the signal magnetic field is 0 (in this case, however, if an anisotropic magnetoresistance effect exists, this anisotropic magnetoresistance effect interferes with a linear resistance change obtained by spin-dependent scattering).

In the eleventh aspect of the present invention, two bias films are incorporated in the (magnetic film/nonmagnetic film)$_n$ film. Thus, an intense bias magnetic field can be applied to specified ferromagnetic films to lock them magnetically, and a minimum-intensity magnetic field can be applied to other specified ferromagnetic films to remove bulk spin noise. Furthermore, a bias field can be applied to the signal field detecting magnetic film by stacking magnetization-locked films on the edge of the signal field detecting magnetic film. As this method needs to remove the other films stacked on the signal field detecting film, it is difficult to fabricate such a structure. However, this method is advantageous in that the multi-layer film including the bias films can be formed within a short time by means of a continuous film-forming process. Furthermore, the two bias magnetic fields may be applied at right angles, in which case the angle defined between the magnetization directions of a magnetization locking film and a field detecting film becomes about 90° when the signal magnetic field is 0 as in the tenth aspect of the invention. This makes an operating point bias unnecessary. In addition, Barkhausen noise can be removed by a bias magnetic field applied to the field detecting film. In this system, the magnitude of the bias magnetic field can be controlled easily by adjusting the magnetic anisotropy or the film thickness of a bias film to be stacked on the field detecting film or by adjusting the interface between the field detecting film and the bias film.

In the twelfth aspect of the present invention, since the uppermost and lowermost ferromagnetic films have a low permeability, i.e., their magnetizations are locked, a change in magnetization with respect to a signal magnetic field is subtle. Since, on the other hand, the permeability of an intermediate ferromagnetic film is high, a large rotation of magnetization takes place upon application of a slight magnetic field. As a result, the angle defined between the magnetization of the uppermost and lowermost ferromagnetic films and the magnetization of the intermediate ferromagnetic film changes sensitively in accordance with the signal magnetic field. In addition, the number of interfaces for causing spin-dependent scattering is at least twice that in a conventional spin valve type film. Therefore, a large change in resistance can be obtained by a slight magnetic field.

Note that if the permeability of the intermediate ferromagnetic film is lowered by locking its magnetization by using an antiferromagnetic film, the ΔR/R decreases largely because the antiferromagnetic film has a high resistivity. In the uppermost and lowermost ferromagnetic films, however, locking of magnetization is possible without decreasing the ΔR/R, since the antiferromagnetic film for locking magnetization can be arranged outside the unit of spin-dependent scattering.

Furthermore, because the ferromagnetic film with a high permeability is present in the vicinity of the center of the spin valve type stacked film, the magnetic field from the sense current is weak. This consequently avoids a problem that the magnetization arrangement of the ferromagnetic film is disturbed by the sense current magnetic field.

In the thirteenth aspect of the present invention, it is possible to prevent a normal high-coercive-force film from increasing the coercive force of a low-coercive-force film by using strong static coupling caused by crystal magnetic anisotropy in a direction perpendicular to the film surface. Therefore, when a magnetoresistance effect element is manufactured by stacking at least two high-coercive-force films via a magnetoresistance effect film and an interlayer, the soft magnetic characteristics of a film corresponding to a magnetization response are not degraded. It is also possible to realize a parallel state and an antiparallel state of magnetizations efficiently, and to increase the resistance change rate since the film thickness of the interlayer can be decreased significantly.

Furthermore, since the single-crystal-like high-coercive-force film has a low electrical resistance, the output can be increased without adversely affecting spin-dependent scattering even when this high-coercive-force film is stacked on a low-coercive-force film. This single-crystal-like high-coercive-force film also has a high crystal magnetic anisotropy. Therefore, the film has a high permeability (i.e., its magnetization is hard to move) and hence can achieve a large magnetization locking effect.

Even when used as a bias film, the high-coercive-force film does not degrade the soft magnetic characteristics of a film corresponding to a magnetization response. This bias film can be used as both a bias film for preventing Barkhausen noise and a bias film for obtaining an anti-coupled state of magnetizations when no external magnetic field is present, i.e., can be imparted with the two effects at the same time.

The present invention will be described in more detail below by way of its examples.

As regards the first to thirteenth aspects of the present invention, in the case where there are a plurality of films in one structure, it is only necessary that at least one of the films should satisfy the specs.

EXAMPLE 1

A sapphire substrate C face (the 0001) plane of an $\alpha$-$Al_2O_3$ substrate) was polished into a mirror surface by using a mechanochemical polishing process until the average surface roughness became about 2 nm when measured by a probe type surface roughness meter with a probe radius of 0.2 μm.

Figure 3:
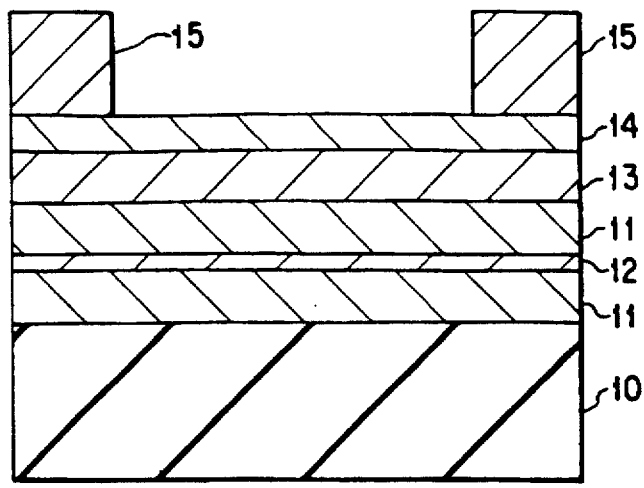
FIGS. 3, 10, and 17 are sectional views each showing a magnetoresistance effect element (with a spin valve structure) according to the first invention of the present invention.

The resultant sapphire substrate was placed in a vacuum chamber, and the vacuum chamber was evacuated to $5 \times 100^{-7}$ Torr or less. Thereafter, Ar gas was introduced into the vacuum chamber to set a vacuum degree of about 3 mTorr in the vacuum chamber, and sputtering was performed in a static magnetic field of about 4,000 A/m, thereby forming in sequence a $Co_{90}Fe_{10}$ film 11 as a ferromagnetic film, a Cu film 12 as an intermediate nonmagnetic film, another $Co_{90}Fe_{10}$ film 11 as a ferromagnetic film, an FeMn film 13 as an antiferromagnetic film, and a Ti film 14 as a protective film on the sapphire substrate 10, as shown in FIG. 3. As a result, a stacked film with a spin valve structure of 5 nm Ti/8 nm FeMn/8 nm $Co_{90}Fe_{10}$/2.2 nm Cu/8 nm $Co_{90}Fe_{10}$ was formed on the sapphire substrate 10, thereby manufacturing a magnetoresistance effect element. Cu leads 15 were also formed on this stacked film. Note that $Co_{90}Fe_{10}$ was used as the composition of the CoFe-based alloy film because $Co_{90}Fe_{10}$ has a high resistance change rate [Japan Applied Magnetics Society Journal, 16, 313 (1992)] and soft magnetic characteristics.

As the material of the protective film other than Ti, nonmagnetic substances such as Cu, Cr, W, SiN, and TiN can be used. To prevent oxidation of FeMn, it is desirable to use a material other than oxides. The film thickness of the Ti film need not be 5 nm provided that the film maintains a protecting effect. In order to prevent a decrease in sensitivity caused by a shunt current flowing to the Ti film when a sense current is flowed, the film thickness is preferably several tens nm or less when the electrical resistivity of the Ti film higher than that of the $Co_{90}Fe_{10}$ is taken into account.

The magnetization of the $Co_{90}Fe_{10}$ film 11 in contact with the FeMn film 13 is locked by the FeMn, and the magnetization of the other $Co_{90}Fe_{10}$ film 11 is reversed or rotated in accordance with an external magnetic field. The film thickness of both the $Co_{90}Fe_{10}$ films 11 as the ferromagnetic films was set to 8 nm, but the thicknesses of the two films may be the same or different. In principle, a ferromagnetic film is usable if its thickness is one atomic layer (0.2 nm) or more. However, the thickness is suitably 0.5 to 20 nm when an actual application of an MR element is taken into consideration.

In this example, the film thickness of the Cu film 12 formed between the two $Co_{90}Fe_{10}$ films 11 was 2.2 nm. However, the thickness is not limited to this value and is preferably 0.5 to 20 nm in practice. As the material other than Cu, Au, Ag, Ru, and Cu alloy can be used.

The FeMn film 13 as the antiferromagnetic film is used to lock the magnetization of the $Co_{90}Fe_{10}$ film 11 which the FeMn film 13 is in direct contact with. Although the FeMn film ! 3 was usable if its film thickness was about 1 nm or more, the film thickness is desirably 2 to 50 nm in respects of reliability and practicality. Note that Ni oxide is also usable as the material of the antiferromagnetic film in addition to FeMn. When Ni oxide is used as the material of the antiferromagnetic film, it is possible to form an antiferromagnetic film of the Ni oxide with good properties by performing sputtering in a gas mixture atmosphere of Ar and oxygen, or by applying an ion beam sputtering process or a dual ion beam sputtering process. In addition, since the Ni oxide film can be formed well on the sapphire substrate C face, it is possible to form a spin valve structure of 5 nm Ti/8 nm $Co_{90}Fe_{10}$/2.2 nm Cu/8 nm $Co_{90}Fe_{10}$/50 nm Ni oxide. In this case, if the thickness of the Ni oxide film is 1 nm or more, a stable bias magnetic field can be applied to the $Co_{90}Fe_{10}$ film.

The magnetic characteristics, the resistance change rate, and the crystal structure of the magnetoresistance effect element were examined. The magnetic characteristics were measured with a maximum applied magnetic field of 1.2 MA/m by using a vibrating magnetometer (VSM) and the resistance change rate was measured in a static magnetic field in accordance with a four-terminal resistance measurement method. The crystal structure was measured by θ-2θ scan and a rocking curve X-ray diffraction method. The measurements using the VSM and the X-ray diffraction were performed for a film patterned into squares of 8 mm side through a metal mask, and the resistance change rate was measured for a film patterned into stripes of 1 mm×8 mm through a metal mask. The change in resistance of the magnetoresistance effect element in a magnetic field was measured by the four-terminal method.

Figure 4:
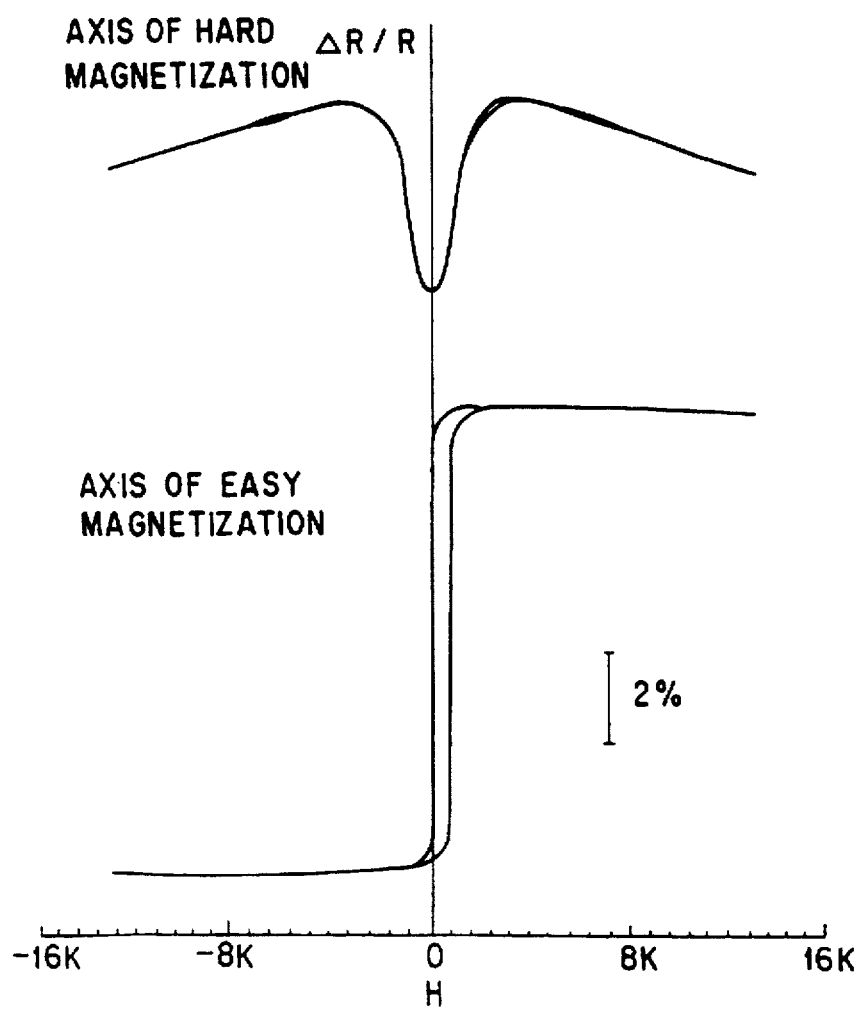
FIG. 4 is a graph showing the external magnetic field dependency of the resistance change rate of the magnetoresistance effect element shown in FIG. 3.

The measurement results of the magnetoresistance effect element are shown in FIG. 4. As can be seen from FIG. 4, when an external magnetic field was applied in the direction of the axis of easy magnetization, the maximum resistance change rate was approximately 10%. The coercive force of this magnetoresistance effect element was 160 A/m or less. That is, in this magnetoresistance effect element, a large resistance change of about 10% was obtained for a weak magnetic field of about 160 A/m, indicating that good soft magnetic characteristics and a high resistance change rate were obtained. In addition, when an external magnetic field was applied in the direction of the axis of hard magnetization, although the resistance change rate was about 4%, the coercive force was 80 A/m, i.e., the soft magnetic characteristics were very good.

The magnetization curves of this magnetoresistance effect element are shown in FIGS. 5A and 5B. As is apparent from FIG. 5A, the coercive force in the axis of easy magnetization was approximately 160 A/m, and the coercive force in the axis of hard magnetization was about 80 A/m. In addition, as can be seen from FIG. 5B, an exchange bias of about 5.3 kA/m was applied to the $Co_{90}Fe_{10}$ film in contact with FeMn in the direction of the axis of easy magnetization.

The crystal structure of this magnetoresistance effect element presented a strong fcc-phase (111) orientation (closest packed plane orientation).

Following the same procedures as described above, Ti/FeMn/CoFe/Cu/CoFe films were formed on a thermal oxide Si substrate, and the characteristics of the resultant structure were evaluated. As a result, the closest packed plane X-ray diffraction peak was decreased to 1/10 or less of the above value, and the Hc was 3000 A/m in the axis of easy magnetization, which is a high value inapplicable to a magnetoresistance effect element. The resistance change rate was about 8%, lower than that of the above (111)-oriented film.

Subsequently, following the same procedures as described above, Ti/FeMn/CoFe/Cu/CoFe films were formed on an MgO (100) substrate, and the characteristics of the resultant structure were evaluated. Consequently, the X-ray diffraction peak exhibited only a high-intensity (100) peak, indicating a good (100) orientation. At this time, however, the Hc in the axis of easy magnetization was 1,200 A/m, i.e., presented a high value inapplicable to a magnetoresistance effect element. The resistance change rate was approximately 8%, lower than that of the above (111)-oriented film.

The above evaluation results show that realization of the (111) orientation can achieve a low Hc and a high resistance change rate at the same time.

Subsequently, a magnetoresistance effect element with a spin valve structure of 5 nm Ti/8 nm FeMn/8 nm Co/2.2 nm Cu/8 nm Co using Co films as ferromagnetic films was formed on a sapphire C face substrate, and the magnetic characteristics and the resistance change rate of the resultant magnetoresistance effect element were measured following the same procedures as described above. Consequently, this magnetoresistance effect element showed the closest packed plane orientation similar to that described above, a resistance change rate of about 8%, and a coercive force of about 1600 A/m. Note that ΔR/R=7% and Hc=2,000 A/m when a thermal oxide Si substrate was used.

The above results reveal that although a low Hc and a high ΔR/R can be obtained by using Co as the material of the ferromagnetic film, it is more preferable to use an alloy formed by adding Fe to Co as the material of the ferromagnetic film because soft magnetic characteristics can be obtained more easily.

Spin value type magnetoresistance effect elements having a structure of 5 nm Ti/8 nm FeMn/8 nm $Co_{1-x}Fe_x$/2.2 nm Cu/8 nm $Co_{1-x}Fe_x$/sapphire C face or glass substrate were prepared at variation values for the parameter X of Fe content $Co_{1-x}Fe_x$ ferromagnetic film. The relationship $\Delta R/R$ and Hc thus obtained are summarized in Table 6.

TABLE 6

| X | substrate | Hc (A/m) | $\Delta R/R$ (%) |
| --- | --- | --- | --- |
| 0.05 | sapphire C face | 400 | 9.5 |
| 0.10 | " | 160 | 10 |
| 0.15 | " | 240 | 12 |
| 0.20 | " | 420 | 11 |
| 0.30 | " | 400 | 10.5 |
| 0.40 | " | 700 | 9 |
| 0.60 | " | 2200 | 6 |
| 0.05 | glass | 2800 | 7.5 |
| 0.10 | " | 3000 | 8 |
| 0.15 | " | 1800 | 7.5 |
| 0.20 | " | 1500 | 7 |
| 0.30 | " | 1700 | 7 |
| 0.40 | " | 2500 | 7.5 |
| 0.60 | " | 3000 | 6 |

As is clear from Table 6, a decrease in Hc and an increase in $\Delta R/R$ were observed on the sapphire C face within a range of $0.05 \leq x \leq 0.4$.

EXAMPLE 2

Figure 6:
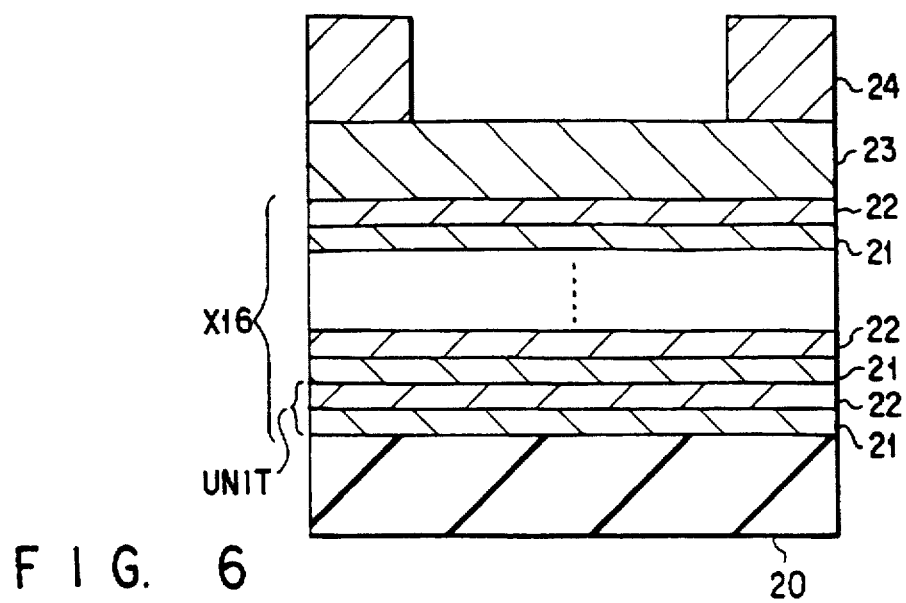
FIG. 6 is a sectional view showing an embodiment of a magnetoresistance effect element (with an artificial lattice film) according to the first invention of the present invention.

As shown in FIG. 6, $Co_{90}Fe_{10}$ films 21 and Cu films were stacked alternately 16 times on the C face of a sapphire substrate 20 under the same film formation conditions as in Example 1, and a Cu film 23 was formed on the resultant structure, thereby manufacturing an artificial lattice film with a structure of 5.5 nm Cu/(2 nm Cu/1 nm $Co_{90}Fe_{10}$)×16 to obtain a magnetoresistance effect element. Cu leads 24 were also formed on this stacked film.

Figure 7:
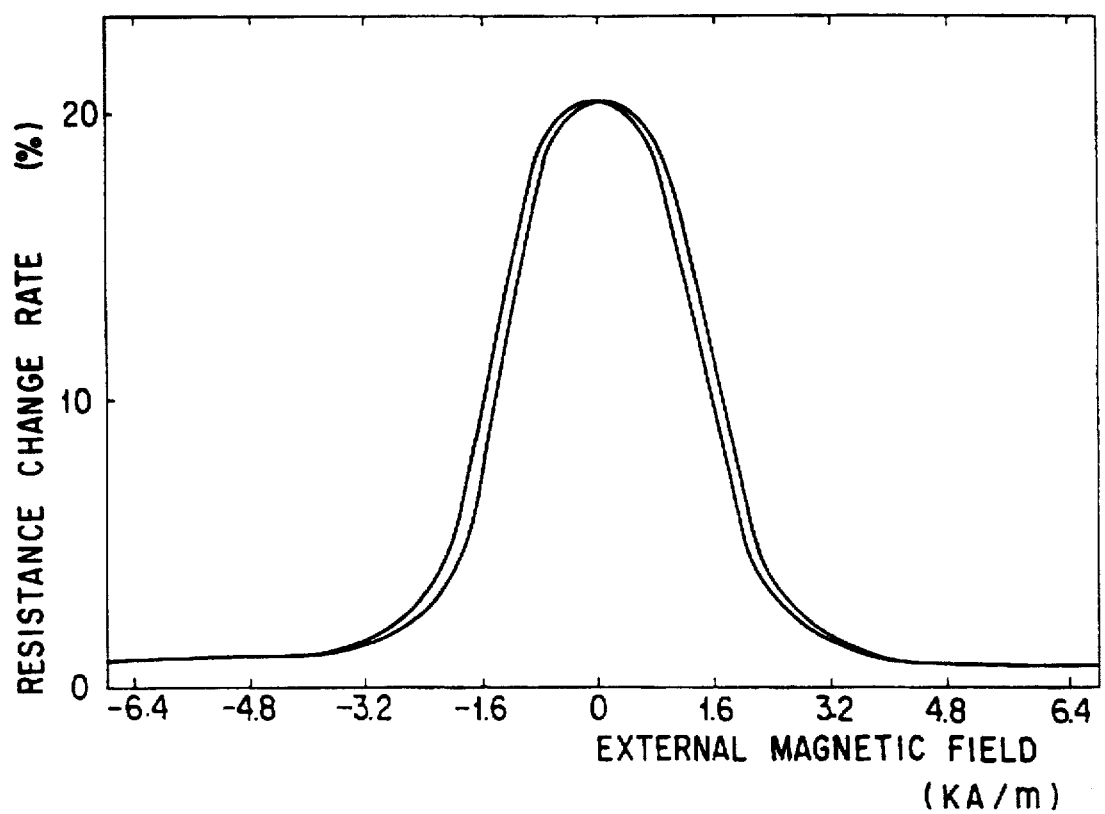
FIG. 7 is a graph showing the external magnetic field dependency of the resistance change rate of the magnetoresistance effect element shown in FIG. 6.

The field dependency of the resistance change rate of this magnetoresistance effect element was measured. The results are shown in FIG. 7. As shown in FIG. 7, the maximum resistance change rate was approximately 20%, the saturation magnetic field was about 2,400 A/m, and the coercive force was 160 A/m. These results show that a large change in magnetic resistance of about 20% could be obtained by a relatively weak magnetic field of 2,400 A/m.

It was also possible to obtain a resistance change rate of 10% or more even when the film thickness of the $Co_{90}Fe_{10}$ films was changed from 0.5 to 3 nm in the above structure. In addition, even when the stacking order of the $Co_{90}Fe_{10}$ films 21 and the Cu films 22 was reversed, i.e., the Cu films 22 and the $Co_{90}Fe_{10}$ films 21 were stacked alternately in this order, the crystal structure presented a strong fcc-phase (111) orientation like in the case of the spin valve structure of Example 1.

EXAMPLE 3

A 10-nm thick Cu undercoating film was formed on each of the C face of a sapphire substrate, a glass substrate (#0211 available from Corning Glass Works), and the (111) plane of an Si substrate. A $Co_{90}Fe_{10}$ film was formed on each resultant structure under the same film formation conditions as in Example 1. Note that the Cu undercoating film can be formed by a bias sputtering process or an ion-assisted ion beam sputtering process or vapor deposition process. The coercive force (Hc) of each $Co_{90}Fe_{10}$ film was measured. In addition, $Co_{90}Fe_{10}$ films with different film thicknesses were formed on the individual substrates via the Cu undercoating films, and the coercive forces (Hc) of these $Co_{90}Fe_{10}$ films were measured. The results are shown in FIG. 8. Furthermore, $Co_{90}Fe_{10}$ films with different film thicknesses were formed on the individual substrates without forming any Cu undercoating film following the same procedures as described above, and the coercive forces (Hc) of these films were measured. The results are shown in FIG. 9.

It is obvious from FIGS. 8 and 9 that in any of these substrates, the Hc when the Cu undercoating film was formed (FIG. 8) was lower than that when a Cu undercoating film was not formed. FIGS. 8 and 9 also reveal that the Hc decreased in an order of the C face of the sapphire substrate, the (111) plane of the Si substrate, and the glass substrate, i.e., the Hc became better in this order, regardless of the presence/absence of the Cu undercoating film. Especially when a $Co_{90}Fe_{10}$ film 8 nm in thickness was formed on the C face of the sapphire substrate, a low Hc of 80 A/m or less was obtained. The Hc of the $Co_{90}Fe_{10}$ film with the Cu undercoating film tended to increase slightly as the film thickness of the $Co_{90}Fe_{10}$ film increased. When a Cu undercoating film was not formed, on the other hand, the Hc of the $Co_{90}Fe_{10}$ film tended to decrease with an increase in film thickness at first and then increased as the film thickness increased further. As an example, when the film thickness of the $Co_{90}Fe_{10}$ film was about 8 nm, the minimum value of the Hc of that film was 160 A/m or less.

The above outcomes indicate that good soft magnetic characteristics can be obtained by forming an undercoating film between a substrate and a ferromagnetic film.

It is also found that good soft magnetic characteristics can be obtained by using a CuNi alloy film as an undercoating film when a $Co_{90}Fe_{10}$ film or a Co film is formed on the C face of a sapphire substrate or an Si substrate. In addition, it is found that the use of a Ge, Si, or Ti film with a thickness of about a few nm to 100 nm as an undercoating film when a $Co_{90}Fe_{10}$ film of a Co film is formed on a glass substrate or a ceramic substrate promotes closest packed plane orientation, and consequently good soft magnetic characteristics can be obtained.

Figure 10:
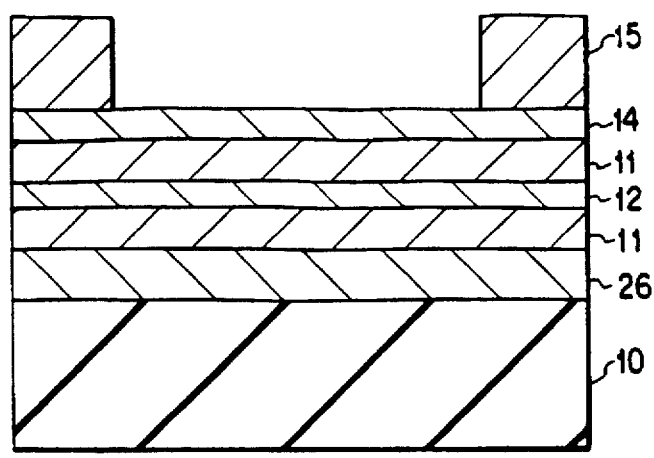

It is also possible to prevent a shunt current of an MR sense current by forming an undercoating film consisting of a material with a higher resistance than that of a $Co_{90}Fe_{10}$ film or a Co film. For example, the Ni oxide film described in Example 1 is an antiferromagnetic film that has a high resistance and can be epitaxially grown on the C face of a sapphire substrate. Therefore, this Ni oxide film can serve as both an undercoating film and an antiferromagnetic bias film. FIG. 10 illustrates a magnetoresistance effect element with a spin valve structure using an Ni oxide film 26.

EXAMPLE 4

The influence that the plane orientation of a sapphire substrate has on the coercive force of a $Co_{90}Fe_{10}$ film was examined. In this example, comparison was made between the C face and the R plane (the (1012) plane of an $\alpha-Al_2O_3$ substrate).

A 10-nm thick $Co_{90}Fe_{10}$ film was formed on each of the C face and the R plane of a sapphire substrate. FIGS. 11A and 11B show the difference in crystal orientation derived from this plane orientation. As is apparent from FIG. 11A, a good fcc (111) orientation was realized on the C face, and it was consequently possible to form a CoFe alloy film having good soft magnetic characteristics with a coercive force of 160 A/m or less. FIG. 11B, on the other hand, reveals that a peak of fcc (200) was found in addition to a peak of fcc (111) on the R plane, indicating that the fcc (111) orientation was not so good. For this reason, the coercive force was several hundreds A/m or more, i.e., no good soft magnetic characteristics could be obtained.

Referring to FIG. 11A, only a peak (which may contain a slight hcp-phase (001) orientation) corresponding to the fcc-phase (111) plane strongly appears near $2\theta=43.5°$ on the C face in addition to the peak of sapphire as the substrate. The higher this peak intensity, the lower the coercive force of the $Co_{90}Fe_{10}$ film. Referring to FIG. 11B, on the other hand, a peak corresponding to the fcc-phase (200) plane appears near $2\theta=52.6°$ on the R plane in addition to the peak of sapphire and the fcc-phase (111) plane peak. The presence of this fcc-phase (100) orientation means appearance of an axis of easy crystal magnetic anisotropy in the plane, and this causes an increase in coercive force.

Figure 12:
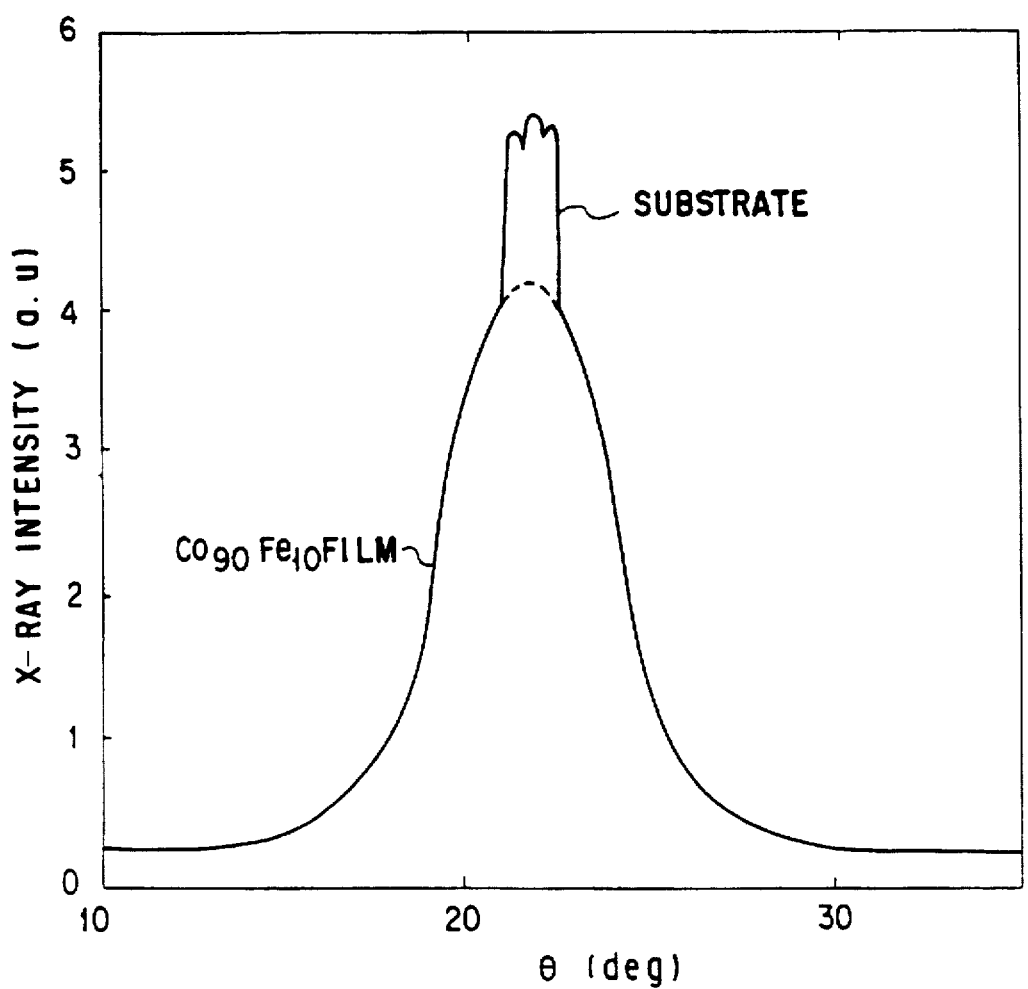
FIG. 12 is a graph showing a rocking curve related to the closest packed plane peak in $Co_{90}Fe_{10}$ film/Cu film/sapphire substrate C face.

Subsequently, a rocking curve was measured for the peak corresponding to the (111) plane (closest packed plane) of the $Co_{90}Fe_{10}$ film on the C face of the sapphire substrate. FIG. 12 shows this rocking curve. As can be seen from FIG. 12, a very strong orientation with a half-width of about 3° is found around a peak near $\theta=21.8°$. Although the peak of the sapphire substrate also overlaps on this rocking curve, a good crystal orientation of the $Co_{90}Fe_{10}$ film is found.

Figure 13:
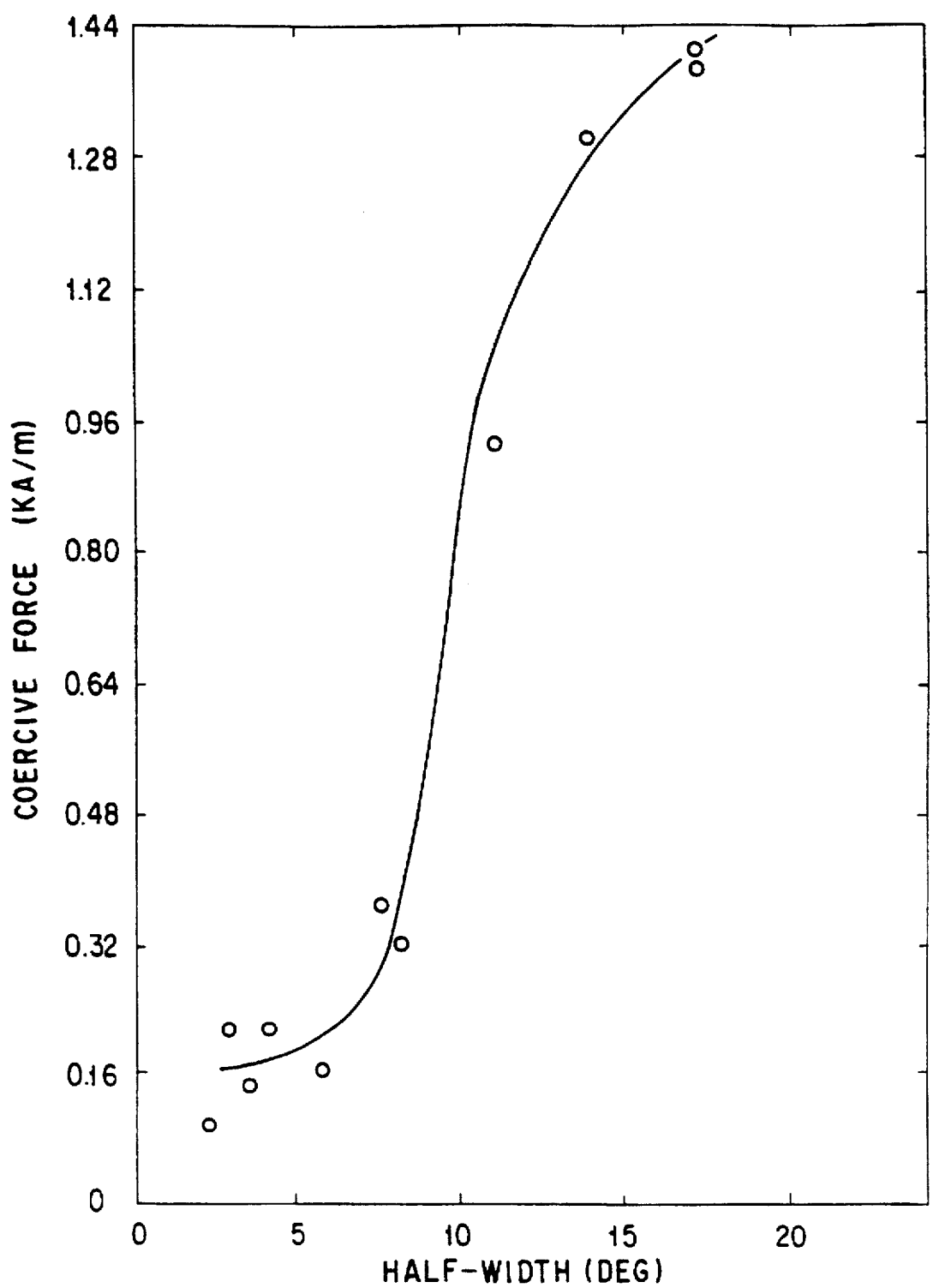
FIG. 13 is a graph showing the rocking curve half-width dependency of the coercive force of a $Co_{90}Fe_{10}$ film upon closest packed plane reflection.

FIG. 13 shows the correlation between the coercive force of the $Co_{90}Fe_{10}$ film and the half-width of the rocking curve at a peak corresponding to the (111) plane (closest packed plane) of the $Co_{90}Fe_{10}$ film. It is clear from FIG. 13 that when a $Co_{90}Fe_{10}$ film was formed on a glass substrate, the (111) peak was often weak, the rocking curve half-width was 20° or more, and the Hc was 3,000 A/m or more. The Hc decreased to about 1,000 A/m when the half-width of the rocking curve was decreased to about 15° by optimizing the Ar pressure and the substrate temperature. When a film consisting of a material prepared by adding about 1% of Al to this $Co_{90}Fe_{10}$ was formed on a glass substrate, the half-width decreased to approximately 8°, decreasing the Hc to about 350 A/m. When a $Co_{90}Fe_{10}$ film was formed on the C face of a sapphire substrate, the half-width further decreased to about 3°, decreasing the Hc to about 160 A/m. It was therefore confirmed that as the half-width of the rocking curve of the peak corresponding to the closest packed plane (the (111) plane in the case of the $Co_{90}Fe_{10}$ film) decreased to less than 20°, the coercive force tended to decrease abruptly. For example, the coercive force approached a good value, 160 A/m, when the half-width of the rocking curve was 7° or less. That is, as the closest packed plane orientation of the $Co_{90}Fe_{10}$ film was enhanced, the coercive force of the $Co_{90}Fe_{10}$ film was decreased. This indicates that there is a strong correlation between good soft magnetic characteristics and the orientation of a ferromagnetic film.

A method of enhancing the closest packed plane orientation of the $Co_{90}Fe_{10}$ film can be selected from 1) a method of adding various additive elements (to be described later), 2) a method of selecting the material and the orientation of a substrate (e.g., selecting the C plane of a sapphire substrate), 3) a method of forming an undercoating film consisting of any of Ti, NiO, a metal with an fcc structure, a metal with a diamond structure such as Si or Ge, a metal with a zinc-blende structure such as GaAs, or an amorphous metal between a substrate and the $Co_{90}Fe_{10}$ film, and 4) a method of performing film formation by using an ultra-high vacuum film formation apparatus such as MBE. Note that when the C face of a sapphire substrate was used as a substrate in the above second method, the $Co_{90}Fe_{10}$ film formed on that C face exhibited better soft magnetic characteristics by setting the mean surface roughness (Ra) of the substrate to 2 nm or less by polishing the C face by means of mechanochemical polish, float polish, or ion polish. If, however, the mean surface roughness was 5 nm or more, the coercive force of the $Co_{90}Fe_{10}$ film was 1,000 A/m or more.

EXAMPLE 5

It is found in Example 4 that the coercive force of a single-layered $Co_{90}Fe_{10}$ film is decreased by enhancing the closest packed plane orientation in accordance with the first or second method. In Example 5, whether the same applies to a stacked film containing a $Co_{90}Fe_{10}$ film is confirmed.

A stacked film with a structure of 10 nm Al-containing $Co_{90}Fe_{10}/5$ nm Cu/10 nm Al-containing $Co_{90}Fe_{10}$ was formed on a glass substrate under the same film formation conditions as in Example 1. FIG. 14 shows the relationship between the Al element addition amount in the $Co_{90}Fe_{10}$ film and the coercive force of the $Co_{90}Fe_{10}$ film. As shown in FIG. 14, the coercive force could be decreased by the addition of the Al element even in the stacked film. It was also possible to similarly enhance the closest packed plane orientation of the $Co_{90}Fe_{10}$ film in the stacked film in accordance with the second to fourth methods described in Example 4.

FIG. 15 shows the closest packed plane peak intensity dependency of the coercive force of the $Co_{90}Fe_{10}$ film in the stacked film. As is clear from FIG. 15, the coercive force decreased as the closest packed plane peak intensity increased like in the single-layered film. In the above structure, the peak intensity was weak, $10^2$ (a.u.), and the coercive force was approximately $10^3$ A/m. In this case, the coercive force was decreased to about several hundreds A/m by the use of a film consisting of a material formed by adding about 1% of Al to $Co_{90}Fe_{10}$. In addition, by replacing the glass substrate with the C face of a sapphire substrate, a peak intensity of $10^3$ (a.u.) or more and a good coercive force of 100 A/m or less could be obtained. At this point, the half-width was 7° or less.

EXAMPLE 6

Figure 16:
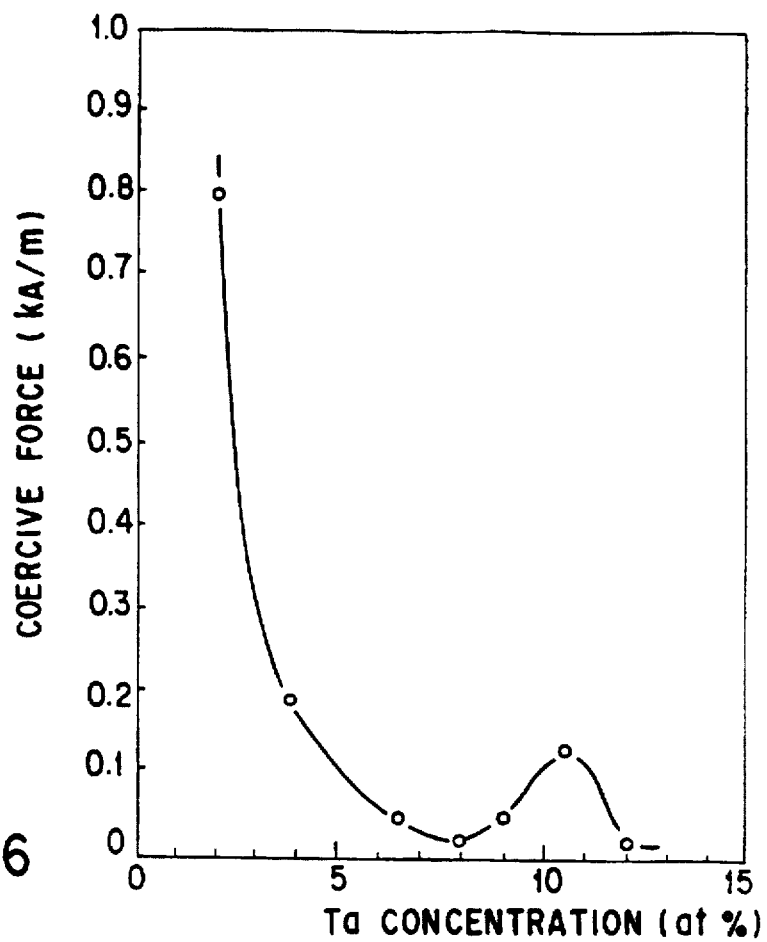
FIG. 16 is a graph showing the Ta concentration dependency of the coercive force of $Co_{90}Fe_{10})_{1-x}Ta_x$ film/Cu film.

A coercive force was checked by adding elements other than Al to $Co_{90}Fe_{10}$. Consequently, a decrease in coercive force was found when Ta, Pd, Zr, Hf, Mo, Ti, Nb, Cu, Rh, Re, In, B, Ru, Ir, and W were used as the additive elements. The coercive force was also decreased when combinations of these elements, such as Ta and Pd, Nb and Pd, and Zr and Nb, were added. As an example, FIG. 16 shows the relationship between the addition amount of Ta and the coercive force in a stacked film with a structure of 10 nm Ta-containing $Co_{90}Fe_{10}/5$ nm Cu/10 nm Ta-containing $Co_{90}Fe_{10}$. It is clear from FIG. 16 that the coercive force was decreased upon addition of the Ta element.

EXAMPLE 7

In each of the above examples, the high (111) orientation was realized for the CoFe film. However, the same effect was found when a CoFeNi film and a CoNi film were used. This example is shown in Table 1 below. Table 1 shows (1) the composition of a ferromagnetic film, (2) the type of a substrate, and (3) the half-width $\Delta\theta_{50}$ of a rocking curve at a (111) peak, the Hc in the axis of easy magnetization, and the $\Delta R/R$ of a spin valve film having a structure (in which a CoFe film with no addictive elements was formed on the side in contact with an FeMn film) similar to that shown in FIG. 3, which was manufactured by using, as a parameter, an undercoating film formed between a substrate and the spin valve film. For comparison, the results obtained when spin valve films using ferromagnetic films with the same compositions as in Table 1 were manufactured on glass substrates without forming any undercoating films are also shown in Table 1.

TABLE 1

| Composition | Substrate | Under-coating film | $\Delta\theta_{50}$ (°) | Hc (A/m) | $\Delta R/R$ (%) |
|---|---|---|---|---|---|
| $Co_{20}Ni_{80}$ | Glass | None | 20 or more | 680 | 5.5 |
| $Co_{20}Ni_{80}$ | Sapphire C face | None | 3.8 | 440 | 5.9 |
| $Co_{20}Ni_{80}$ | Glass | Ti 10 nm | 6.5 | 240 | 5.0 |
| $Co_{20}Ni_{80}$ | Glass | Ge 15 nm | 4.1 | 190 | 5.8 |
| $Co_{20}Ni_{80}$ | Glass | Si 14 nm | 5.8 | 210 | 5.8 |
| $Co_{20}Fe_{15}Ni_{65}$ | Glass | None | 20 or more | 270 | 6.1 |
| $Co_{20}Fe_{15}Ni_{65}$ | Sapphire C face | None | 4.8 | 210 | 6.9 |
| $Co_{20}Fe_{15}Ni_{65}$ | Glass | Ti 7 nm | 6.7 | 120 | 5.8 |
| $Co_{20}Fe_{15}Ni_{65}$ | Glass | Ge 15 nm | 5.3 | 70 | 6.8 |
| $Co_{20}Fe_{15}Ni_{65}$ | Glass | Si 14 nm | 5.5 | 90 | 6.2 |
| $Co_{90}Fe_{10}$ | Glass | None | 20 or more | 3500 | 8.0 |
| $Co_{90}Fe_{10}$ | Glass | Ti 10 nm | 9.1 | 400 | 6.9 |
| $Co_{90}Fe_{10}$ | Glass | Ge 15 nm | 6.0 | 210 | 8.6 |
| $Co_{90}Fe_{10}$ | Glass | Si 14 nm | 5.8 | 190 | 7.1 |

As can be seen from Table 1, even when the CoFeNi film or the CoNi film rather than the CoFe film was used, by using the sapphire C face substrate or by forming the undercoating film consisting of Ti, Si, or Ge, a good (111) -oriented film with $\Delta\theta_{50}<7°$ could be obtained. As a result of this, the Hc was decreased, and the resistance change rate was increased as compared with the case wherein film formation was performed directly on the glass substrate.

When, however, a (1-nm thick M/1-nm thick Cu)$_{16}$ artificial lattice film with a high (111) orientation (M: $Co_{20}Ni_{80}$, $Co_{20}Fe_{15}Ni_{65}$) was manufactured by using an undercoating film consisting of Ti or using a sapphire C face substrate, the $\Delta R/R$ showed a significantly small value of 2% or less, and a high saturation magnetic field inherent in RKKY-like antiferromagnetic coupling disappeared. This indicates that the resistance change rate decreased because no RKKY-like antiferromagnetic coupling could be obtained by the (111) orientation. Therefore, when a high (111) orientation is realized by a stacked film of a type not using RKKY-like antiferromagnetic coupling (a so-called noncoupled artificial lattice film (The 14th Japan Applied Magnetics Society Science Lecture Summaries, 1990, page 177)) as well as the spin valve film, both a high resistance change rate and a good soft magnetism can be obtained easily.

It was also confirmed that the same effect could be obtained when the ferromagnetic film in contact with FeMn was replaced with a film with the same composition as that of the underlying magnetic film.

EXAMPLE 8

Following the same procedures as in Example 1, a spin valve film with a structure of 5 nm Ti/8 nm FeMn/8 nm CoFe/2.2 nm Cu/8 nm magnetic film was formed on a glass substrate (with no undercoating film). Table 2 shows the relationship between the nonmagnetic additive element to be added to the underlying magnetic film, the resistance change rate in the axis of easy magnetization, and the Hc.

TABLE 2

| Composition | Resistance change rate (%) (in the axis of easy magnetiziation) | Hc (A/m) |
|---|---|---|
| $Co_{89.2}Fe_{9.8}Al_{1.0}$ | 8.5 | 320 |
| $Co_{89.0}Fe_{9.0}Al_{2.0}$ | 7.7 | 70 |
| $Co_{87.3}Fe_{7.7}Al_{5.0}$ | 5.1 | 60 |
| $Co_{86.2}Fe_{7.3}Al_{6.5}$ | 2.9 | 100 |
| $Co_{86}Fe_7Re_7$ | 6.7 | 180 |
| $Co_{87}Fe_6Zr_7$ | 6.1 | 120 |
| $Co_{87}Fe_7Ta_6$ | 5.5 | 120 |
| $Co_{81}Fe_9Ta_{10}$ | 1.5 | 95 |
| $Co_{83}Fe_{10}Hf_7$ | 6.8 | 230 |
| $Co_{79}Fe_8Pd_{13}$ | 8.8 | 2050 |
| $Co_{85}Fe_7Pd_8$ | 8.0 | 1700 |
| $Co_{78}Fe_7Cu_{15}$ | 7.9 | 380 |
| $Co_{75}Fe_7Pd_9Cu_9$ | 7.7 | 440 |
| $Co_{1.7}Fe_{13}Ni_{5.7}Pd_{13}$ | 5.5 | 180 |
| $Co_{19}Fe_{14}Ni_{60}Pd_7$ | 5.9 | 180 |
| $Co_{16}Fe_{12}Ni_{55}Pd_9Cu_8$ | 5.3 | 80 |
| $Co_{1.7}Fe_{13}Ni_{5.9}Hf_{11}$ | 5.0 | 120 |
| $Co_{19}Fe_{15}Ni_{60}Hf_6$ | 5.7 | 120 |
| $Co_{81}Fe_9Au_{10}$ | 7.5 | 410 |
| $Co_{83}Fe_{10}Ag_7$ | 7.6 | 350 |
| $Co_{55}Fe_5Pd_{40}$ | 7.3 | 800 |
| $Co_{55}Fe_5Cu_{40}$ | 7.0 | 280 |

As is apparent from Table 2, the Hc was decreased compared with the films formed on the glass substrates by adding no nonmagnetic element. The decrease in Hc was significant upon addition of Al and Ta, but the resistance change rate largely decreased when large amounts of these elements were added. It is clear from Table 2 that both a resistance change rate of 5% or more, which exceeds the resistance change rate obtained by the spin valve film consisting of NiFe, and a low Hc can be achieved by less than 6.5 at % of Al or less than 10 at % of Ta. When Al or Ta was added to CoFe, the closest packed plane peak intensity increased in X-ray diffraction. It is assumed that this decrease in Hc was caused by the improvement in the crystal orientation described above which was due to the improvement in the closest packed plane peak intensity in the X-ray diffraction obtained by the additive elements. In addition, there is a possibility that the decrease in the crystal magnetic anisotropy upon addition of the elements also contributed to the decrease in Hc. On the other hand, the Hc decreasing effect of Cu, Au, Ag or Pd was not so remarkable as that of Al or Ta. However, no decrease in the resistance change rate was found even upon addition of a large amount of 40 at % or less of those elements. The closest packed plane peak intensity in the X-ray diffraction also increased when Cu, Au, Ag or Pd was added to CoFe.

The corrosion resistance of each single-layered magnetic film (thickness 100 nm) was checked by leaving the film to stand in a thermo-hygrostat at 65° C. and RH 95% for 100 hours. Consequently, although no color change was found in the films added with 7 at % or more of Pd, color changes were observed in the CoFe film with no nonmagnetic addictive elements, the $Co_{20}Ni_{80}$ film, the $Co_{20}Fe_{15}Ni_{65}$ film, the film which was added with 6.5 at % of Al and the film which as added with 6 at % of Ta. That is, the addition of Pd achieves the effect of improving the corrosion resistance. The decrease in Hc was not significant upon addition of Pd alone. However, when Pd was added together with, e.g., Cu, it was possible to further improve the soft magnetism while maintaining a high resistance change rate and a high corrosion resistance. When a sapphire substrate, an amorphous metal undercoating film, or a fcc-lattice undercoating film was used, Hc (<80 A/m) was reduced even by adding Pd only, and the resistance change rate increased up to 10% by adding Pd in an amount of 40 at % at most. When, however, Pt which is also a noble metal and therefore expected to be effective in improving the corrosion resistance was added, the Hc increased to be higher than those of films not added with Pt. For this reason, addition of Pt is unpreferable in respect of the soft magnetism.

EXAMPLE 9

Figure 17:
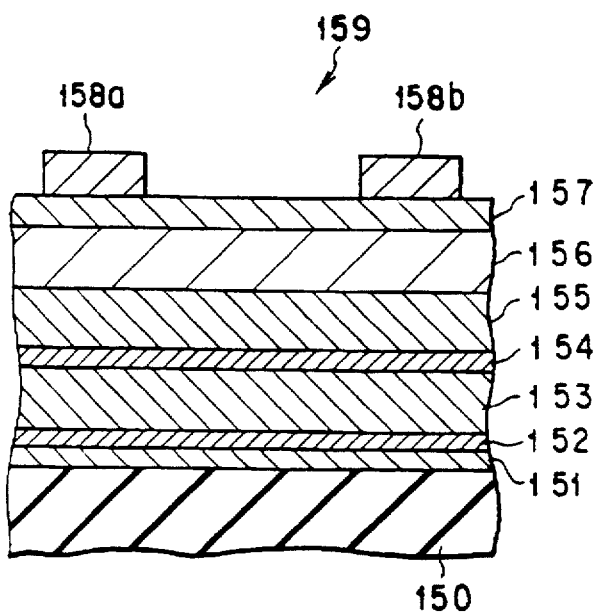

After the surface of a thermal oxide Si substrate with surface roughness $R_a=2$ nm or less was cleaned by SH mixture of sulfuric acid and $H_2O_2$ processing, the substrate was placed in a vacuum chamber, and the chamber was evacuated to $1 \times 10^{-9}$ Torr or less. Water and oxygen in the vacuum chamber were controlled by a mechanical spectrometer and a dew point meter. After the above procedure, super-high-purity Ar gas was introduced into the vacuum chamber, and the vacuum degree in the chamber was set at $1 \times 10^{-4}$ Torr. Sputtering was then performed by using an ion beam accelerated by generating microwave discharge of 2.45 GHz inside an ECR ion source, thereby forming an amorphous Si film with a film thickness of 5 nm as a first undercoating film 151 on the thermal oxide Si substrate 150 as shown in FIG. 17. Thereafter, while the vacuum in the chamber was held, a Cu-Ni alloy film with a film thickness of 2 nm was formed as a second undercoating film 152 on the first undercoating film 151.

On the surface of the resultant structure, an 8-nm thick $Co_{90}Fe_{10}$ alloy film as a first ferromagnetic film 153, a 2.2-nm thick Cu-Ni alloy film as a nonmagnetic film 154, an 8-nm thick $Co_{90}Fe_{10}$ alloy film as a second ferromagnetic film 155, an 8-nm thick Fe-Mn alloy film as an antiferromagnetic film 156, and a 5-nm thick Ti film as a protective film 157 were formed in sequence, manufacturing a stacked film with a spin valve structure. All of these thin films were formed by ion beam sputtering. Cu electrodes 158a and 158b were also formed on this stacked film to obtain a spin valve type magnetoresistance effect element 159.

Note that $Co_{90}Fe_{10}$ was used as the composition of the Co-Fe alloy films as the ferromagnetic films 153 and 155 in respects of a high resistance change rate (Japan Applied Magnetics Society Journal: 16, 313 (1992)) and soft magnetic characteristics.

The crystallinity, the magnetic characteristics, and the resistance change rate of the spin valve type magnetoresistance effect element thus manufactured were measured. Consequently, the half-width of the Co-Fe alloy film obtained by X-ray diffraction was 1°, and the coercive force as one physical characteristic indicating soft magnetic characteristics was 0.1 Oe. The rate of change in magnetic resistance measured by using this element exhibited a high value of approximately 10%.

As a comparison with this invention, a substrate subjected to the same processing was placed in a vacuum chamber, and the chamber was evacuated to $1 \times 10^{-7}$ Torr or less. Thereafter, regular Ar gas was introduced into the chamber until the vacuum degree became $2 \times 10^{-3}$ Torr, and a Cu film as an undercoating film was formed directly on the surface of the substrate without forming any amorphous Si film. Subsequently, a stacked film with the same spin valve structure as that of Example 9 was formed on the surface of the resultant structure. Cu electrodes were then formed on this stacked film, thereby manufacturing a magnetoresistance effect element. The stacked film was formed by a double-pole sputtering process excited with a normal frequency of 13.56 MHz.

The crystallinity, the magnetic characteristics, and the resistance change rate of this magnetoresistance effect element as the comparative example were measured. As a result, the half-width of the Co-Fe alloy film measured by X-ray diffraction was 7°, and the coercive force as one physical characteristic indicating soft magnetic characteristics was found to be 1.5 Oe. The rate of change in magnetic resistance measured by using this element was about 5%.

EXAMPLE 10

After the surface of a sapphire substrate with surface roughness $R_a=2$ nm or less was cleaned, the substrate was placed in a vacuum chamber, and the chamber was evacuated to $1 \times 10^{-9}$ Torr or less. Water and oxygen in the vacuum chamber were controlled by using a mechanical spectrometer and a dew point meter. After the above procedure, an amorphous Cu-Ti film with a film thickness of 3 nm was formed as a first undercoating film by an ultra-high-vacuum vapor deposition process using an electron beam vapor deposition source. Thereafter, while the vacuum in the vacuum chamber was maintained, an Fe-Mn alloy film with a film thickness of 2 nm was foraged as a second undercoating film by using ultra-high-vacuum RF sputtering at an excitation frequency of 100 MHz.

Subsequently, on the above undercoating films, constituent films of a stacked film with a spin valve structure of 8 nm $(Co_{81}Fe_9Pd_{10})$/5 nm Ti/7 nm FeMn/2.2 nm Cu/8 nm $(Co_{81}Fe_9Pd_{10})$ were formed by using ultra-high-vacuum RF sputtering at an excitation frequency of 100 MHz. Cu electrodes were then formed on this stacked film, thereby manufacturing a spin valve type magnetoresistance effect element.

The crystallinity, the magnetic characteristics, and the resistance change rate of the spin valve type magnetoresistance effect element thus manufactured were measured following the same procedures as in Example 9. Consequently, the half-width of the Co-Fe film measured by X-ray diffraction was 1.5°, and the coercive force as one physical characteristic indicating soft magnetic characteristics was 1 Oe. The rate of change in magnetic resistance measured by using this element was found to be a high value of approximately 12%.

EXAMPLE 11

As shown in FIG. 18, a high-resistance amorphous layer 31 consisting of CoZrNb was formed on a support substrate 30, and a ferromagnetic film 32 consisting of a CoFe alloy, an interlayer 33 consisting of Cu, another ferromagnetic film 32, and an exchange bias layer 34 consisting of FeMn were formed in sequence on the high-resistance amorphous layer 31 in a static magnetic field of about 4 kA/m. Thereafter, leads 35 were formed on the exchange bias layer 34, manufacturing a magnetoresistance effect element. Note that the individual layers were formed under the film formation conditions shown in Table 3 below by using a four-element sputtering apparatus.

TABLE 3

| | Film Formation Conditions | | | |
| --- | --- | --- | --- | --- |
| | Amorphous layer | Ferro-magnetic film | Inter-layer | Exchange bias layer |
| Target | CoZrNb | CoFe | Cu | FeMn |
| Ultimate vacuum | | $8 \times 10^{-5}$ Pa | | |
| Sputter pressure | | 0.4 Pa | | |
| Supply power | 400 W | 300 W | 80 W | 300 W |
| Film thickness | 10 nm | 8 nm | 3 nm | 140 nm |

The film thickness of CoFe in contact with FeMn was 4.5 nm.

The magnetic characteristics of this magnetoresistance effect element were examined. FIGS. 19 and 20 show the resultant M-H curves (magnetization-magnetic field curves). FIG. 19 shows the M-H curves in the direction of the axis of easy magnetization, and FIG. 20 shows the M-H curves in the direction of the axis of hard magnetization.

As can be seen from FIG. 19, the coercive force Hc (indicated by a in FIG. 19) of the CoFe film not locked to FeMn was approximately 500 A/m, which was much smaller than Hc of about 1,600 A/m of a normal CoFe single-layered film. In addition, as shown in FIG. 20, the coercive force Hc (indicated by b in FIG. 20) of the CoFe film not locked to FeMn was about 600 A/m in the axis of hard magnetization on the signal magnetic field input side. This value was also much smaller than the Hc of about 1,600 A/m of a regular CoFe single-layered film.

The resistance change characteristics of the magnetoresistance effect element were also checked. FIG. 21 shows the resultant R-H curves (resistance-magnetic field curves). As shown in FIG. 21, the resistance change rate ΔR/R exhibited a high value, about 9%, which was equivalent to that of a conventional Co-based spin valve film. The coercive force Hc (indicated by c in FIG. 21) of the CoFe film not locked to FeMn was low, approximately 500 A/m, as can be predicted from FIG. 19.

Although the FeMn film was used as the exchange bias layer in this example, an antiferromagnetic film consisting of, e.g., NiO can also be used. It was also confirmed that good characteristics could be obtained by using an artificial lattice film with a structure of, e.g., (Co/Cu)$_n$. In addition, the CoZrNb film was used as the high-resistance amorphous film in this example, but it is also possible to use an FeZr film, an FeZrN film, a CoZrN film, an FeTaC film, or an NiFeX film (X: Rh, Nb, Zr, Hf, Ta, Re, Ir, Pd, Pt, Cu, Mo, Mn, W Ti, Cr, Au, or Ag) consisting of fine crystals. In a fcc-phase fine crystal film (Co-based nitride, Co-based carbide or NiFeX film) in particular, not only was the fcc-phase (111) orientation promoted, but also did Hc decrease (to 250 A/m in the axis of easy magnetization) and the resistance change rate increase to 10%.

Figure 22:
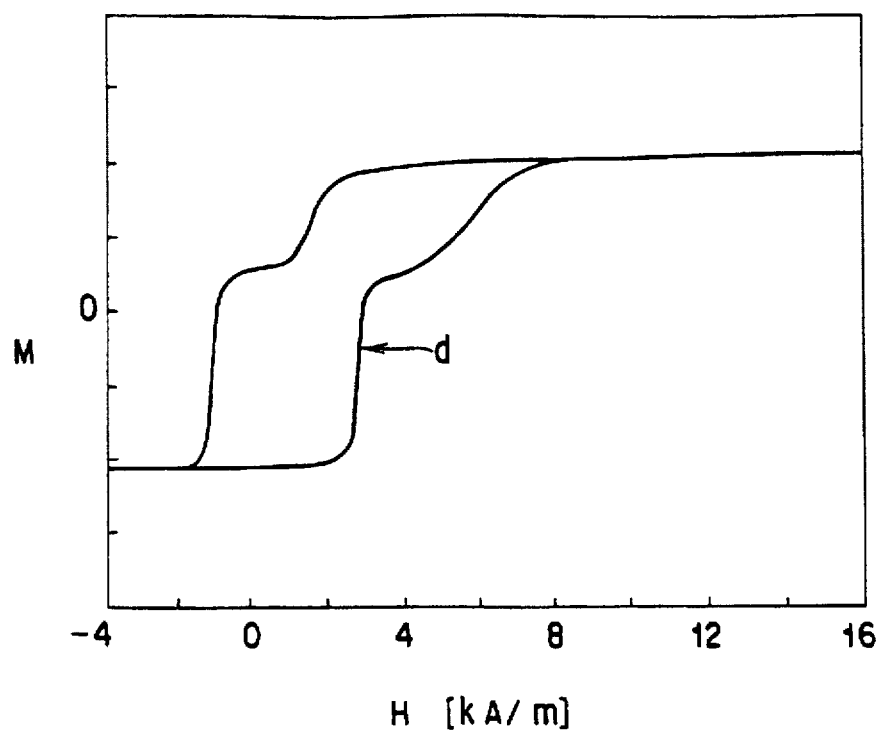
FIG. 22 is a graph showing the M-H curves in the axis of easy magnetization of a magnetoresistance effect element having no high-resistance amorphous layer.
Figure 23:
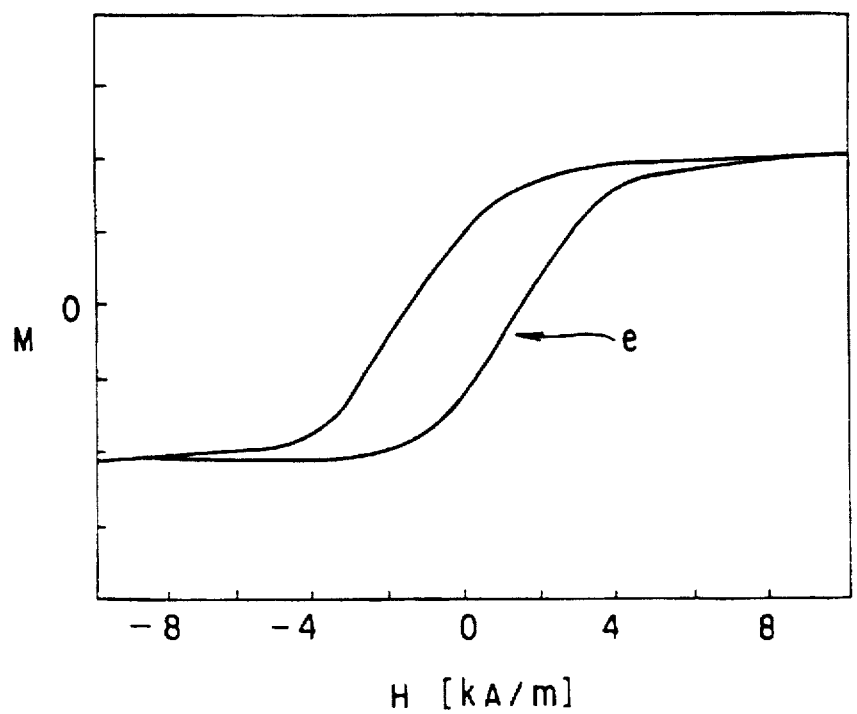
FIG. 23 is a graph showing the M-H curves in the axis of hard magnetization of the magnetoresistance effect element having no high-resistance amorphous layer.

For comparison, a ferromagnetic film, an interlayer, another ferromagnetic film, and an exchange bias layer similar to those shown in FIG. 25 (to be described later) were formed in sequence on a support substrate having no high-resistance amorphous layer, thereby manufacturing a magnetoresistance effect element. Thereafter, the magnetic characteristics of this magnetoresistance effect element were examined. FIGS. 22 and 23 show the resultant M-H curves. FIG. 22 shows the M-H curves in the direction of the axis of easy magnetization, and FIG. 23 shows the M-H curves in the direction of the axis of hard magnetization. The film formation conditions were the same as in Table 3.

As is apparent from FIG. 22, the coercive force Hc (indicated by d in FIG. 22) of the CoFe film not locked to FeMn was about 2,000 A/m, which was a high value equivalent to that of a conventional CoFe single-layered film. In addition, as shown in FIG. 23, the coercive force Hc (indicated by e in FIG. 23) of the CoFe film not locked to FeMn was approximately 1,400 A/m in the axis of hard magnetization This value was as high as the Hc of a normal CoFe single-layered film and hence unsatisfactory as the Hc of a magnetoresistance effect element.

EXAMPLE 12

Figure 24:
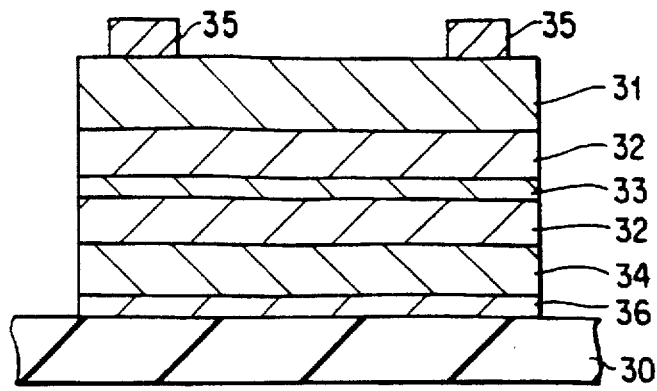

As shown in FIG. 24, an undercoating film 36 about 5 nm in thickness consisting of Cu was formed on a support substrate 30, and an exchange bias layer 34, a ferromagnetic film 32, an interlayer 33, another ferromagnetic layer 32, and a high-resistance amorphous layer 31 were formed in sequence on the undercoating film 36. Leads 35 were then formed on the high-resistance amorphous layer 31, thereby manufacturing a magnetoresistance effect element. Note that the film formation conditions were the same as shown in Table 3.

It was possible to obtain a low Hc even in the structure shown in FIG. 24 in which the high-resistance amorphous layer was formed above the exchange bias layer. In addition, since the amorphous layer had a high resistance, no decrease in the rate of change in magnetic resistance was caused by a shunt effect although this layer was formed as the uppermost layer. In this structure, it is desirable to form the undercoating film in order to control the crystal orientation of FeMn.

EXAMPLE 13

Figure 25A:
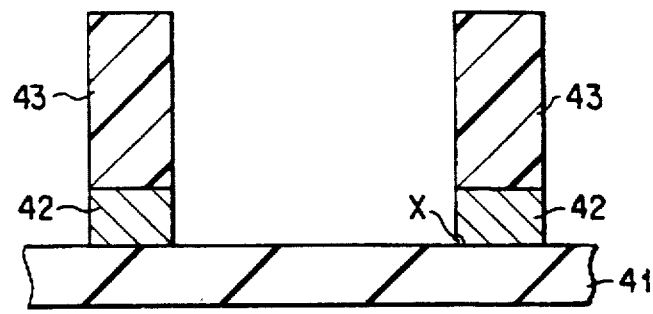
FIGS. 25A to 25C are sectional views showing a manufacturing process of another example of the magnetoresistance effect element according to the third invention of the present invention.

A CoPtCr film 42 was formed to have a thickness of 8 nm on a support substrate 41, and a resist 43 was coated on the film 42. Thereafter, the resist 43 was patterned into a desired shape, and, as shown in FIG. 25A, etching was performed by ion milling. In this case, it is desirable that the taper angle X of CoPtCr be closer to 90°.

Figure 25B:
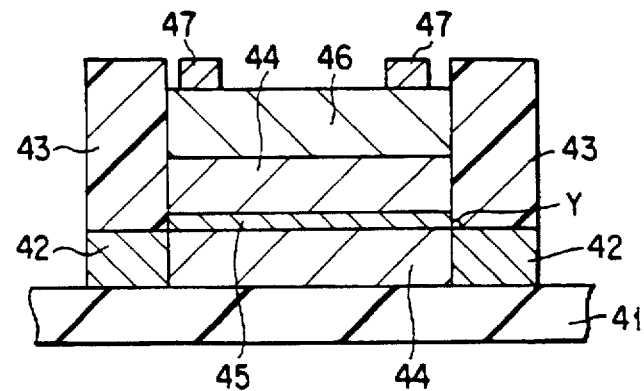

Subsequently, as shown in FIG. 25B, without removing the resist 43 after the etching, a ferromagnetic film 44 consisting of a CoFe alloy, an interlayer 45 consisting of Cu, another ferromagnetic film 44, and a high-resistance amorphous layer 46 were formed in sequence, manufacturing a magnetoresistance effect element with a spin valve structure. In this case, the taper angle Y of the resist 43 is preferably as closer to 90° as possible.

Figure 25C:
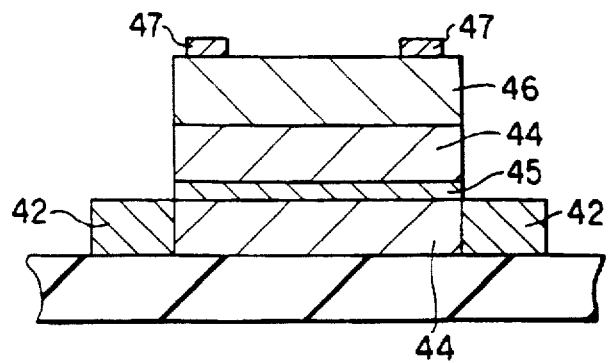

After the resist 43 was removed, leads 47 were formed on the high-resistance amorphous layer 46. Note that the leads 47 can also be formed before the removal of the resist 43. As shown in FIG. 25C, the above procedure makes it possible to manufacture a spin valve structure sensitive to the interface state without causing any deterioration in characteristics.

As in the above structure, a high-coercive-force film can be used without using any exchange bias layer consisting of FeMn or the like as a magnetization locking film. The material of the high-coercive-force film is preferably one that can achieve a proper in-plane magnetic anisotropy without using any undercoating film. In this example, therefore, the CoPtCr film which satisfies this characteristic was used as the high-coercive-force film.

EXAMPLE 14

As shown in FIG. 26, a high-resistance amorphous layer 31, a ferromagnetic film 32, an interlayer 33, another ferromagnetic film 32, and another high-resistance amorphous layer 31 were stacked in sequence on a support substrate 30, and leads 35 were formed on the uppermost high-resistance amorphous layer 31, manufacturing a magnetoresistance effect element.

As in the structure shown in FIG. 26, the antiferromagnetic magnetization arrangement between the ferromagnetic films 32 can be realized by using a magnetic field generated by a sense current of a self-bias effect resulting from the effect of a demagnetizing field caused by the shape, without using any exchange bias layer consisting of FeMn as a magnetization locking film.

In this case, the magnetic field generated by a sense current is applied such that the direction of the magnetic field above the ferromagnetic film 32 is opposite to that below the ferromagnetic film 32 in the direction (indicated by g in FIG. 26) of the film width. In addition, to decrease the demagnetizing field in the direction of the film width, the two ferromagnetic films 32 are coupled antiferromagnetically. As a result, the two ferromagnetic films 32 can be coupled antiferromagnetically without using any exchange bias layer. Therefore, when a signal magnetic field Hs is applied in the longitudinal direction (indicated by f in FIG. 26) of the film, the magnetizations of the two ferromagnetic films 32 are rotated and arranged in the longitudinal direction of the film, thereby obtaining a ferromagnetic coupling. The result is a large $\Delta R/R$ derived from spin-dependent scattering.

EXAMPLE 15

As shown in FIG. 27, a CoCr alloy film as a high-resistance ferromagnetic film 161 was formed to have a film thickness of 1 nm on a thermal oxide Si substrate 160 by using an ion beam sputtering process. Subsequently, on this high-resistance ferromagnetic film 161, a 3-nm thick CoFe alloy film as a first ferromagnetic film 162, a 2-nm thick Cu film as a nonmagnetic film 163, and a 3-nm thick CoFe alloy film as a second ferromagnetic film 164 were formed in sequence, forming a spin valve type stacked film.

Thereafter, an FeMn film with a thickness of 15 nm was formed as an antiferromagnetic film 165 on the above stacked film. A protective film 166 was formed on the antiferromagnetic film 165 as needed, and electrodes 167a and 167b (spacing 10 µm) were formed, thereby manufacturing a spin valve type magnetoresistance effect element 168.

The resistance change rate of the spin valve type magnetoresistance effect element thus manufactured was found to have a high value of 14% at room temperature.

As a comparison, a spin valve type magnetoresistance effect element was manufactured following the same procedures as in Example 15 except that no high-resistance ferromagnetic film 161 was formed. When the characteristics of this spin valve type magnetoresistance effect element were evaluated following the same procedures as in Example 15, the resistance change rate was found to be 12% at room temperature.

EXAMPLE 16

A $Co_{90}Fe_{10}$ alloy film as a first ferromagnetic film, a Cu film as a nonmagnetic film, a $Co_{90}Fe_{10}$ alloy film as a second ferromagnetic film, and an FeMn film as an antiferromagnetic film were formed in this order on a sapphire substrate. The resistance change rate ($\Delta\rho/\rho_0$) was measured while changing the thickness ($d_{FeCo}$) of the first and second ferromagnetic films. The result is shown in FIG. 28. Note that the thicknesses of the first and second ferromagnetic films were the same, the thickness of the Cu film was 2.2 nm, and the thickness of the FeMn film was 15 nm. In this magnetoresistance effect element, electrodes were formed on the antiferromagnetic film via a protective film consisting of, e.g., Ta, Ni, or NiCr with a high corrosion resistance if necessary. As is apparent from FIG. 28, the MR effect was enhanced when the $d_{FeCo}$ was 5 nm or less. In addition, the peak appeared near $d_{FeCo}=3$ nm, and a preferable range was 2 to 4 nm.

As the thickness of the sandwich structure of ferromagnetic film/nonmagnetic film (thin metal film)/ferromagnetic film decreases, electron scattering in the interface not in contact with the thin metal increases, and the size effect of resistance appears. Assuming that the total film thickness of the sandwich structure is t and the mean free path is $l_0$, the variation ($\Delta\rho$) of the specific resistance of the sandwich structure is proportional to $l_0/t$. As can be seen from FIG. 28, when the Co-based ferromagnetic layer is used, the thickness of the ferromagnetic layer is preferably 5 nm or less in order to obtain a good MR effect although it changes depending on various conditions.

That is, if a low-resistance material with a specific resistance of, e.g., 30 µΩ.cm or less is in contact with the surface of the ferromagnetic film not in contact with the thin metal film, electrons pass through this interface to flow into the material with a specific resistance of 30 µΩ.cm or less, and this makes occurrence of effective surface scattering difficult. Therefore, to cause effective surface scattering to make use of the size effect, it is effective to use a material with a specific resistance of 30 µΩ.cm or more or to decrease the film thickness of the contacting material to 5 nm or less.

To take advantage of the size effect to thereby obtain a large MR effect, it is preferable that the film thickness of the Co-based ferromagnetic film be 5 nm or less. In this case, it is desirable to use a metal with a low specific resistance, such as Cu, Ag, or Au, as the thin intermediate metal film, and the film thickness of the thin intermediate metal film is preferably less than 5 nm in order to use the size effect. If the film thicknesses of the two ferromagnetic films are largely different from each other, the effect of the surface scattering is also different between the two ferromagnetic films, and this decreases the rate of change in magnetic resistance. For this reason, the thickness ratio of the two ferromagnetic films is desirably between 1:1 and 1:2.

EXAMPLE 17

As shown in FIG. 29, a CuPd alloy film as a nonmagnetic film 161 was formed to have a thickness of 2 nm on a sapphire substrate 160 by an RF sputtering process. Subsequently, on this nonmagnetic film 161, a 1-nm thick CoFe alloy film as a first ferromagnetic film 162, a 2-nm thick Cu film as a nonmagnetic film 163, and a 3-nm thick CoFe alloy film as a second ferromagnetic film 164 were formed in sequence, thereby forming a spin valve type stacked film.

On this stacked film, an FeMn film with a thickness of 15 nm was formed as an antiferromagnetic film 165. On the antiferromagnetic film 165, a protective film 166 was formed as needed, and electrodes 167a and 167b were formed, thereby manufacturing a spin valve type magnetoresistance effect element 171.

In this magnetoresistance effect element, since unidirectional anisotropy is imparted to the second ferromagnetic film 164 by the antiferromagnetic film 165, the magnetization is locked in one direction in a low magnetic field. In contrast, the first ferromagnetic film 162 has its magnetization in the direction of a magnetic field even in a low magnetic field. Therefore, the angle defined between the magnetizations of the two ferromagnetic fields can be controlled freely by changing the external magnetization. Note that the thickness of the antiferromagnetic film 165 is preferably about 1 to 50 nm in order to impart an effective unidirectional anisotropy to the second ferromagnetic film 164.

The resistance change rate of the spin valve type magnetoresistance effect element 171 thus manufactured was measured. Consequently, the resistance change rate exhibited a high value of 8% at room temperature although the thickness of the first ferromagnetic film 162 was as small as 1 nm. In addition, when the above spin valve type magnetoresistance effect element 171 was used in reproduction of high-density magnetic recording in the form of a slender strip having a width of 2 μm and a length of 80 μm, with Cu leads spaced apart by a distance of 2 μm, it was possible to remove Barkhausen noise.

For comparison, a spin valve type magnetoresistance effect element was manufactured following the same procedures as in Example 17 except that no nonmagnetic film 161 was formed. When the characteristics of this spin valve magnetoresistance effect element were evaluated in the same manner as in Example 17, the resistance change rate showed only a small value of 3% at room temperature.

In addition, another spin valve type magnetoresistance effect element was manufactured following the same procedures as in Example 17 except that the film thickness of the first ferromagnetic film 162 was changed to 5 nm. When the characteristics of this spin valve type magnetoresistance effect element were evaluated in the same manner as in Example 17, a resistance change rate of 6% could be obtained at room temperature. However, Barkhausen noise caused by a demagnetizing field was observed. Furthermore, the Cu-CoFe interface need not be flat.

EXAMPLE 18

Figure 30:
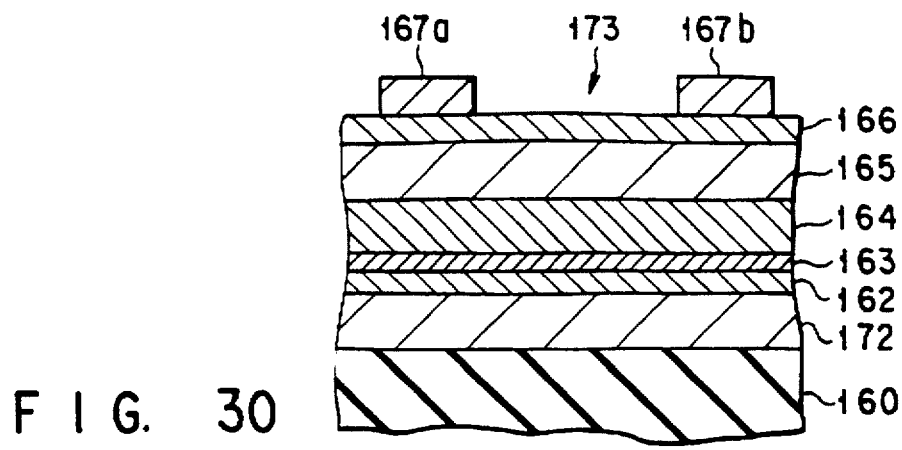
FIG. 30 is a sectional view showing another magnetoresistance effect element according to the fifth invention of the present invention.

As shown in FIG. 30, a GaAs film doped with Te so as to obtain a carrier density of $10^{20}$ cm$^{-3}$ was formed to have a thickness of 10 nm as a thin film 172 with a long mean free path on a thermal oxide Si substrate 160 by using an MBE process. Subsequently, on this Te-doped GaAs film 172, a 1-nm thick CoFe alloy film as a first ferromagnetic film 162, a 2-nm thick Cu film as a nonmagnetic film 163, and a 4-nm thick CoFe alloy film as a second ferromagnetic film 164 were formed in sequence, thereby forming a spin valve type stacked film.

Thereafter, a 15-nm thick FeMn film as an antiferromagnetic film 165 was formed on the above stacked film. A protective film 166 was formed on the antiferromagnetic film 165 as needed, and electrodes 167a and 167b were also formed, thereby manufacturing a spin valve type magnetoresistance effect element 173.

The resistance change rate of this spin valve type magnetoresistance effect element was found to have a high value of 18% at room temperature. In addition, the above spin valve type magnetoresistance effect element was used in reproduction of high-density magnetic recording to measure an output signal voltage with a sense current having a current density of $10^5$ A/cm$^2$. Consequently, it was possible to obtain a good value of 1 mV$_{p-p}$.

As a comparison, a spin valve type magnetoresistance effect element was manufactured following the same procedures as in Example 18 except that no Te-doped GaAs film 172 was formed. When the characteristics of this spin valve type magnetoresistance effect element were evaluated in the same manner as in Example 17, the resistance change rate presented only a small value of 2% at room temperature.

EXAMPLE 19

A 10-nm thick Cu film was formed as an undercoating film on a glass substrate, and a Co$_{90}$Fe$_{10}$ film was formed on the Cu film. These Cu and Co$_{90}$Fe$_{10}$ films were formed by an RF double-pole sputtering process. Note that the sputtering was performed under the following sputtering conditions by applying a unidirectional magnetic field of about 4,000 A/m to the vicinity of the substrate by using a permanent magnet during the film formation.

| Preevacuation | $1 \times 10^{-4}$ Pa or less |
|---|---|
| Ar sputter gas pressure | 0.4 Pa |
| RF supply power | CoFe: 300–500 W |
| | Cu: 160 W |
| Sputtering rate | CoFe: 0.5–1 nm/s |
| | Cu: 1 nm/s |

Figure 31:
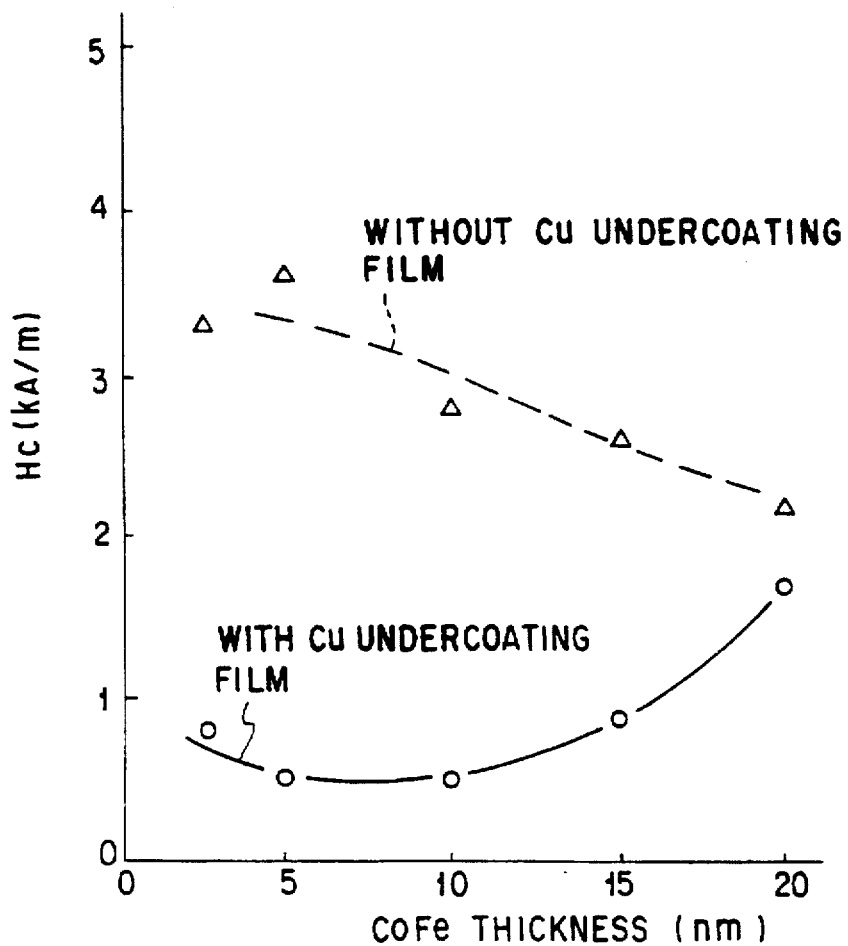

FIG. 31 shows the relationship between the Hc (in the axis of hard magnetization) and the film thickness of the Co$_{90}$Fe$_{10}$ film thus formed. FIG. 31 also shows the result obtained by forming a Co$_{90}$Fe$_{10}$ film directly on a glass substrate without forming any Cu undercoating film as a comparative example. The coercive force Hc was measured by a vibrating magnetometer.

As is apparent from FIG. 31, the normal Co$_{90}$Fe$_{10}$ film having no Cu undercoating film exhibited a high Hc value of 2,000 A/m or more for a film thickness of 20 nm or less. When a Cu undercoating film was formed, on the other hand, although a decrease in Hc was slight in the Co$_{90}$Fe$_{10}$ film with a film thickness of 20 nm, the Hc decreased largely to 400 to 900 A/m when the film thickness was 10 nm or less. This demonstrates that a Cu undercoating film formed between a glass substrate and a Co$_{90}$Fe$_{10}$ film can decrease the Hc of the Co$_{90}$Fe$_{10}$ film. This Hc decreasing effect was found if the film thickness of the Cu undercoating film was one atomic layer or more. Since a sense current is shunted easily to Cu with a low resistivity, the resistance change rate decreases if the film thickness of the Cu undercoating film is increased. To prevent this decrease in the resistance change rate, the film thickness of the Cu undercoating film is preferably 2 nm or less.

Note that no decrease in Hc was found when a Co film was formed on a glass substrate via a Cu undercoating film. This indicates that the effect of improving soft magnetism using an undercoating film is achieved when a ferromagnetic film consists of an alloy obtained by adding Fe to Co. It was found that a low Hc was realized especially when the concentration of Fe to be added to Co was 5% to 40%. This is so because if the Fe concentration is less than 5%, the hcp phase is mixed, and, if the Fe concentration exceeds 40%, the bcc phase is mixed easily. Examples of elements to be added to CoFe are Pd, Al, Cu, Ta, in, B, Zr, Nb, Hf, Mo, Ni, W, Re, Ru, Ir, Rh, Ga, Au, and Ag. The Hc reducing effect can be achieved similarly when these elements were added.

As the undercoating film other than the Cu film, it is possible to use a film consisting of a material having the fcc phase and a larger lattice constant than that of CeFe, e.g., a Cu-based alloy, Pd, Al, or a magnetic film having the fcc phase. It was found that the Hc reducing effect could be obtained similarly by using these materials.

EXAMPLE 20

A Cu undercoating film with a thickness of 5 to 6 nm was formed on a glass substrate, and a Co$_{90}$Fe$_{10}$ film, a 2-nm thick Cu interlayer, and another Co$_{90}$Fe$_{10}$ film were formed in sequence on the Cu undercoating film. These films were formed under the same film formation conditions as in Example 19.

Figure 32:
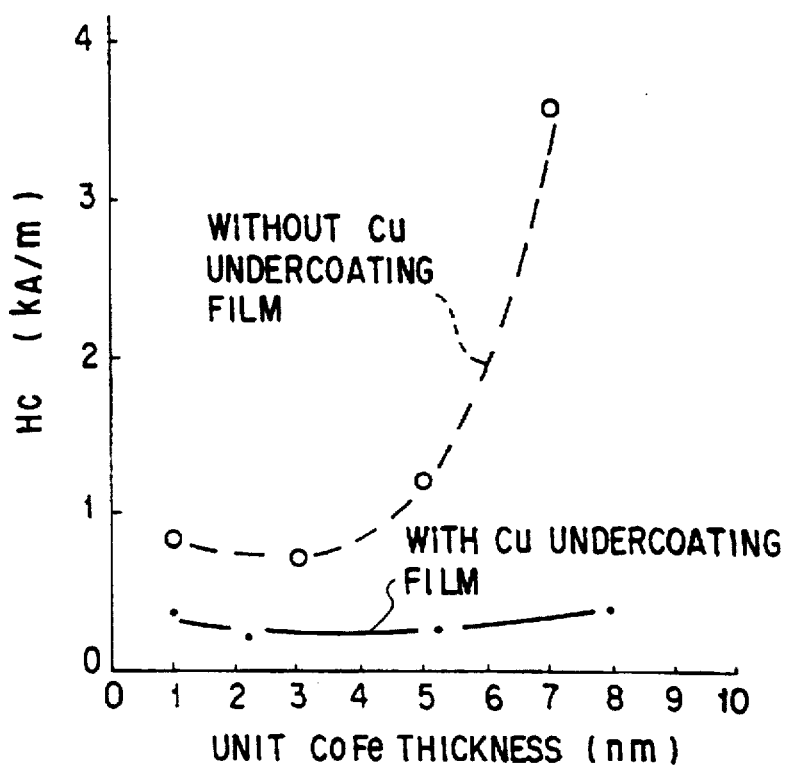

FIG. 32 shows the relationship between the Hc (in the axis of hard magnetization) and the film thickness of the Co$_{90}$Fe$_{10}$ film in this stacked film (Cu/CoFe/Cu/CoFe). Like in FIG. 31, the result obtained by forming a Co$_{90}$Fe$_{10}$ film on a glass substrate without forming any Cu undercoating film is also shown in FIG. 32.

As shown in FIG. 32, in the stacked film having no Cu undercoating film, although the Hc increased abruptly when the film thickness of the unit $Co_{90}Fe_{10}$ film was 5 nm or more, the Hc was 800 A/m for a film thickness of 3 nm or less. That is, the Hc could be reduced simply by forming a Cu interlayer. The Hc could be further reduced by providing a Cu undercoating film to this stacked film; i.e., a low Hc of 220 to 400 A/m could be obtained when the film thickness of the unit $Co_{90}Fe_{10}$ film was 7 nm or less. Therefore, the Hc can be decreased to be much lower than that in Example 19 in the $Co_{90}Fe_{10}$ stacked film using the Cu undercoating film and the Cu interlayer.

Figure 33:
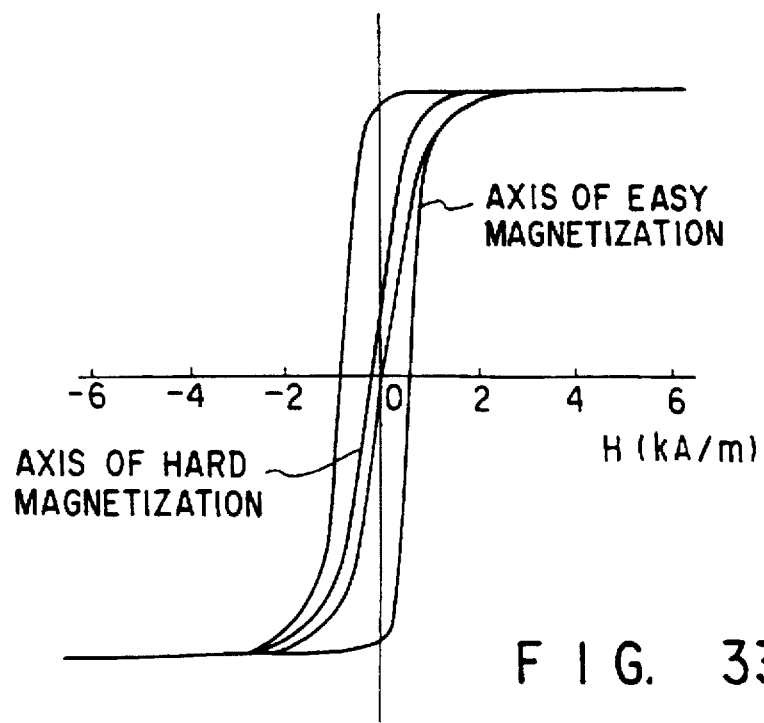
FIGS. 33 and 36 are graphs each showing the magnetization curves of the ferromagnetic film of the magnetoresistance effect element according to the sixth invention of the present invention.

FIG. 33 shows the magnetization curves (in the axis of easy magnetization) of a stacked film with a structure of 5 nm Cu/2.2 nm $Co_{90}Fe_{10}$/2 nm Cu/2.2 nm $Co_{90}Fe_{10}$. As is apparent from FIG. 33, the residual magnetization was 90% or more even when the magnetic field was 0, indicating that the magnetizations of these two $Co_{90}Fe_{10}$ ferromagnetic films show a ferromagnetic behavior rather than an antiferromagnetic behavior.

EXAMPLE 21

A $(CoFe/Cu)_n$ film was formed under the same film formation conditions as in Example 19 by setting a unit film thickness of a $Co_{90}Fe_{10}$ film to 1.5 nm and a unit film thickness of a Cu film to 1.5 nm, and the relationship between the Hc and the stacking number n was checked. The results are shown in FIG. 34. The relationship was examined for a stacked film in which $Co_{90}Fe_{10}$ films and Cu films were stacked in this order on a glass substrate and a stacked film in which Cu films and $Co_{90}Fe_{10}$ films were stacked in this order on a glass substrate (in this case, the first Cu film is regarded as an undercoating film).

As shown in FIG. 34, when the $Co_{90}Fe_{10}$ film was formed first for a stacking number of 2, the Hc took a slightly high value of 650 A/m. However, when the stacking number was 4 to 8, the Hc presented a low value of 100 to 300 A/m regardless of whether the $Co_{90}Fe_{10}$ film or the Cu film was formed first. The reason for this is assumed that the effect of the Cu undercoating film is weakened as the stacking number increases, and this decreases the Hc regardless of the presence/absence of the Cu undercoating film (the first Cu film). Note that the magnetization curve in this case also had a shape indicating ferromagnetic coupling as in FIG. 33.

It was also found from section transmission electron microscopic observation or measurements of diffraction peak half-widths of X-ray diffraction curves that in this stacked film, the crystal grain size was large, i.e., the crystal grew continuously and epitaxially in the interface between the Cu film and the $Co_{90}Fe_{10}$ film. Therefore, unlike a conventional multilayered film such as Fe/C which achieves soft magnetism by a fine crystal effect using a crystal growth preventing effect in the interface between a nonmagnetic film and a ferromagnetic film, the stacked film of this example has no excessive increase in resistance and hence can be applied to a magnetoresistance effect film using spin-dependent scattering. Furthermore, the Cu-CoFe interface need not be flat.

EXAMPLE 22

Figure 36:
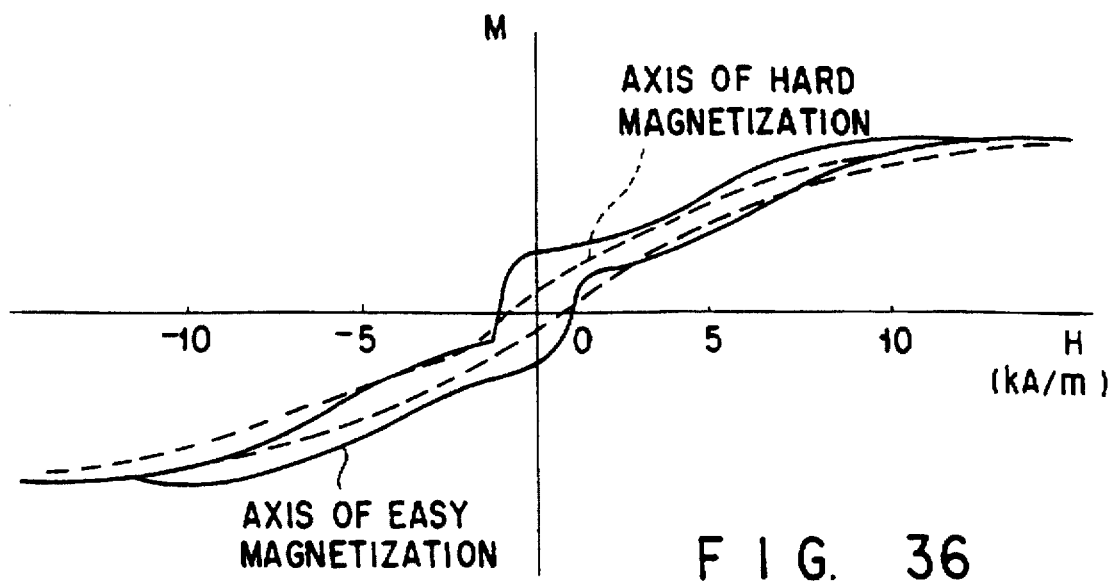

It is known that in a $(Co_{90}Fe_{10}/Cu)_n$ film, the magnetizations of ferromagnetic films adjacent to a Cu film are coupled antiferromagnetically or ferromagnetically in accordance with the film thickness of the Cu film. FIG. 35 shows the relationship between the Hs (saturation magnetic field) in the axis of hard magnetization and the film thickness of a unit Cu film in $(Co_{90}Fe_{10} (1\ nm)/Cu)_{16}$. When the film thickness of the Cu film was set near 1 nm or 2 nm, a large Hs (12 to 240 kA/m) caused by the antiferromagnetic coupling between neighboring ferromagnetic films resulted. In this case, the stacked film also presented a magnetization curve indicating antiferromagnetic coupling in which residual magnetization decreased largely as shown in FIG. 36 even in the axis of easy magnetization. With other film thicknesses, on the other hand, the stacked film exhibited an Hs (1,000 to 2,000 A/m) corresponding to induced magnetic anisotropy of $Co_{90}Fe_{10}$ like in the magnetization curves shown in FIG. 33. In addition, the residual magnetization of the magnetization curve in the axis of easy magnetization was 90% or more, demonstrating characteristics with antiferromagnetic coupling.

It is clear from FIG. 35 that ferromagnetic coupling can be obtained by setting the film thickness at an intermediate value of about 1.5 nm. Since ferromagnetic coupling has a low Hs, it is possible to increase the permeability in the axis of hard magnetization which is important in applying the structure to a magnetic sensor, such as a magnetic head. In this example, therefore, the film thickness of the Cu film is preferably an intermediate value by which no antiferromagnetic coupling is caused, unlike in the case of a conventional artificial lattice film which exhibits an enormous magnetoresistance effect.

EXAMPLE 23

Following the same procedures as in Example 19, a ferromagnetic stacked film unit 51 was formed on a substrate 50. This ferromagnetic stacked film unit 51 is a stacked film of a Cu film as a nonmagnetic film and a $Co_{90}Fe_{10}$ film as a ferromagnetic film shown in Examples 21 and 22. Subsequently, a nonmagnetic film 52 with a thickness different from that of the nonmagnetic film of the ferromagnetic stacked film unit 51 was formed on the ferromagnetic stacked film unit, and another ferromagnetic stacked film unit 51 was formed on the nonmagnetic film 52. An antiferromagnetic film 53 consisting of, e.g., FeMn, NiO, or NiCoO was formed on the resultant structure, and a protective film 54 was formed on the antiferromagnetic film 53. This protective film 54 is formed as needed. Lastly, electrode terminals 55 were formed on the protective film 54 to supply a current to edge portions, thereby completing a magnetoresistance effect element shown in FIG. 37.

Figure 38:
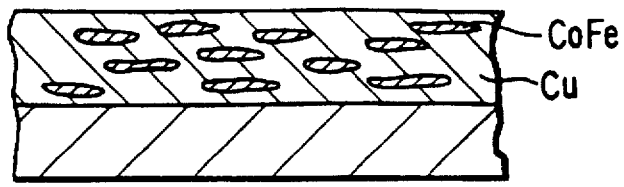

In this structure, an exchange bias can be applied to the ferromagnetic stacked film unit 51 in direct contact with the antiferromagnetic film 53 by performing formation of the ferromagnetic stacked film unit 51 and the antiferromagnetic film 53 in a unidirectional magnetic field. Note that a CoFe single-layered film with soft magnetism slightly lower than that of the ferromagnetic stacked film unit 51 is also usable instead of the ferromagnetic stacked film unit 51, since the magnetization of the ferromagnetic film of the ferromagnetic stacked film unit 51 which is exchange-coupled to the antiferromagnetic film 53 is locked. Note also that the interface of the ferromagnetically-coupled CoFe/Cu need not be flat; that is, an identical effect can be achieved even if the interface is disturbed significantly as shown in FIG. 38.

Figure 39:
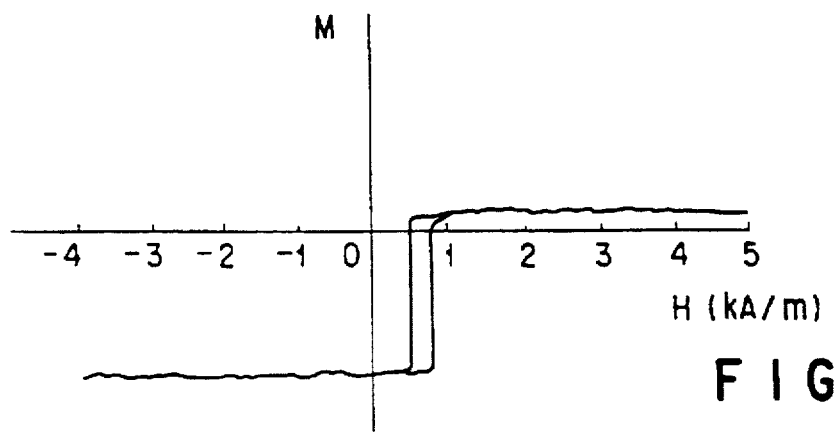
FIG. 39 is a graph showing the magnetization curves of the magnetoresistance effect element shown in FIG. 37.
Figure 40:
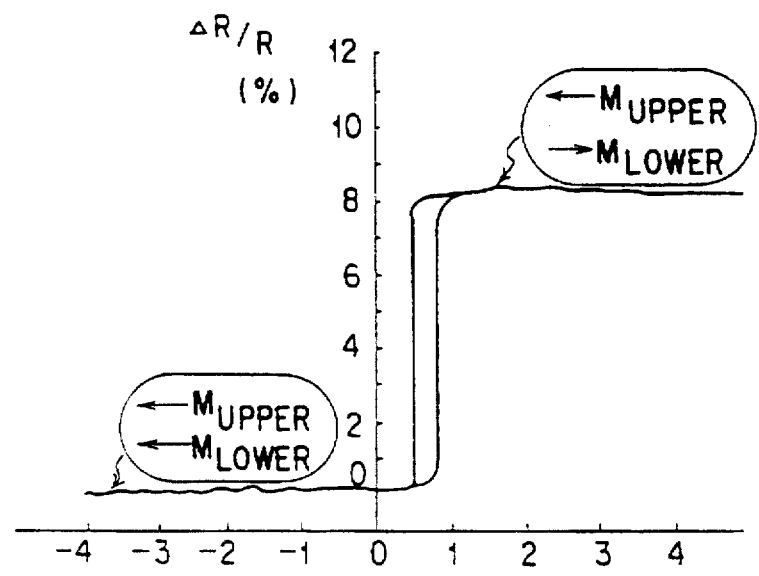
FIG. 40 is a graph showing the resistance change characteristics of the magnetoresistance effect element shown in FIG. 37.

FIGS. 39 and 40 show the magnetization curves and the resistance change characteristics (in the direction of the axis of easy magnetization), respectively, of a magnetoresistance effect element manufactured by forming a (1 nm $Co_{90}Fe_{10}$/ 1.2 nm Cu)$_4$ film as the ferromagnetic stacked film unit 51 a 2.5-nm thick Cu film as the nonmagnetic film 52, a 10-nm thick Fern film as the antiferromagnetic film 53, and a 6-nm thick Cu film as the protective film 54. The resistance was measured by use of a four-terminal method.

As is apparent from FIGS. 39 and 40, magnetizations between the two ferromagnetic stacked film units 51 were coupled antiferromagnetically for H>800 A/m, and coupled ferromagnetically for H<500 A/m. That is, the magnetizations changed from the ferromagnetic coupled state to the antiferromagnetic coupled state for H=500 to 800 A/m. The resistance changed largely with this slight magnetic field of H=500 to 800 A/m, i.e., with this slight hysteresis, and the resistance change rate ΔR/R at this time was 8%.

Figure 37:
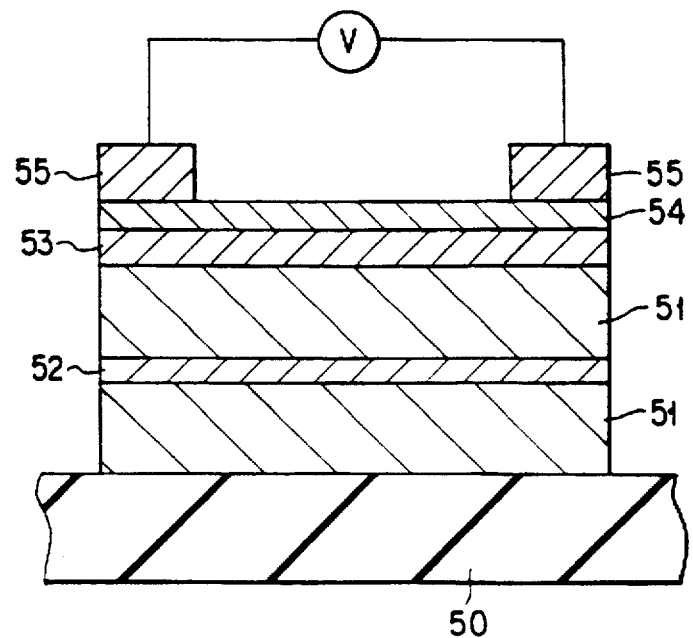

For comparison, FIGS. 41 and 42 show the magnetic curves and the resistance change characteristics, respectively, of a magnetoresistance effect element with a spin valve structure shown in FIG. 37 which consisted of $Co_{90}Fe_{10}$ single-layered films (in which each ferromagnetic stacked film unit 51 was replaced with a $Co_{90}Fe_{10}$ single-layered film).

As shown in FIGS. 41 and 42, the hysteresis of the magnetic curves was large compared to the resistance change shown in FIG. 40, and as a result a large hysteresis also existed in the resistance change characteristics. The ΔR/R was about 6.5%, which was smaller than the resistance change shown in FIG. 39.

From the above description, it is obvious that the magnetoresistance effect element with the spin valve structure using the ferromagnetic stacked film of the present invention has a good soft magnetism and shows a large resistance change with a slight magnetic field. In addition, the resistance change rate is high because the $Co_{90}Fe_{10}$/Cu interface is present inside the ferromagnetic stacked film unit.

The examples of the $(CoFe/Cu)_n$ stacked film have been described in detail above. This spin valve structure, however, can achieve the same effect even by using a stacked film constituted by a different ferromagnetic film (e.g., NiFe, NiFeCo, or Co) and a different nonmagnetic film (e.g., a Cu-based alloy). Table 4 below shows the resistance change rate in the axis of easy magnetization and the Hc of the spin valve structure shown in FIG. 37 when the ferromagnetic stacked film unit 51 was replaced with several different ferromagnetically coupled multilayered films.

TABLE 4

| Feeromagnetic stacked film unit | Hc (A/m) | Resistance change rate (%) |
|---|---|---|
| $Co_{20}Fe_{15}Ni_{65}$ 1 nm thick/ Cu 0.7 nm thick)4 | 80 | 6.9 |
| $Co_{90}Fe_{10}$ 1 nm thick/ $Cu_{80}Ni_{20}$ 0.7 nm thick)4 | 660 | 7.9 |
| $Co_{80}Fe_{20}$ 1 nm thick/ Cu 0.7 nm thick)4 | 320 | 6.3 |

Table 4 reveals that even when the ferromagnetic multilayered films with combinations other than CoFe/Cu are used, the Hc can be decreased compared to the spin valve film (see Table 1) using the single-layered magnetic film, and a resistance change rate equal to or higher than that of the spin valve film using the single-layered magnetic film can be realized.

EXAMPLE 24

Figure 43A:
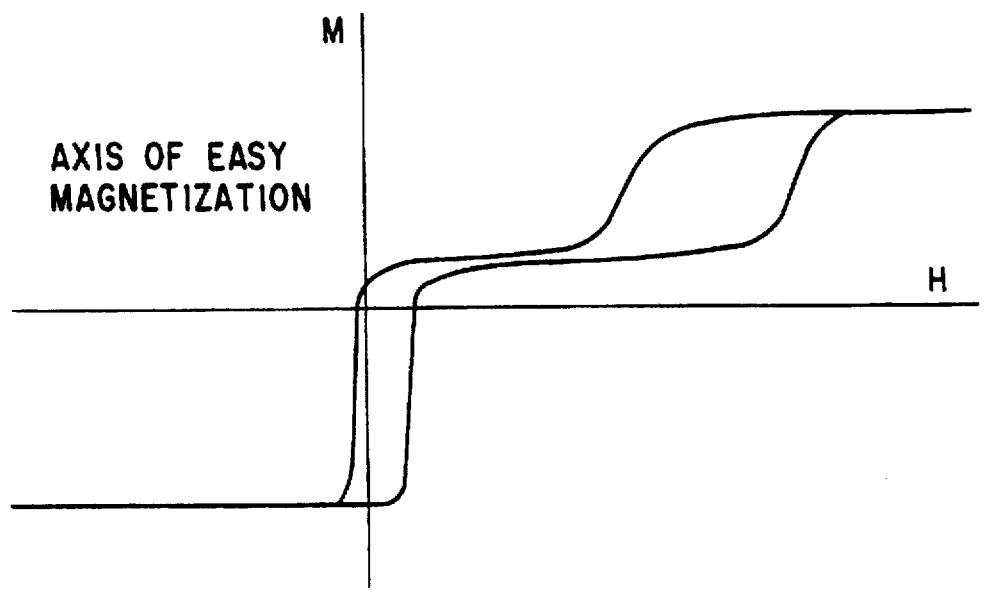
FIGS. 43A and 43B are graphs showing the magnetization curves of a ferromagnetic film having a Cu undercoating film in a magnetoresistance effect element according to the seventh invention of the present invention.
Figure 43B:
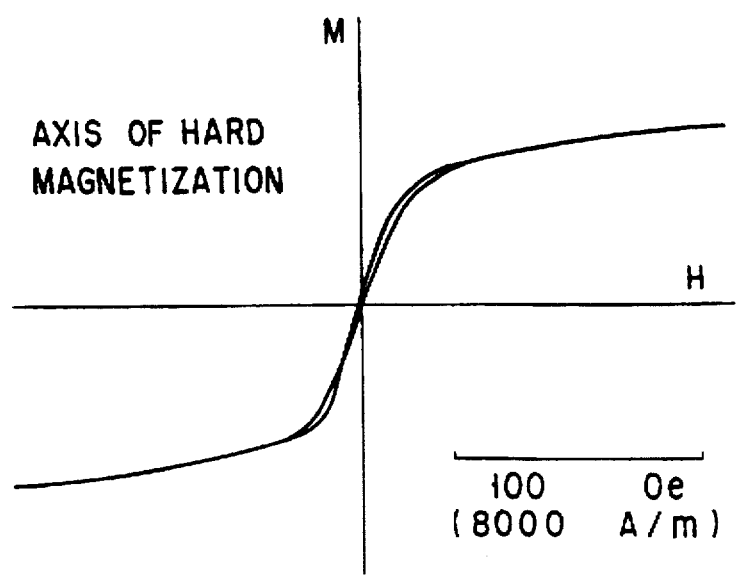
Figure 54:
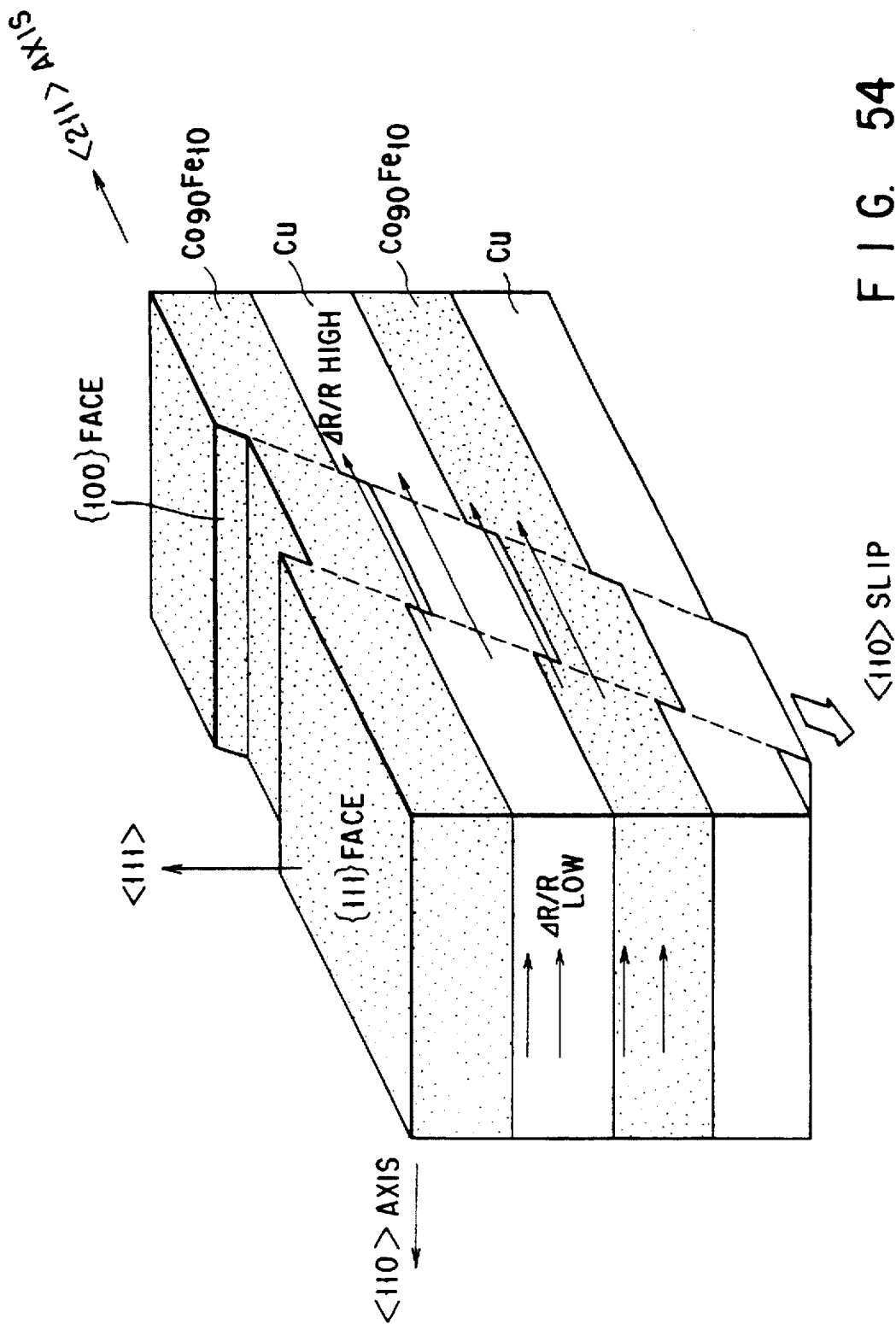
FIG. 54 is a perspective view showing a state in which a stacking defect is introduced to a $Co_{90}Fe_{10}/Cu$ stacked film oriented in the fcc-phase (111) plane.

A magnetoresistance effect element was manufactured by using, in the structure shown in FIG. 37, a 4-nm thick Cu undercoating film and 5-nm thick $Co_{90}Fe_{10}$ as the ferromagnetic stacked film unit 51 in contact with the substrate, and an 8-nm thick $Co_{90}Fe_{10}$ single-layered film as the ferromagnetic stacked film unit 51 in contact with the antiferromagnetic film 53. FIGS. 43A and 43B show the magnetization curves of the resultant magnetoresistance effect element, and FIG. 54 shows the resistance change characteristics of the element.

As shown in FIG. 43A, the Hc exhibited a relatively large value of 800 A/m or less in the axis of easy magnetization, but, as shown in FIG. 43B, presented a low value of 100 A/m or less in the axis of hard magnetization. In addition, as can be seen from FIG. 44, the resistance change rate ΔR/R was 7.2% in the axis of easy magnetization and 2.8% in the axis of hard magnetization. It is assumed that the resistance change rate was low in the axis of hard magnetization because an antiparallel magnetization arrangement was insufficient due to ferromagnetic coupling between the two ferromagnetic films. Therefore, the ΔR/R equivalent to that in the axis of easy magnetization can be obtained by applying a bias magnetic field for promoting the antiparallel magnetization arrangement by using a hard magnetic film or the like. That is, it is possible to obtain both a good soft magnetism and a high ΔR/R even by the use of the stacked film constituted by the Cu undercoating film and the $Co_{90}Fe_{10}$ film.

EXAMPLE 25

The ferromagnetic stacked film units 51 used in Example 23 and nonmagnetic films 52 each having a different thickness from that of the nonmagnetic film contained in the ferromagnetic stacked film unit 51 were stacked alternately at least twice on a substrate 50. In addition, a protective film 54 was formed on the uppermost nonmagnetic film 52. This protective film 54 is formed if necessary. Lastly, electrode terminals 55 for supplying a current to edge portions were formed, thereby manufacturing a magnetoresistance effect element shown in FIG. 45.

Figure 46:
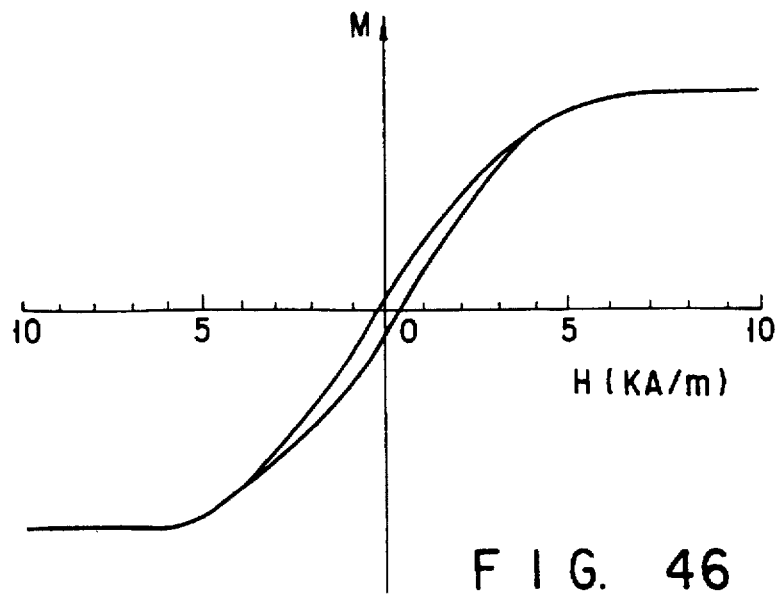
FIG. 46 is a graph showing the magnetization curves of the magnetoresistance effect element shown in FIG. 45.
Figure 47:
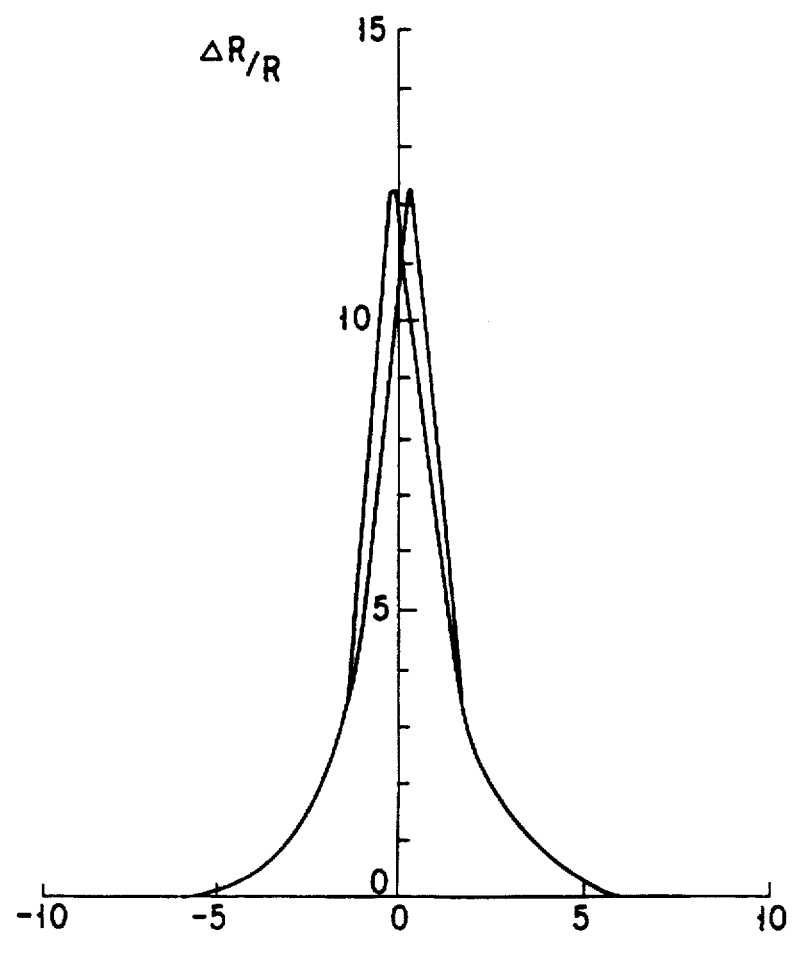
FIG. 47 is a graph showing the resistance change characteristics of the magnetoresistance effect element shown in FIG. 45.

FIGS. 46 and 47 show the magnetization curves in the axis of hard magnetization and the resistance change characteristics of the above magnetoresistance effect element manufactured by stacking (1 nm $Co_{90}Fe_{10}$/0.6 nm Cu)$_4$ films as the ferromagnetic stacked film units 51 and 2.2-nm thick Cu films as the nonmagnetic films 52 eight times (i.e., stacking number n=8).

As shown in FIGS. 46 and 47, the saturation magnetic film Hs showed a relatively small value of 6,000 A/m, and the Hc also had a small value of 240 A/m. At this time, the resistance change rate was 12% or less, a magnetic field by which the resistance change was saturated almost coincided with the saturation magnetic field Hs on the magnetization curves, and a hysteresis almost agreed with the Hc on the magnetization curves. This indicates that a high resistance change rate was obtained by a slight magnetic field.

EXAMPLE 26

A (1 nm $Co_{90}Fe_{10}$/1.1 nm Cu)$_{16}$ stacked film 61 was formed on the (110) plane of an MgO substrate 60 whose surface was processed into a mirror surface. The stacked film 61 was then patterned into stripes of 1×8 mm$^2$ through a metal mask. Subsequently, electrode terminals 62 for supplying a current to edge portions were formed on the stacked film 61, manufacturing a magnetoresistance effect element. Note that a 5.5-nm thick Cu film may be formed as a protective film on the stacked film 61. Note also that $Co_{90}Fe_{10}$ was used as the composition of the CoFe-based alloy film in respects of a high resistance change rate [Japan Applied Magnetics Society Journal, 16, 313 (1992)] and good soft magnetic characteristics.

Figure 48:
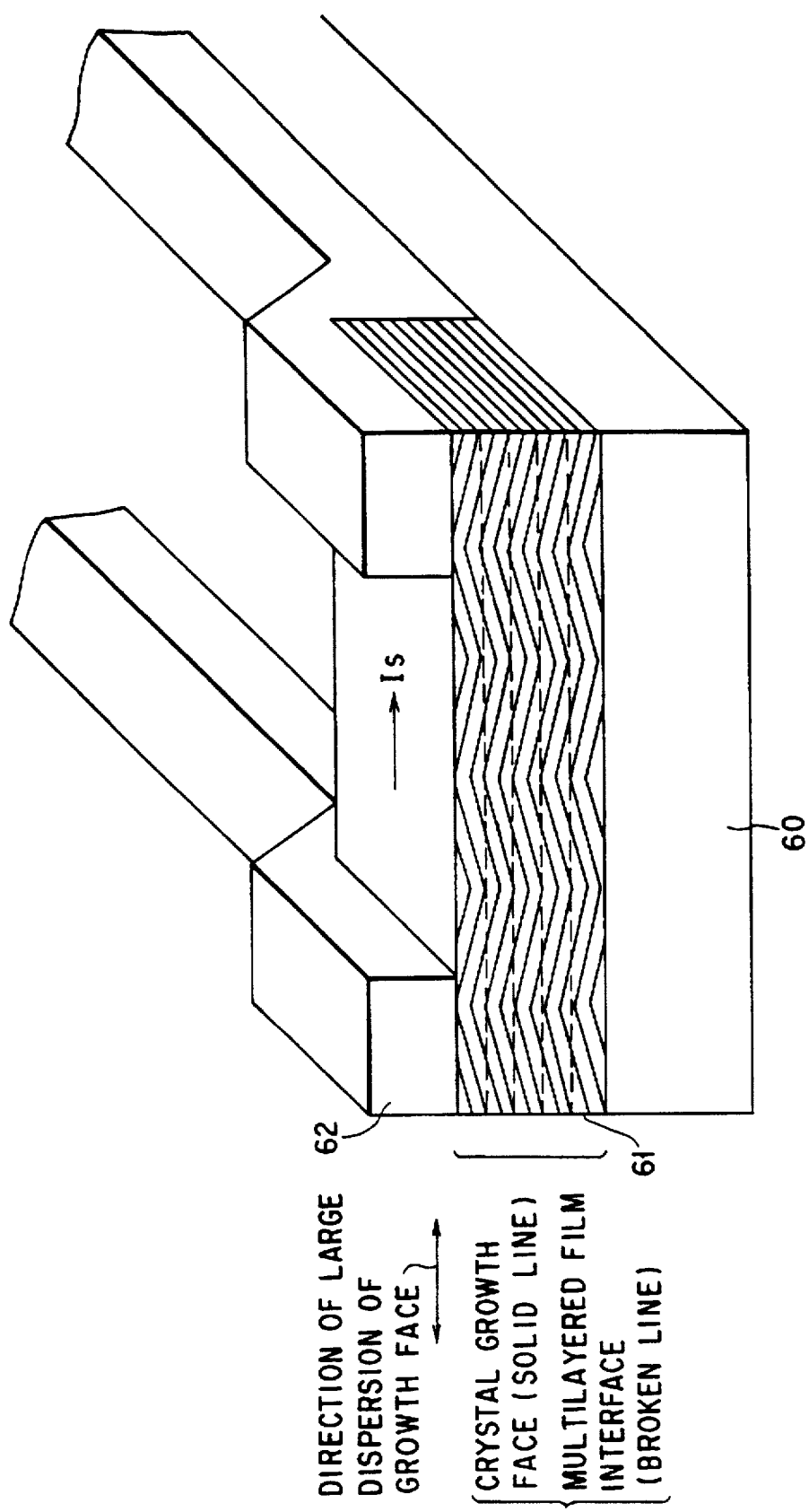
FIG. 48 is a schematic view for explaining fluctuations in a film.

In this structure, the $Co_{90}Fe_{10}$ film was formed first on the (110) plane of the MgO substrate 60, since it is not possible to obtain a large resistance of 10% or more if the Cu film is formed first. Referring to FIG. 48, wavy lines shown in the stacked film 61 indicate the section of a principal growth plane. An MR sense current (Is) is flowed in this direction in which the principal growth plane fluctuates.

As a film formation apparatus for forming the stacked film 61, a multi-element simultaneous sputtering apparatus was used. This sputtering apparatus is so designed as to be able to perform RF sputter for a $Co_{90}Fe_{10}$ target and DC sputter for a Cu target, forming films by passing a substrate applied with a DC bias above the individual targets alternately. A cryopump was used as a main exhaust pump. After a vacuum chamber was evacuated to $5 \times 10^{-7}$ Torr or less, the above film formation apparatus was used to introduce Ar gas into the vacuum chamber, performing sputtering at about 3 mTorr.

The resistance change rate and the crystal structure of the resultant magnetoresistance effect element were examined. As the resistance change rate, a resistance change in the direction of a static magnetic field was measured by a four-terminal method. In this measurement, the current density was set at 2.0 to 2.5 $kA/cm^2$. The crystal structure was evaluated by performing θ-2θ scan and measuring a rocking curve related to a principal diffraction plane by using X-ray diffraction under the following measurement conditions.

X-ray Diffraction Measurement Conditions (1) θ-2θ scan
Cu-Kα, 40 kV, 200 mA
Scan width: 2θ=2° to 100°
Step width: 0.03°
Coefficient time: 0.5 sec (2) Rocking curve
Cu-Kα, 40 kV, 200 mA
Scan width: 2θ=20° to 60°
Step width: 0.04°
Coefficient time: 0.5 sec FIGS. 49A and 49B illustrate the X-ray diffraction curves of the stacked film of the magnetoresistance effect element measured by the θ-2θ scan. As shown in FIG. 49B, a high diffraction peak corresponding to fcc-phase (220) plane reflection was found near 2θ=75°. This X-ray diffraction curve therefore indicates that the principal growth plane of the stacked film was the fcc-phase (220) plane having strain in one direction. Note that a peak near 2θ=4° shown in FIG. 49A corresponds to diffraction caused by a stacking period (about 2.1 nm).

Subsequently, rocking curves were measured for this principal growth plane in the directions of the [100] axis and the [110] axis. The results are shown in FIGS. 50A and 50B. FIG. 51A shows the rocking curve measured along the [110] axis, in which one peak is present near θ=38° FIG. 50B, on the other hand, shows the rocking curve in the direction of the [100] axis, in which two peaks appear near θ=33° and 41°

FIGS. 51A and 51B are views showing a film structure estimated from the rocking curves shown in FIGS. 50A and 50B. Wavy layers illustrated in FIG. 51A indicate the fcc-phase (110) plane of the principle growth plane. Although an average crystal growth plane measured by the θ-2θ scan X-ray diffraction process is (110), this (110) plane shown in FIG. 51A fluctuates in the direction of the [100] axis. On the other hand, a fluctuation along the [110] axis is very small. This result corresponds to the two peaks of the rocking curve (measured in the direction of the [100] axis) shown in FIG. 50B and the single peak of the rocking curve (measured in the direction of the [110] axis) shown in FIG. 50A.

FIG. 51B illustrate the in-plane component distribution of a normal to this growth plane. This in-plane anisotropy is large along the [100] axis and small along the [110] axis because of the large fluctuation in the direction of the [100] axis. As will be described later, the resistance change rate (ΔR/R) when an MR sense current was flowed in the direction of the [110] axis was about 30%, whereas that obtained when the current was flowed along the [100] axis was about 35%.

The magnetic characteristics of this stacked film were measured. FIGS. 52A and 52B show the magnetization curves based on the measurements. FIG. 52A illustrates the magnetization curves when an external magnetic field H was applied parallel to the [100] axis, and FIG. 52B illustrates the magnetization curves when the external magnetic field H was applied parallel to the [110] axis. Note that the magnetic characteristics of the magnetoresistance effect element were measured with a maximum applied magnetic field of 1.2 MA/m by using a vibrating magnetometer (VSM). Note also that a magnetization quantity M of each magnetization curve is represented by a value obtained by normalizing a saturation magnetization As can be seen from FIGS. 52A and 52B, the [100] axis was the axis of easy magnetization, and the [110] axis was the axis of hard magnetization. At this point, the saturation magnetic field of the axis of easy magnetization was about 240 kA/m, and that of the axis of hard magnetization was about 960 kA/m.

As described above, this example provides a magnetoresistance effect element comprising a stacked film formed by sequentially stacking a ferromagnetic film and a nonmagnetic film at least once on a substrate, wherein the direction of a sense current is set along the direction of fluctuation of the crystal orientation plane of the stacked film.

In this example, a normal to the principal crystal orientation plane of the stacked film has a component in the film plane due to the fluctuation of the crystal orientation plane, and this component in the film plane has anisotropy. Alternatively, a normal to a plane defect occurring in the crystalline stacked film has a fluctuation into the film plane, and this fluctuation has anisotropy in the film plane. A direction in which this anisotropy is strong is a direction along which ferromagnetic atoms and nonmagnetic atoms are likely to exist together in the atomic plane of film growth.

By flowing a sense current in this direction, i.e., the direction in which the anisotropy derived from the in-film plane component becomes largest, a probability of electrons causing spin-dependent scattering is raised. Consequently, the magnetoresistance effect element shows a higher resistance change rate.

EXAMPLE 27

Figure 53:
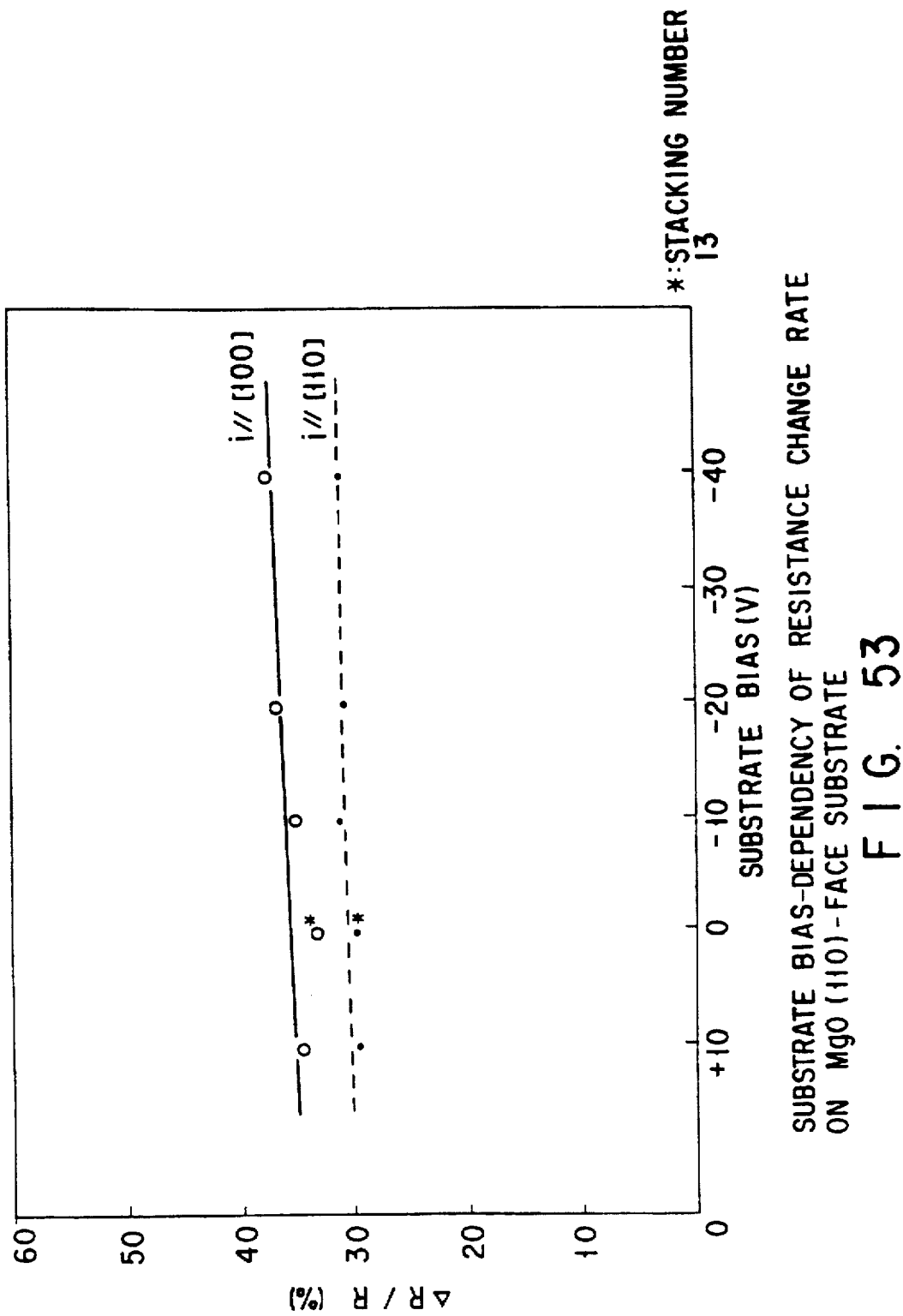
FIG. 53 is a graph showing the bias voltage dependency of the resistance change rate of a $Co_{90}Fe_{10}/Cu$ stacked film on an MgO (110)-plane substrate.

By changing the bias to be applied to a substrate, several different magnetoresistance effect elements each having the same stacked film structure as in Example 26 were manufactured. FIG. 53 shows the bias voltage dependency of the resistance change rate. Note that the measurements were performed by flowing a current parallel to the [100] axis and the [110] axis perpendicular to each other on the (110) plane of the MgO substrate.

As is apparent from FIG. 53, the bias dependency of the resistance change rate was low in either axis, i.e., was about 35% in the [100] axis and about 30% in the [110] axis. That is, the resistance change rate in the [100] axis was higher than that in the [110] axis.

EXAMPLE 28

A magnetoresistance effect element was manufactured following the same procedures as in Example 26 except that a (2 nm Cu/1 nm $Co_{90}Fe_{10}$)$_{16}$ film was used as a stacked film.

When the film thickness of the Cu film was increased to 2 nm as described above, the resistance change rate was approximately 25% when a current was flowed in the direction of the [100] axis, and approximately 19% when the current was flowed in the direction of the [110] axis. This indicates that the direction dependency of the resistance change rate was held even when the film thickness of the Cu film was increased. Also in this case, two peaks were found in the [100] axis as shown in FIG. 50B and one peak was found in the [110] axis as shown in FIG. 50A on the rocking curves of the principal growth plane (the fcc-phase (220) plane).

Even when the film thicknesses of the Cu film and the $Co_{90}Fe_{10}$ film were changed to 0.3 nm to 10 nm, respectively, in the above arrangement, the above tendency of the rocking curve remained unchanged, i.e., the fluctuation was larger in the [100] axis. The resistance change rate was also higher in the [100] axis.

In addition, even when the stacking number was changed from 2 to 70 in the above arrangement, the tendencies of both the rocking curve and the resistance change rate still remained the same; that is, a larger resistance change was obtained when a sense current was flowed in the direction of the [100] axis.

EXAMPLE 29

A magnetoresistance effect element was manufactured following the same procedures as in Example 26 except that a (1 nm Ru/1 nm $Co_{90}Fe_{10}$)$_{16}$ film was used as a stacked film.

The ΔR/R of this magnetoresistance effect element was larger when a sense current was flowed in the direction of the [100] axis than when the sense current was flowed in the direction of the [110] axis. This tendency remained unchanged even when the film thickness of the Ru film was changed.

The above phenomenon was also found when a Co film was used in place of the $Co_{90}Fe_{10}$ film. Even when Ag, Au, Pd, Pt, and Ir were used in place of Ru as the material of the stacked film, it was possible to confirm the difference in the ΔR/R between different axial directions on the (110) plane of the MgO substrate.

EXAMPLE 30

A magnetoresistance effect element was manufactured following the same procedures as in Example 26 except that a (1.1 nm Cu/1.5 nm $Ni_{80}Fe_{20}$)$_{16}$ film was used as a stacked film.

When a sense current was flowed in the direction of the [100] axis of the stacked film of this magnetoresistance effect element, the resulting resistance change rate was 21%. When, on the other hand, the sense current was flowed along the [110] axis, the resistance change rate was 17%. In this stacked film, the crystal growth plane was the fcc-phase (110) plane, as in the $Co_{90}Fe_{10}$/Cu stacked film, and it was confirmed from rocking curve measurement that the growth plane fluctuated in the direction of the [100] axis. Even when the film thicknesses of the $Ni_{80}Fe_{20}$ film and the Cu film were changed from 0.5 nm to 50 nm, the above tendency remained the same.

It was also found that even if Co, a CoFe alloy, an NiFe alloy, Fe, and an FeCr alloy were used as the material of the ferromagnetic film and Cu, Au, Ag, Cr, Ru, and a CuNi alloy were used as the material of the nonmagnetic film, high resistance change rates were obtained provided that the direction of the crystal axis in which the principal growth plane of the stacked film fluctuated was parallel to the direction of the sense current.

EXAMPLE 31

A 1.5-nm thick Co film, a 50-nm thick Ge film, and a 1.5-nm thick Au film were formed on the (110) plane of a GaAs substrate. A (0.9 nm Cu/1 nm $Co_{90}Fe_{10}$)$_{20}$ film shown in FIG. 54 was also formed on the resultant structure by using an MBE process. Referring to FIG. 54, reference numeral 70 denotes the Cu film; and 71, the $Co_{90}Fe_{10}$ film. In addition, a 5-nm thick Ge film was formed as a protective film on the stacked film, thereby manufacturing a magnetoresistance effect element. This stacked film showed fcc-phase (111) plane growth. The resistance change rate was approximately 15% regardless of the direction of a sense current.

Separately, another magnetoresistance effect element was manufactured following the same procedures as described above except that the thickness of the Au undercoating film was changed to 0.8 nm.

The two magnetoresistance effect elements were observed by using a transmission electron microscope. Consequently, the element with the 1.5-nm thick Au undercoating film showed almost no lattice defect and had an excellent crystallinity. On the other hand, in the element with the 0.8-nm thick Au undercoating film, although {111} plane orientation was presented, the {100} plane slipped in the direction of the <110> axis, and the consequent stacking defect was observed. The resistance change rate of this magnetoresistance effect element was measured in the <211> axis and the <110> axis. As a result, the resistance change rate which was about 15% in the <110> direction was increased to 17% in the <211> direction. This indicates that a defect having directivity gives rise to the sense current direction dependency of the resistance change rate.

Figure 55:
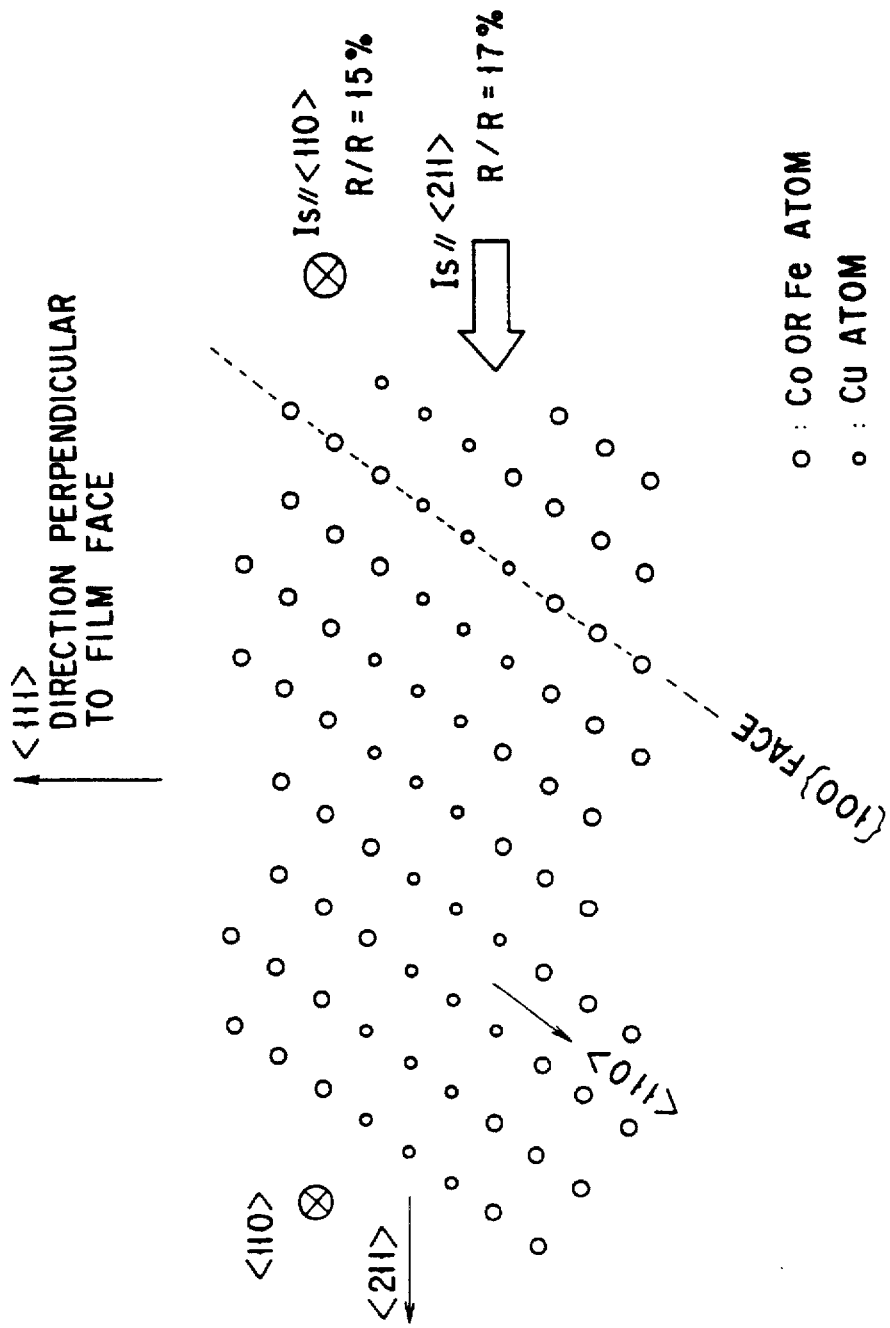
FIG. 55 is a schematic view showing the arrangement of atoms when a stacking defect is introduced to a $Co_{90}Fe_{10}/Cu$ stacked film oriented in the fcc-phase (111) plane.

FIG. 55 shows an atomic arrangement in the stacked film shown in FIG. 54. Referring to FIG. 55, since the {100} atomic plane slips in the <110> direction, the number of interfaces encountered per unit length when a current flows in the <211> direction is different from that when a current flows in the <110> direction; the number is larger in the <211> direction. It was found that this crystal axial direction dependency of the number of spin-dependent scattering sites of conduction electrons produced by such a lattice defect with directivity resulted not only from the stacking defect described above but from a twinned crystal defect. An example of the twinned crystal detect will be described below.

A 3-nm thick Au undercoating film was formed on the (100) plane of a GaAs substrate, and a (1 nm $Co_{90}Fe_{10}$/1.1 nm Cu)$_{16}$ stacked film was formed on it. This stacked film showed fcc-phase (100) plane orientation. At this point, a twinned crystal was produced around the <111> axis. FIG. 56 shows an atomic arrangement when the section of the stacked film was observed in the <110> direction. As shown in FIG. 56, when the twinned crystal was produced around the <111> axis, an interface between Cu atoms and Co or Fe atoms appeared in the <110> direction.

The sense current direction dependency of the resistance change rate of this stacked film was measured along the <110> axis and the <100> axis. FIG. 57 illustrates the twinning plane of the stacked film grown on the {100} plane and the correlation between the current direction and the resistance change rate. As can be seen from FIG. 57, the resistance change rate was 18% when a sense current was flowed in the direction of the <110> axis and 16% when the sense current was flowed along the <100> axis. That is, the resistance change rate was higher along the <110> axis which met the (111) plane with a larger angle. When no twinned crystal was formed, on the other hand, the resistance change rate was found to have no sense current direction dependency.

EXAMPLE 32

A (1.1 nm Cu/1 nm $Co_{90}Fe_{10})_{16}$ artificial lattice film was formed on a glass substrate while applying a DC bias to the substrate. The resistance change rate was measured by changing the magnitude of the bias to be applied to the substrate. FIG. 58 shows the dependency (bias dependency) that the resistance change rate had on the DC bias to be applied to the substrate.

As can be seen from FIG. 58, the resistance change rate increased as the DC bias was raised and presented a peak value of about 28% when the bias was −50 V. When the bias was further increased, the resistance change rate decreased.

The crystallinities of several different artificial lattice films manufactured by changing the DC bias were evaluated. Consequently, the principal growth plane was the fcc-phase (111) plane in all of the artificial lattice films. FIG. 59 illustrates the bias dependency of the long periodic structure reflection peak which resulted from a stacking period (2.1 nm) and appeared near 2θ=4° FIG. 60 illustrates the bias dependency of the peak intensity of the principal growth plane which was reflected by the fcc-phase (111) plane and appeared near 2θ=44°.

As shown in FIG. 59, the long periodic structure reflection intensity had a slight peak when the bias was about −20 V, but it cannot be said that this reflection intensity has a strong correlation with the bias. In addition, as shown in FIG. 60, although the fcc-phase (111) plane reflection intensity also had a slight peak when the bias was around −10 V, it cannot be said that this reflection intensity has a strong correlation with the bias.

When the $Co_{90}Fe_{10}$ film was used as the ferromagnetic film, bulk spin-dependent scattering increased, so the interface structure was no longer sensitive compared to that when the Co film was used as the ferromagnetic film. Note that it is reported that the resistance change rate depended largely on the film structure when the Co film was used as the ferromagnetic film.

FIG. 61 shows the bias dependency of a coercive force (Hc). As is apparent from FIG. 61, although good soft magnetic characteristics of 200 A/m or less were obtained when the bias was at most about −50 V, the coercive force began to increase when the bias reached about −60 V. Therefore, optimal conditions for the resistance change rate and the coercive force can be selected by selecting the magnitude of the Dc bias to be applied. Note that it was also possible to select optimal points for the resistance change rate and the coercive force even when an Si substrate, a ceramic substrate, a GaAs substrate, and a Ge substrate were used in place of the glass substrate.

EXAMPLE 33

An example of the present invention for detecting a signal magnetic field by using rotations of magnetizations of two ferromagnetic films having a spin-dependent scattering ability will be described first.

As shown in FIG. 62, an undercoating film 81 for controlling orientation of an antiferromagnetic film, an antiferromagnetic film 82, a ferromagnetic film 83 having a spin-dependent scattering ability, a nonmagnetic film 84, a ferromagnetic film 85, and another antiferromagnetic film 82 were formed in sequence on a substrate 80. Subsequently, electrode terminals 86 were formed on the uppermost antiferromagnetic film 82. A protective film can also be formed on this antiferromagnetic film 82 as needed. When the antiferromagnetic film consists of FeMn, it is desirable that the material of the undercoating film 81 be Cu, a Cu alloy, such as Cuv or CuCr, a metal having a nonmagnetic fcc phase, such as Pd, or a metal having a magnetic layer, such as NiFe or CoFeTa. Use of the magnetic layer makes it possible to obtain a good exchange bias even with a small film thickness (i.e., with a small shunt current. The antiferromagnetic film 82 consisted of, e.g. FeMn, NiO, or PtMn and had a film thickness of 5 to 50 nm. The ferromagnetic films 83 and 85 consisted of e.g. NiFe, Co, CoFe, or NiFeCo and had a film thickness of 0.5 to 20 nm. The nonmagnetic film 84 was made of, e.g., Cu, Au, or Ag and had a film thickness of 0.5 to 10 nm. The antiferromagnetic film 82 need not be formed on the entire surface of the ferromagnetic film 85 but may be formed only on edge portions (in the vicinities of the electrode terminals 86 on both the sides of the ferromagnetic film During the formation of at least the ferromagnetic film 83, a unidirectional static magnetic field is applied in the x direction (sense current direction) shown in FIG. 62. Consequently, an exchange-coupled bias magnetic field is applied to the ferromagnetic film 83 in the direction of the static magnetic field. During the formation of at least the antiferromagnetic film 82, on the other hand, a static magnetic field is applied in a direction (−x direction) different by 180° from the direction of the magnetic field applied during the formation of the ferromagnetic film Consequently, an exchange-coupled bias magnetic field is applied to the ferromagnetic film 85 in a direction different by 180° from the direction of the exchange-coupled bias magnetic field applied to the ferromagnetic film 83. The result is that the directions of magnetizations of the two ferromagnetic films 83 and 85 are antiparallel to each other when the signal magnetic field is 0. Note that the signal magnetic field Hs is applied in the y direction shown in FIG. 62.

The following method is also applicable as the method of applying the bias magnetic fields in the opposite directions to the ferromagnetic films 83 and 85 by the use of the antiferromagnetic film 82. That is, films having different Néel temperatures are used as the two antiferromagnetic films 82, and a static magnetic field heat treatment is performed at a temperature higher than those Néel temperatures. While the temperature is lowered, the direction of the static magnetic field is reversed 180° at an intermediate temperature between the Néel temperatures of the two antiferromagnetic films. As a result, bias magnetic fields in opposite directions can be applied to the ferromagnetic films 83 and 85.

Unlike films with a conventional spin valve structure, this example makes use of the magnetization rotation of the ferromagnetic film applied with the exchange bias from the antiferromagnetic film. Therefore, it is desirable that this exchange bias magnetic field be a magnetic field which is not so strong but by which Barkhausen noise can be suppressed. For example, the strength of the magnetic field is a maximum of 5 kA/m although it depends on the track width of a magnetic head or the like. In films with a current spin valve structure, however, the use of an exchange bias magnetic field generated by an antiferromagnetic film consisting of FeMn is common. In this case, an exchange bias of 10 kA/m or more is produced when this FeMn film and a ferromagnetic film consisting of NiFe or the like are snacked directly. To reduce this exchange bias, there is a method by which a film for adjusting the exchange bias, such as a ferromagnetic film with a low saturation magnetization or a nonmagnetic film, is inserted between the antiferromagnetic film and the ferromagnetic film. Alternatively, as shown in FIG. 63, nonmagnetic films 87 and 88 may be interposed in the ferromagnetic films 83 and 85, respectively. That is, the ferromagnetic films 83 and 55 may be separated into films 83a and 83b, and films 85a and 85b, respectively.

In the method of interposing the nonmagnetic films into the ferromagnetic films, a strong exchange bias is applied to the ferromagnetic films 83a and 85a in contact with the antiferromagnetic films, but a weak exchange bias is applied to the ferromagnetic films 83b and 85b not in contact with the antiferromagnetic films. The magnitude of the exchange bias applied to the ferromagnetic films 83b and 85b not in contact with the antiferromagnetic films can be reduced in accordance with the type of a material or film thickness of the nonmagnetic films 87 and 88.

The angle defined between the magnetizations of the ferromagnetic films 83a and 83b and the angle defined between the magnetizations of the ferromagnetic films 85a and 85b change from a ferromagnetic angle to an antiferromagnetic angle upon magnetization rotation caused by the signal magnetic field. In contrast, the angle defined between the magnetizations of the ferromagnetic films 83b and 85 b in central portions of the films changes from the antiferromagnetic angle to the ferromagnetic angle. Therefore, spin-dependent scattering of the former and that of the latter cancel each other out. It is therefore desirable that the materials of the ferromagnetic films 83a and 85a and the nonmagnetic films 87 and 88 have no spin-dependent scattering ability and high resistances. It is also desirable that the thickness of the ferromagnetic films 83a and 85a in contact with the antiferromagnetic films be smaller than that of the ferromagnetic films 83b and 85b not in contact with the antiferromagnetic films.

With the above arrangement, the magnetization directions of the ferromagnetic films 83 and 85 can be arranged to be antiparallel to each other when the magnetic field is 0. The outcomes are as follows. First, it is possible to realize a state in which the angle defined between the magnetizations of the two ferromagnetic films change from 0° to 180° through the magnetization rotation of these ferromagnetic films, even if the signal magnetic field is applied in the direction of the axis of hard magnetization (the y direction in FIG. 63). Second, since the bias magnetic field is applied to the two ferromagnetic fields, domain walls can be eliminated from the two ferromagnetic films, and this suppresses Barkhausen noise. Third, in a system in which the sense current and the signal magnetic field are perpendicular to each other, it is possible to obtain both a regular magnetoresistance effect that is significant when an NiFe film or the like is used, and a resistance change resulting from spin-dependent scattering, which cancel each other out in a conventional spin valve structure. Therefore, an increase in ΔR/R can be expected.

EXAMPLE 34

In Example 33, the method by which the magnetization directions of two ferromagnetic films are set to be antiparallel to each other by the use of two antiferromagnetic films is explained. It is, however, not necessary to apply a bias magnetic field by using only the antiferromagnetic films, but a leakage magnetic field from a hard magnetic film or a demagnetizing field generated when a film is processed into a fine pattern is also usable. This example will be described next.

Figure 64:
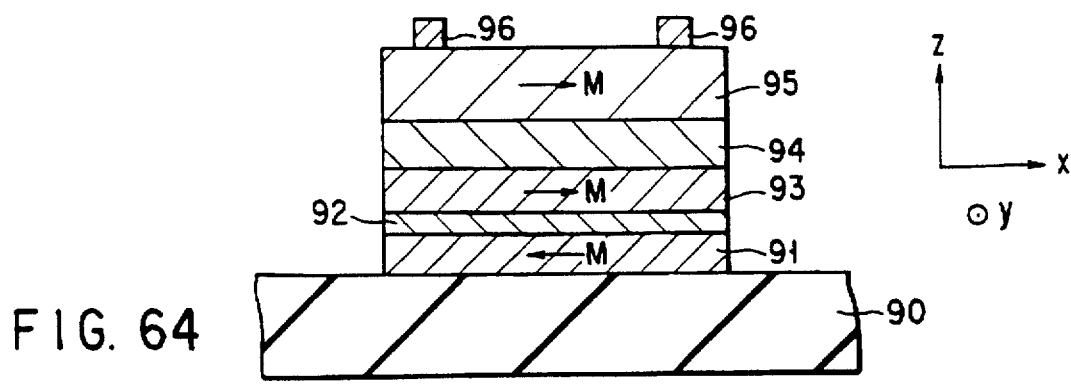

As shown in FIG. 64, a ferromagnetic film 91 having a spin-dependent scattering ability, a nonmagnetic film 92, and a ferromagnetic film 93 were formed on a substrate 90. The film thicknesses of the ferromagnetic films 91 and 9B and the nonmagnetic film 92 were identical with those in Example 33. An antiferromagnetic film 94 with a thickness of 2 to 50 nm was formed on the resultant structure, and an exchange bias was applied to the ferromagnetic film 93. In addition, a hard magnetic film 95 having a thickness of 10 to 50 nm and consisting of CoPt or CoNi was formed on the antiferromagnetic film 94. Electrode terminals 96 were also formed on the hard magnetic film 95. All of these films were formed in a static magnetic field (in the x direction in FIG. 64).

Subsequently, a magnetic field of 400 to 800 kA/m generated by the antiferromagnetic film 94 was applied in the same direction as the direction of the exchange bias magnetic field, magnetizing the hard magnetic film 95 in the x direction. Consequently, a bias magnetic field was applied to the ferromagnetic film 91 in the −x direction due to a leakage magnetic field from the edge portion of the hard magnetic film 9B, so the magnetization directions of the ferromagnetic films 91 and 9B became antiparallel to each other. Although a bias magnetic field from the hard magnetic film 95 is also applied to the ferromagnetic film 93, the above antiparallel magnetization state can be realized by setting the exchange bias force in a way which makes the exchange bias magnetic field from the antiferromagnetic film 94 stronger. Note that the hard magnetic film 95 and the antiferromagnetic film 94 need not be formed on the entire surface of the ferromagnetic film 9B but may be formed on only the edge portions (near the electrode terminals 96 of the ferromagnetic film 93.

A ferromagnetic film with magnetism close to soft magnetism is also usable as the film 95 shown n FIG. 64 in place of the hard magnetic film. In this case, this ferromagnetic film with magnetism close to soft magnetism must be so stacked as to be applied with the exchange bias from the antiferromagnetic film 94. The application of the exchange bias to the ferromagnetic film 95 can lock the magnetization of the ferromagnetic film 95 in one direction. Therefore, even if an external magnetic field such as a signal magnetic field is applied, a stable static coupled magnetic field can be applied to the ferromagnetic film 91 in a direction different by 180° from the direction of the exchange bias magnetic field from the antiferromagnetic film 94, which is applied to the ferromagnetic film 93 when the film is processed into a fine pattern that is essential to a magnetoresistance effect. At this point, a bias magnetic field with a desired intensity can be applied to the ferromagnetic film 91 by adjusting the film thickness or saturation magnetization of the ferromagnetic film 95.

It is also possible to apply a desired shunt current operating point bias by controlling the resistivity or film thickness of the ferromagnetic film 95. In this case, it is difficult for the ferromagnetic film 95 to have both of characteristics required to be exchange-coupled with the antiferromagnetic film 94 (that is, to realize epitaxial growth with the antiferromagnetic film 94, it is desirable to use a crystalline ferromagnetic film, such as an NiFe film, a CoFe film, a CoFeTa film, or a CoFePd film, which has a crystal structure and a lattice constant similar to those of the antiferromagnetic film 94), and characteristics required for a static coupled bias or an operating point bias (that is, the resistivity of the above crystalline film is too low). It is therefore preferable that the ferromagnetic film 95 have a two-layered structure in which a magnetic film (e.g., NiFe- or CoFe-based ferromagnetic film) for exchange coupling, which is in contact with the antiferromagnetic film 94, and a biasing ferromagnetic film (e.g., a Co-based amorphous film, a nitride fine crystal film such as an FeTaN film, or a carbide fine crystal film such as an FeZrC film), are exchange-coupled ferromagnetically in the interface between them.

In the structure shown in FIG. 64, since a sense current from the electrode terminals 96 is shunted to the hard magnetic film 95, a certain degree of decrease in ΔR/R is unavoidable. This problem can be solved by structures shown in FIGS. 65 to 67.

Figure 65:
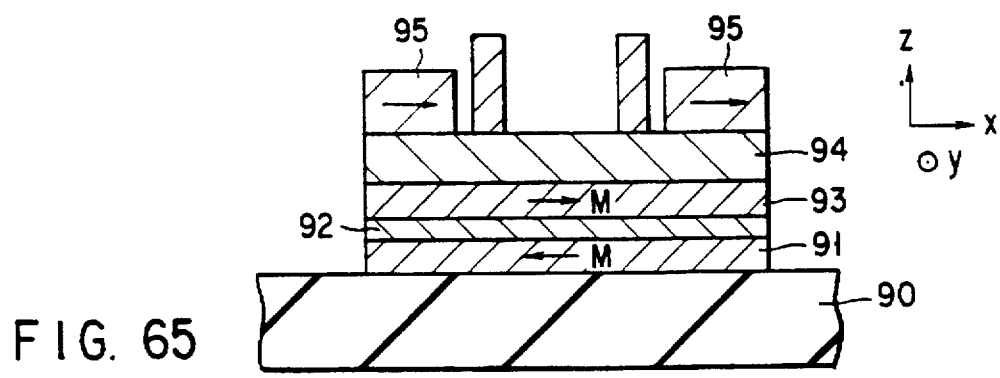

That is, as shown in FIG. 65, films up to an antiferromagnetic film 94 are formed on a substrate 90 as in the structure shown in FIG. 64, and hard magnetic films 95 are then formed near the two sides of the antiferromagnetic film 94. Electrode terminals 96 are formed inside the hard magnetic films 95 with a spacing corresponding to the track width. This consequently makes it possible to prevent a sense current from flowing into the hard magnetic film 95, preventing the reduction in ΔR/R.

Figure 66:
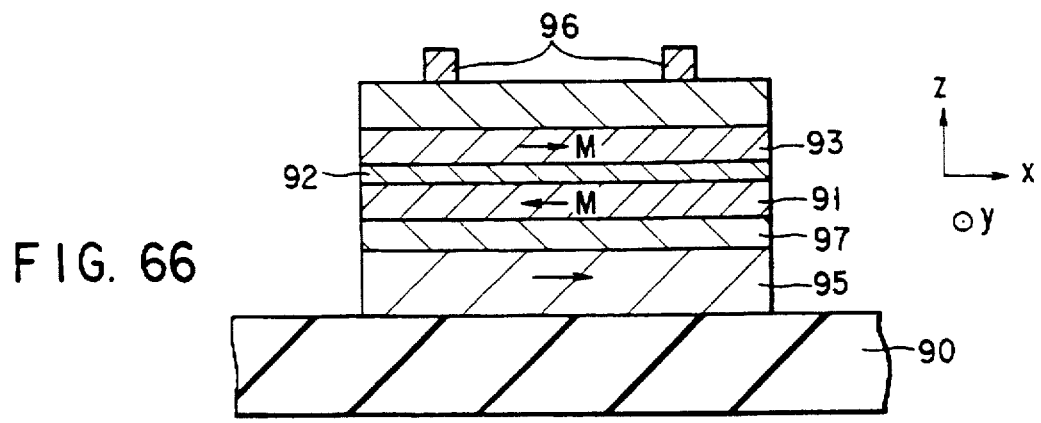

As shown in FIG. 66, on the other hand, a hard magnetic film 95 is formed first on a substrate 90, and then a ferromagnetic film 91, a nonmagnetic film 92, a ferromagnetic film 93, and an antiferromagnetic film 94 are formed in sequence on the hard magnetic film 95 via an insulating film 97. Electrode terminals 96 are also formed on the resultant structure. A static magnetic field is applied during the film formation, thereby applying a predetermined exchange bias magnetic field from the antiferromagnetic film 94 to the ferromagnetic film 93. After the film formation, the hard magnetic film 95 is magnetized in the same direction as the direction of this exchange bias. This method can apply the bias magnetic fields in opposite directions to the ferromagnetic films 91 and 93 and can also prevent a current from flowing into the hard magnetic film 95. Note that the insulating film 97 has an effect of preventing application of an excessive bias magnetic field resulting from exchange coupling between the hard magnetic film 95 and the ferromagnetic film 91.

Figure 67:
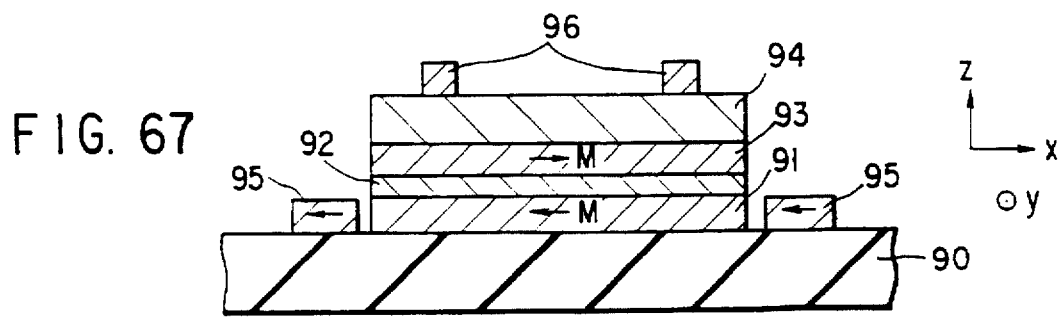

In addition, as shown in FIG. 67, a ferromagnetic film 91, a nonmagnetic film 92, a ferromagnetic film 93, and an antiferromagnetic film 94 are formed in sequence on a substrate 90. Subsequently, the resultant stacked film is formed into a predetermined fine pattern. This fine patterning is performed by ion milling upon forming a mask by using a resist or the like. Thereafter, the remaining mask is used to form hard magnetic films 95 on the sides of the ferromagnetic film 91 by use of a lift-off process. Lastly, the hard magnetic films 95 are magnetized in the opposite direction of the direction of an exchange bias applied to the ferromagnetic film 93. This method can also prevent a current from flowing into the hard magnetic films 95 as well as applying the bias magnetic fields in opposite directions to the ferromagnetic films 91 and 93.

EXAMPLE 35

In the spin valve structure shown in FIG. 63, a 5-nm thick Cu undercoating film containing 1 at % of Cr, a 15-nm thick FeMn film as an antiferromagnetic film 82, a 1-nm thick $Ni_{80}Fe_{20}$ film as a ferromagnetic film 83a, a 1.5-nm thick Cu film containing 1 at % of Cr as a nonmagnetic film 87, a 6-nm thick $Ni_{80}Fe_{20}$ film as a ferromagnetic film 83b, a 2.5-nm thick Cu film as a nonmagnetic film 84, a 6-nm thick $Ni_{80}Fe_{20}$ film as a ferromagnetic film 85b, a 1.5-nm thick Cu film containing 1 at % of Cr as a nonmagnetic film 87, a 1-nm thick $Ni_{80}Fe_{20}$ film as a ferromagnetic film 85a, and a 15-nm thick FeMn film as an antiferromagnetic film 82 were formed in sequence on a glass substrate 80.

The formation of all these films was performed in a static magnetic field of a permanent magnet by using a double-pole sputtering process without breaking a vacuum. Note that this permanent magnet was not connected integrally with a substrate holder. The film formation was performed at a preexhaust pressure of $1 \times 10^{-4}$ Pa or less and an Ar gas pressure of 0.4 Pa. When the formation of the ferromagnetic film 83 was finished, the substrate holder was rotated 180° to reverse the direction of the bias magnetic field (approximately 4,000 A/m) of the permanent magnet 180° In this manner, a stacked film with a spin valve structure capable of realizing an antiparallel state of the magnetizations of the two ferromagnetic films when the signal magnetic field was 0 was manufactured.

The resistance of the resultant stacked film was measured by a four-terminal process. More specifically, a constant current of 1 mA was supplied to the ferromagnetic films 83 and 85 in the direction of the axis of easy magnetization, and a voltage across 4 mm was measured by setting the film width in the direction of the axis of hard magnetization at 1 mm. The magnetic field was applied to the ferromagnetic films 83 and 85 along the axis of hard magnetization by using a Helmholtz coil. FIG. 68 shows the consequent resistance-magnetic field characteristics.

Referring to FIG. 68, the resistance is plotted by normalizing a value obtained by a maximum magnetic field (16 kA/m) to 1. When the magnetic field is 0, the resistance shows its maximum value since the magnetization directions of the ferromagnetic films 83 and 85 are antiparallel to each other. When a magnetic field is applied, the resistance decreases abruptly. Especially when the magnetic field is 2,000 A/m or more, the resistance shows a substantially constant value. This demonstrates that a resistance change rate of about 3.8% or less takes place within the range of a slight magnetic field of 2,000 A/m or less. In addition, almost no hysteresis and almost no noise are found in the resistance-magnetic field characteristics. That is, the use of this spin valve type stacked film makes it possible to obtain a magnetic head which has a significantly high sensitivity and causes little noise.

Separately, the spin valve type magnetoresistance effect element shown in FIG. 62 was manufactured, and the relationship between the thickness and the resistance change rate of the nonmagnetic film 84 (Cu) was checked. The result is shown in Table 5 below. A 5-nm thick NiFe film was used as the undercoating film, 8-nm thick NiFe films were used as the ferromagnetic films 83 and 85, and a 10-nm thick FeMn film was used as the antiferromagnetic film 82.

TABLE 5

| Thickness (nm) of interlayer (Cu) | Resistance change rate (%) |
|---|---|
| 1.2 | 9.1 |
| 1.6 | 5.7 |
| 2.2 | 3.9 |
| 3.3 | 3.0 |

As can be seen from Table 5, the resistance change rate increased abruptly as the Cu thickness decreased, and, when the Cu thickness was 1.2 nm, a high resistance change rate of 9% could be obtained. This is so because relatively large antiparallel bias magnetic fields of 50 kA/m were applied to the ferromagnetic films 83 and 85, and this realized an antiferromagnetic magnetization arrangement even when the thickness of the nonmagnetic film 84 has decreased. When the thickness of the nonmagnetic film (Cu) is decreased to less than 2 nm, the antiparallel magnetization arrangement is broken to decrease the resistance change rate abruptly in conventional spin valve type magnetoresistance elements. In the present invention, however, the resistance change rate can be increased largely by applying the bias magnetic fields in the opposite directions to the ferromagnetic films 83 and 85 and decreasing the thickness of the nonmagnetic film 84.

EXAMPLE 36

A structure in which the number of ferromagnetic films having a spin-dependent scattering ability was increased to three or more will be described.

As shown in FIG. 69, an undercoating film 101 for controlling the orientation of an antiferromagnetic film 102, an antiferromagnetic film 102 consisting of, e.g., FeMn, NiO, or PtNn and having a thickness of 5 to 50 nm, a ferromagnetic film 103 consisting of, e.g., CoFe, Co, or NiFe and having a thickness of 1 to 20 nm, a nonmagnetic film 104 consisting of, e.g., Cu or Au and having a thickness of 1 to 10 nm, a ferromagnetic film 105 with a thickness of 1 to 20 nm, a nonmagnetic film 106 with a thickness of 1 to 10 nm, a ferromagnetic film 107 with a thickness of 1 to 20 nm, and an antiferromagnetic film 108 with a thickness of 5 to 50 nm were formed on a substrate 100. The film thicknesses of the ferromagnetic films 103, 105, and 107 may be the same or different. Electrode terminals 109 were formed on the resultant structure after a protective film was formed if necessary. The film formation was performed in a static magnetic field.

Exchange biases were applied from the antiferromagnetic films 102 and 108 to the ferromagnetic films 103 and 107, respectively, in one direction (the x direction in FIG. 69). As a result, a permeability became high only in the intermediate ferromagnetic film 105 and low in the ferromagnetic films 103 and 107; that is, magnetization locking was realized. This magnetization locking can also be realized by the hard magnetic film 95 as shown in FIG. 65 rather than the antiferromagnetic films. Note that it is possible to realize a high resistance change rate in a low magnetic field by using Co or CoFe which has not so good soft magnetism but a high resistance change rate, as the material of the ferromagnetic films 103 and 107 in contact with the antiferromagnetic films 102 and 108, and NiFe which as not so high resistance change rate but a good soft magnetism, as the material of the intermediate ferromagnetic film 105.

With this arrangement, magnetization rotation of the intermediate ferromagnetic film 105 occurs easily in a low magnetic field. In addition, since the number of interfaces via nonmagnetic layers is increased to be twice that in a conventional spin valve type stacked film, a resistance change rate higher than that of the conventional spin valve type stacked film can be realized in a low magnetic field. Furthermore, since the ferromagnetic film whose magnetization is rotated by a signal magnetic field is present in the middle of this stacked film, the magnetization of the ferromagnetic film is disturbed only slightly by a sense current magnetic field, and this makes stable signal detection possible. Note that by using the bias process using the hard magnetic film or the demagnetizing field as explained in Example 34, the magnetization direction of the ferromagnetic films 103 and 107 and the magnetization direction of the ferromagnetic film 105 can be set to be antiparallel to each other when the signal magnetic field is 0. Consequently, a magnetoresistance effect element which has a higher sensitivity and causes less noise can be obtained by the various effects described in Example 33.

EXAMPLE 37

Figure 70:
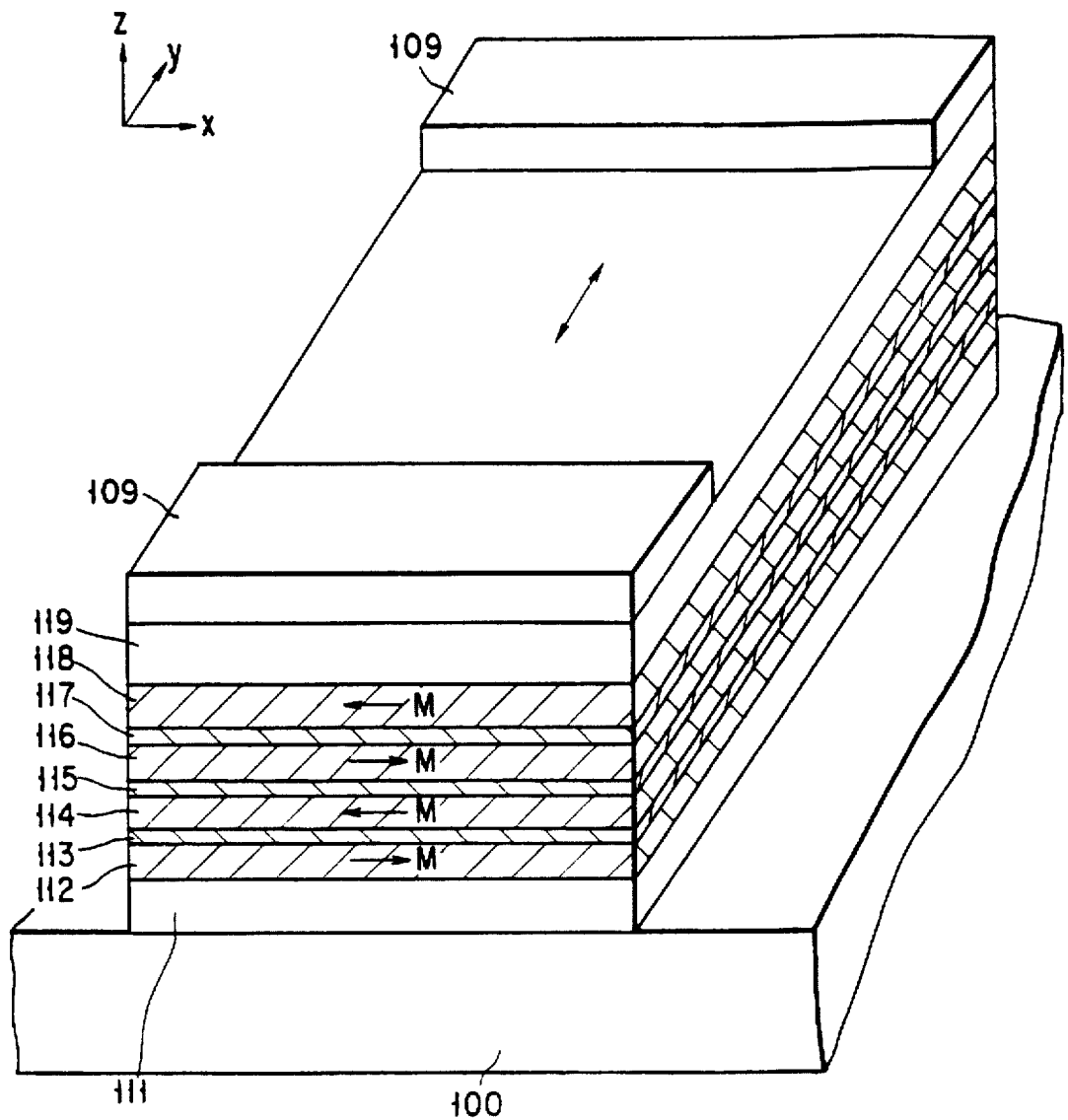

FIG. 70 illustrates a stacked film in which the number of ferromagnetic films with a spin-dependent scattering ability was increased to four.

Referring to FIG. 70, an antiferromagnetic film 111, four ferromagnetic films 112, 114, 116, and 118 stacked via nonmagnetic layers 113, 115, and 117, and another antiferromagnetic film 119 were formed in sequence on a substrate 100, and electrode terminals 109 were formed on the resultant structure such that a sense current flowed in the same direction as that of a signal magnetic field. If necessary, an undercoating film for controlling orientation was formed below the antiferromagnetic film 111, and a protective film was formed on the antiferromagnetic film 119. The materials and film thicknesses of the individual films were identical with those of the structure shown in FIG. 69.

During the formation of at least the ferromagnetic film 112, a static magnetic field was applied in the x direction (the track widthwise direction) in FIG. 70. During the film formation after that film, the direction of the static magnetic field was reversed 180°, and this magnetic field was applied during the formation of at least the antiferromagnetic film 119 in the −x direction shown in FIG. 70. Upon application of the static magnetic field, magnetization locking was caused in the x direction in the ferromagnetic film 112 and in the −x direction in the ferromagnetic film 118 by an exchange bias magnetic field. In this arrangement, a strong demagnetizing field is generated in the track widthwise direction if the track width is narrow, since the width of the ferromagnetic films 112, 114, 116, and 118 is also narrow in that case. This demagnetizing field causes the magnetization directions of the intermediate ferromagnetic films 114 and 116 not in contact with any antiferromagnetic film to be antiparallel to the magnetization directions of the ferromagnetic films 112 and 118, respectively. That is, when the signal magnetic field is 0, the directions of the adjacent magnetizations of these four ferromagnetic films are antiparallel to each other.

If the demagnetizing field to the intermediate ferromagnetic films 114 and 116 is insufficient, it is desirable to supply a sense current in the y direction in FIG. 70 such that a magnetic field generated by the sense current is applied to the ferromagnetic films 112 and 114 in the −x direction and to the ferromagnetic films 116 and 118 in the x direction. In this case, by setting the exchange bias magnetic field from the antiferromagnetic film to be larger than the sense current magnetic field, the magnetization directions of the ferromagnetic films 112 and 118 can be locked in the direction of the exchange bias from the antiferromagnetic film without being disturbed by the current magnetic field.

With the above arrangement, the individual magnetization directions of the four ferromagnetic films can be arranged antiferromagnetically when the signal magnetic field is 0. Therefore, the increases with an increase in the number of interfaces. In addition, since the magnetization of each layer can rotate upon application of a slight signal magnetic field, a magnetoresistance effect element using a highly sensitive spin-dependent scattering can be realized.

EXAMPLE 38

This example explains a structure in which magnetizations of some ferromagnetic films with a spin-dependent scattering ability are locked and magnetizations of the remaining ferromagnetic films are arranged in a direction different from the direction of a signal magnetic field when the signal magnetic field is 0.

Figure 71:
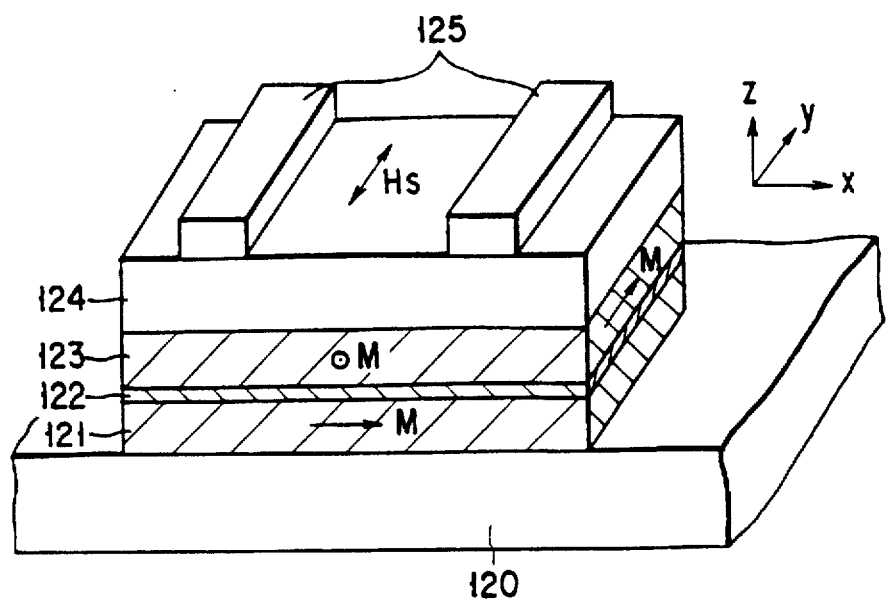
FIG. 71, FIGS. 72A to 72C, and FIG. 73 are perspective views each showing a magnetoresistance effect element according to the tenth invention of the present invention.

FIG. 71 shows a stacked film in which the directions of a sense current and a signal magnetic field are perpendicular to each other. Referring to FIG. 71, a stacked film of ferromagnetic films 121 and 123 which had a spin-dependent scattering ability and between which a nonmagnetic film 122 was interposed, and an antiferromagnetic film 124 were formed in sequence on a substrate 120. The materials and film thicknesses of these films were identical with those of the structure shown in FIG. 62. After a protective film was formed on the antiferromagnetic film 124 as needed, electrode terminals 125 were formed.

During the formation of at least the ferromagnetic film 121, a static magnetic field was applied in the x direction in FIG. 71. During the formation of at least the antiferromagnetic film 124, on the other hand, the static magnetic field was applied in a direction (the y direction in FIG. 71) which was rotated 90° from the first direction. As a result, the axis of easy magnetization of the ferromagnetic film 121 was arranged in the x direction, and the magnetization of the ferromagnetic film 123 was locked in the direction of a signal magnetic field by a bias magnetic field from the antiferromagnetic film 124. With this arrangement, the angle defined between the magnetizations of the two ferromagnetic films is 90° when the magnetic field is 0. When the signal magnetic field is applied in the direction of magnetization locking of the ferromagnetic film 123, the magnetizations of the two ferromagnetic films form a ferromagnetic arrangement, and this decreases the resistance. When the signal magnetic field is applied in a direction different by 180° from the magnetization locking direction, the magnetizations of the two ferromagnetic films are arranged antiferromagnetically, thereby increasing the resistance. This makes it unnecessary the use of an operating point bias which is required in conventional magnetoresistance effect elements. In this method, the dynamic range is small because the magnetization of the ferromagnetic film 121 tends to incline from the x direction to the y direction due to the ferromagnetic coupling between the ferromagnetic films 121 and 123 when the signal magnetic field is 0. That is, a reproduction signal is easily distorted upon application of a large signal magnetic field. This problem can be avoided by determining the flowing direction of a sense current such that a magnetic field generated by the sense current is applied in a direction different by 180° from the direction of this ferromagnetic magnetic field in the ferromagnetic film 121, i.e., the ferromagnetic field and the current magnetic field cancel each other out.

In a case wherein a film having an anisotropic magnetoresistance effect is used as the ferromagnetic film 121 or 123, however, if the magnetization M of the ferromagnetic film 121 is inclined to the direction of the magnetization M of the ferromagnetic film 123 by the ferromagnetic coupled magnetic field, an improvement of sensitivity can be expected since the magnetic anisotropy and the resistance change resulting from spin-dependent scattering are superposed (because the current direction is the x direction). In practice, the magnetization direction of the ferromagnetic film 121 must be adjusted by means of a current direction or the like depending on situations where the magnetoresistance effect element is used.

Figure 72A:
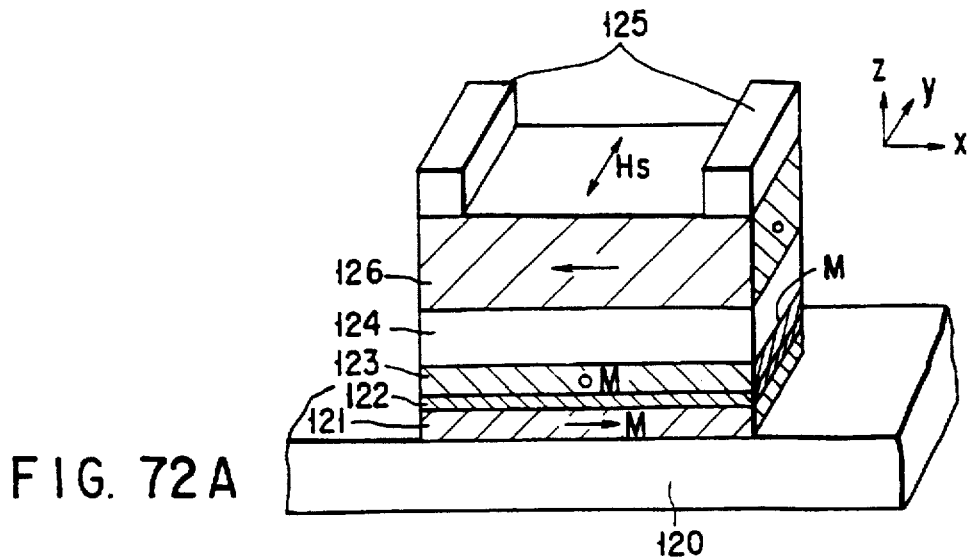

In Example 38, it is necessary to apply longitudinal bias magnetization (a bias magnetic field in the x direction in FIG. 71) required to reduce Barkhausen noise. For this purpose, an antiferromagnetic film as explained in Example 33 is arranged on the substrate side of the ferromagnetic film 121 to obtain exchange coupling between them. Alternatively, as shown in FIG. 72A, a ferromagnetic film 126 with soft magnetism excellent to some extent (in which Hc is smaller than an exchange bias magnetic field $H_{UA}$) is stacked on the ferromagnetic film 124. During the stacking of at least this ferromagnetic film 126, the direction of the bias magnetic field during the film formation is rotated about 90° to apply the exchange bias magnetic field from the antiferromagnetic film 124 in the −x direction in FIG. 72A. In this method, since the film formed as a spin-dependent scattering unit also serves as an undercoating film, an exchange bias can be applied easily to the ferromagnetic film 126 formed on the antiferromagnetic film 124. Consequently, Barkhausen noise can be reduced since the longitudinal bias magnetic field in the +x direction can be applied to the ferromagnetic film 121 by a static coupled magnetic field (a demagnetizing field) generated when the film is processed into a fine pattern suitable for a reproducing head.

Figure 72B:
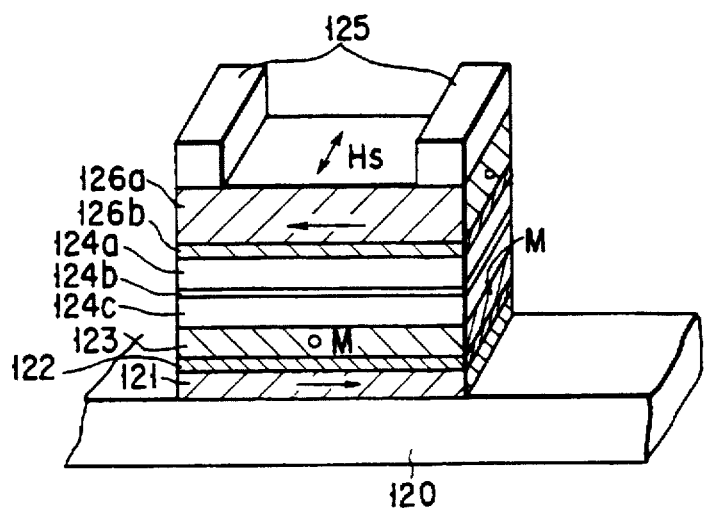

In the structure shown in FIG. 72A, the bias magnetic field direction becomes unstable in some cases because the exchange bias directions are different on the two sides of the antiferromagnetic film 124. This problem can be avoided by, as shown in FIG. 72B, separating the antiferromagnetic film 124 into antiferromagnetic films 124a and 124c by forming a very thin interlayer 124b (an fcc-phase film consisting of, e.g., Cu), which weakens magnetic coupling but does not interfere with crystal growth, in the middle of the antiferromagnetic film 124. The antiferromagnetic films 124a and 124c are preferably made of materials having different Néel points or different blocking temperatures (since the direction of the exchange bias magnetic field can be controlled even by a heat treatment, as explained in Example E1). In addition, no desired longitudinal bias magnetic field can be applied to the ferromagnetic film 121 unless the ferromagnetic film 126 is thick and Bs is high. In this case, the resistivity of the ferromagnetic film 126 is preferably high because a sense current is shunted to the ferromagnetic film. More specifically, the use of a Co- or Fe-based amorphous film or a nitride or carbide fine crystal film is desirable. However, a film of this kind is difficult to be exchange-coupled with the antiferromagnetic film consisting of, e.g., FeMn. It is therefore desirable that a very thin ferromagnetic film 126b, which consists of, e.g., NiFe or CoFeTa and is easy to be exchange-coupled, be stacked on a portion in contact with the antiferromagnetic film 124a, so that a high-resistance, amorphous-like, high-Bs ferromagnetic film 126a is ferromagnetically exchange-coupled to the ferromagnetic film 126b when stacked on it.

EXAMPLE 39

Figure 72C:
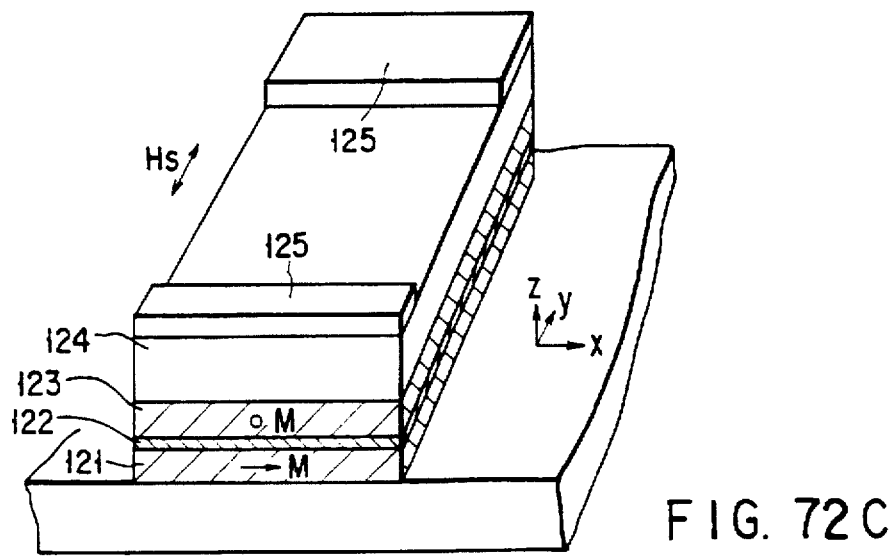

FIG. 72C illustrates a stacked film in which the directions of a sense current and a signal magnetic field are parallel. This arrangement is identical with that shown in FIG. 69 except for the flowing direction of a sense current. Consequently, the longitudinal direction of the film rotates 90° Also in this arrangement, the angle defined between the magnetization directions of two ferromagnetic films is 90° when the magnetic field is 0. When the signal magnetic field is applied in the direction of magnetization locking of a ferromagnetic film 123, the resistance decreases since the magnetizations of the two ferromagnetic films form a ferromagnetic arrangement. When, in contrast, the signal magnetic field is applied in a direction different by 180° from the magnetization locking direction, the resistance increases because the magnetizations of the two ferromagnetic films are arranged antiferromagnetically. Therefore, no operating point bias is necessary. In this arrangement, the direction of a magnetic field generated by a sense current equals the direction of the axis of easy magnetization, and this magnetic field has an effect of suppressing Barkhausen noise.

In Example 39, the magnetization of a ferromagnetic film 121 tends to point in the y direction due to a ferromagnetic coupled magnetic field which is generated easily from the ferromagnetic film 123. As is explained in detail in Example 39, this ferromagnetic coupled magnetic field has an effect of superposing an anisotropic magnetoresistance effect although the dynamic range of the signal magnetic field is narrowed. Note that the axis of easy magnetization of the ferromagnetic film 121 need not exist in the x direction since the current magneto field is applied to the ferromagnetic film 121.

If the Barkhausen noise reducing effect is unsatisfactory, a stronger Barkhausen noise suppressing magnetic field can be applied by offsetting the magnetization locking direction of the ferromagnetic film 123 from the signal magnetic field direction, since a static coupled magnetic field is generated in the x direction in FIG. 72C.

In this case, the Barkhausen noise suppressing effect is slight when θ (the angle between the magnetization direction of the magnetic film 123 and the x direction)>60°, which the operating point bias becomes necessary in order to obtain a linear signal reproduction when θ<30° Therefore, it is preferable that the range of the offset of the magnetic film 123 is from 30° to 60°.

EXAMPLE 40

Figure 73:
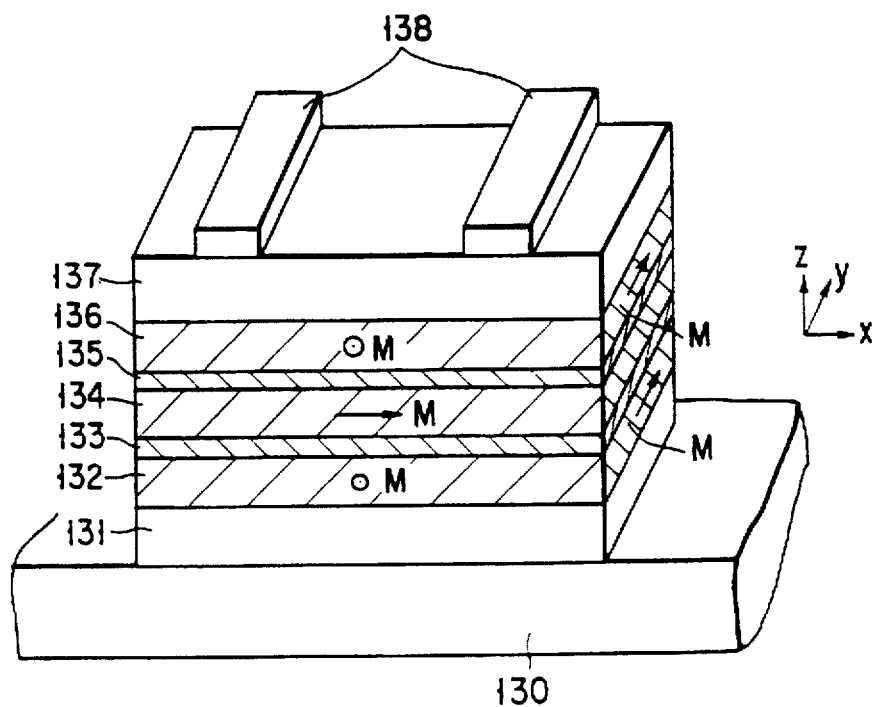

FIG. 73 shows a stacked film in which the number of ferromagnetic films having a spin-dependent scattering ability is three. FIG. 73 illustrates a case in which the directions of a sense current and a signal magnetic field are perpendicular to each other. An antiferromagnetic film 131, a stacked film of ferromagnetic films 132, 134, and 136 which had a spin-dependent scattering ability and between which nonmagnetic films 133 and 135 were interposed, and another antiferromagnetic film 137 were formed in sequence on a substrate 130 in a static magnetic field. Electrode terminals 138 were then formed on the resultant structure.

The direction of the static magnetic field remained the same (the y direction in FIG. 73) during the formation of at least the ferromagnetic film 132 and the antiferromagnetic film 137, and was changed to a direction (the x direction in FIG. 73) perpendicular to the first direction during the formation of the ferromagnetic film 134. As a result, the magnetizations of the ferromagnetic films 132 and 136 were locked in the y direction, whereas the magnetization of the ferromagnetic film 134 pointed in a direction close to the x direction as the axis of easy magnetization when the magnetic field was 0 while maintaining a high permeability. In this arrangement, therefore, the angle defined between the magnetization directions of the two ferromagnetic films is almost 90° when the magnetic field is 0. When the signal magnetic field is applied in the direction of magnetization fixing of the ferromagnetic film 136, the resistance decreases because the magnetizations of the two ferromagnetic films form a ferromagnetic arrangement. In contrast, when the signal magnetic field is applied in a direction different by 180° from the magnetization locking direction, the resistance increases since the magnetizations of the two ferromagnetic films are arranged antiferromagnetically. This makes an operating point bias unnecessary. With this arrangement, the sensitivity also increases because the number of interfaces is doubled.

EXAMPLE 41

The resistance-magnetic field characteristics of a stacked film of a magnetoresistance effect element manufactured according to the method of Example 38 will be described below.

In the structure shown in FIG. 71, a sapphire C-plane substrate was used as the substrate 120, a 6-nm thick $Co_{90}Fe_{10}$ film having a 5-nm thick Pd undercoating film was used as the ferromagnetic film 121, a 3-nm thick Cu film was used as the nonmagnetic film 122, a 4-nm thick $Co_{90}Fe_{10}$ film was used as the ferromagnetic film 123, and a 15-nm thick FeMn film was used as the antiferromagnetic film 124. In addition, a 5-nm thick Pd film was formed as a protective film on the resultant structure.

All the films of this stacked film structure were formed by a double-pole sputtering process while maintaining a vacuum. A static magnetic field generated by a permanent magnet was applied during the film formation. After the formation of the ferromagnetic film 121, the direction of this static magnetic field was rotated 90° to form an angle of 90° between the axes of easy magnetization of the ferromagnetic films 121 and 123. The sputtering preexhaust pressure was $1 \times 10^{-4}$ Pa or less, and the sputtering pressure was 0.4 Pa.

Figure 74:
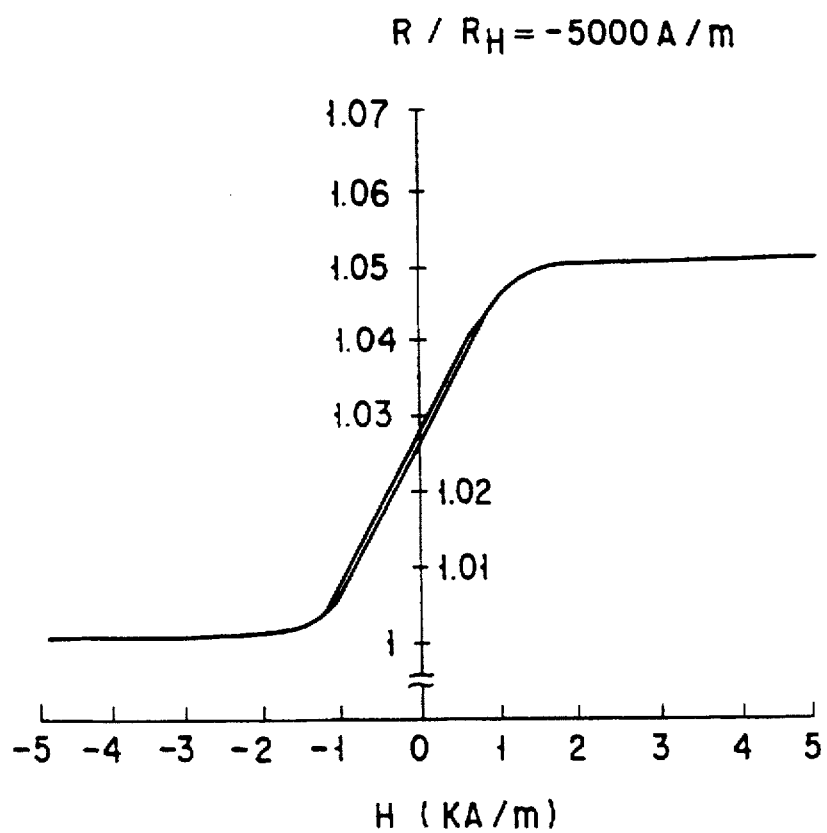
FIG. 74 is a graph showing the resistance change characteristics of a stacked film of the magnetoresistance effect element according to the tenth invention of the present invention.

The resistance-magnetic field characteristics of this stacked film were measured in the same manner as in Example 34. FIG. 74 shows the resultant resistance-magnetic field characteristics of hard axis of hard magnetization. Referring to FIG. 74, the resistance is normalized assuming that a value obtained by a ferromagnetic magnetization arrangement is 1. As shown in FIG. 74, a highly linear change in the resistance with the magnetic field can be obtained when the magnetic field is 0. This demonstrates that no operating point bias is necessary.

EXAMPLE 42

Example 42 shows a magnetoresistance effect element in which ferromagnetic films or bias antiferromagnetic films were stacked on the uppermost ferromagnetic film under and/or lowermost ferromagnetic film of a spin-dependent scattering unit constituted by ferromagnetic film/ nonmagnetic film/ferromagnetic film and resulting bias magnetic fields were generated almost perpendicular to each other.

Figure 75:
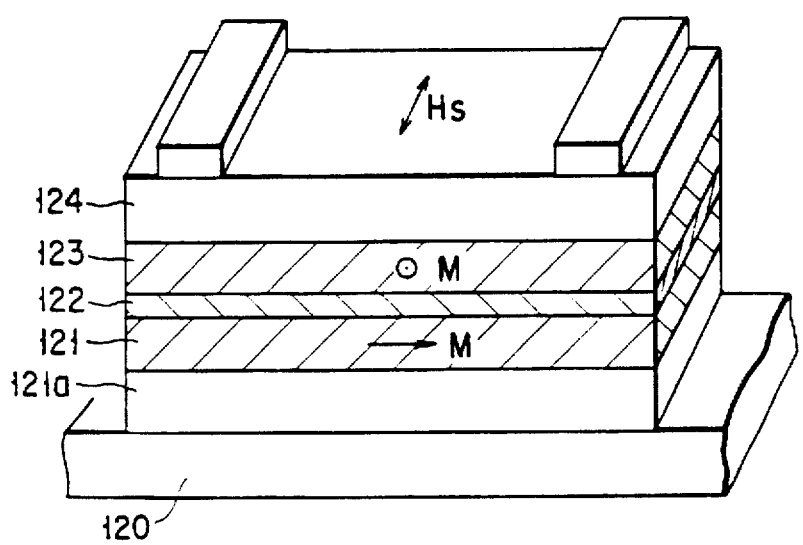
FIG. 75 is a perspective view showing the magnetoresistance effect element according to the 12th invention of the present invention.
Figure 76:
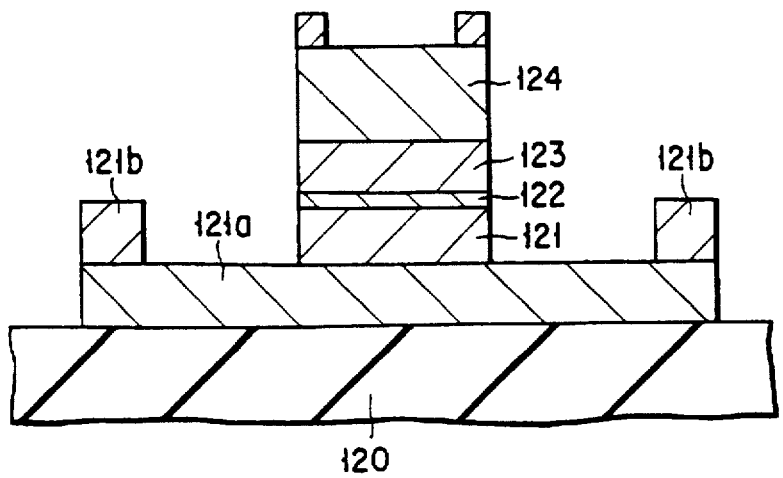
FIG. 76 is a sectional view showing the magnetoresistance effect element according to the 12th invention of the present invention.

FIG. 75 shows a multilayered film formed by stacking a first bias film 121a for applying a bias magnetic field, a spin-dependent scattering unit (constituted by a ferromagnetic film 121, a nonmagnetic film 122, and a ferromagnetic film 123), and a second bias film 124 for applying a bias magnetic field. The first bias film 121a consisted of any of a hard ferromagnetic film made of, e.g., CoPt, a high-Hk ferromagnetic film (e.g., a CoFeRe film with an Hk of 5 kA/m) having a uniaxial magnetic anisotropic magnetic field Hk larger than that of the ferromagnetic film of the spin-dependent scattering unit, and an antiferromagnetic film made of, e.g., NiO. The second bias film 124 consisted of an antiferromagnetic film made of, e.g., FeMn. A bias magnetic field generated by the first bias film 121a of this multilayered film is applied mainly to the ferromagnetic film 121 by exchange coupling running through the interface of the stacked film. A bias magnetic field generated by the second bias film 124, on the other hand, is applied primarily to the ferromagnetic film 123 by the exchange coupling running through the interface of the stacked film. In this case, the first and second bias magnetic fields are so applied as to be nearly perpendicular to each other. In addition, the second bias magnetic field is set to have a strength (desirably 10 kA/m or more) by which the magnetization of the ferromagnetic film 123 is essentially kept locked upon application of a signal magnetic field. On the other hand, the first bias magnetic field is allowed to have a strength by which the magnetization of the ferromagnetic film 121 can be rotated by a signal magnetic field and Barkhausen noise can be suppressed. More specifically, it is desirable that the bias magnetic fields of the bias film 121a and the ferromagnetic film 121 be of 5 kA/m or less when an antiferromagnetic film is used as the first bias film. When a ferromagnetic film is used as the first bias film, the magnetization direction of the ferromagnetic film 121a is held in one direction to have a single domain by some means, thereby integrating the ferromagnetic films 121a and 121 through strong exchange coupling. As a result, the magnetization of the ferromagnetic film 121 can be rotated in substantially the same manner as that of the ferromagnetic film 121a. Since the ferromagnetic film 121a has a single domain, the ferromagnetic film 121 also has a single domain, and this makes removal of Barkhausen noise possible. Alternatively, the exchange coupling between the ferromagnetic films 121a and 121 may be weakened to 5 kA/m or less (by inserting another layer into the interface). In this case, the magnetization of the film 121 and the film 121a rotates independence. The permeability of the ferromagnetic film 121a, is preferable to reduce and make the magnetization difficult to move. As this permeability reducing means, an increase in the Hk, an increase in the coercive force, or application of a unidirectional bias magnetic field to the ferromagnetic film 121a by some means is usable. To impart a single domain to the ferromagnetic film 121a, as shown in FIG. 76, the ferromagnetic film 121a may be elongated to be longer than the spin valve unit to stack additional antiferromagnetic films or hard films 121b on the edge portions of the ferromagnetic film 121a.

When a magnetoresistance effect element with the above arrangement is manufactured, the magnetization direction of the ferromagnetic film 123 is locked, while that of the ferromagnetic film 121 changes in accordance with the signal magnetic field. Therefore, like in the example shown in FIG. 71, a high-sensitivity magnetoresistance effect element having a high linearity when the signal magnetic field is 0 can be provided. Note that since it is also possible to remove domain walls from the magnetic film 121 for detecting a signal magnetic field, no operating point bias is necessary, and this makes high-sensitivity, noise-free signal magnetic field reproduction possible.

It is desirable to set the direction of the axis of easy magnetization of the ferromagnetic film 121 to be perpendicular to the direction of the bias magnetic field especially when a Co-based ferromagnetic film with a large magnetic anisotropy is used as the film 121. This makes it possible to cancel a saturation magnetic field corresponding to the anisotropic magnetic field and the bias magnetic field, thereby largely reducing the Hs. Consequently, the slope of the saturation magnetic field-resistance characteristics shown in FIG. 71 becomes steep to make signal magnetic field detection at a high sensitivity possible compared to a case in which the direction of the bias magnetic field is the same as the direction of the axis of easy magnetization of the ferromagnetic film 121. To change the direction of the bias magnetic field from that of the axis of easy magnetization of the ferromagnetic film, there is a method in which a magnetic field is applied during formation of the ferromagnetic film 121 in a direction different from a direction along which the magnetic field is applied during formation of the bias film 121a.

EXAMPLE 43

Figure 77:
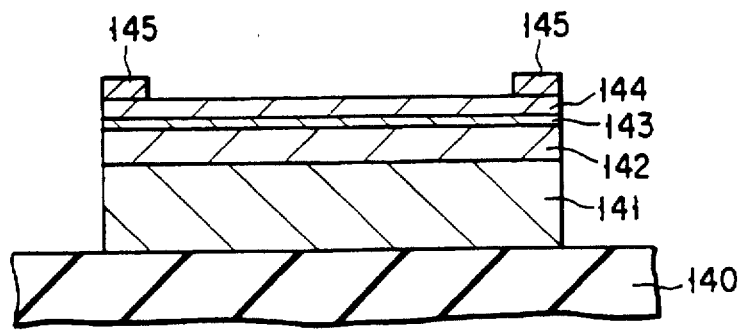
FIGS. 77, 83, and 84 are sectional views each showing a magnetoresistance effect element according to the 13th invention of the present invention.

As shown in FIG. 77, a 20-nm thick Cr undercoating film 141 for controlling the orientation of a high-coercive-force film, an 8-nm thick high-coercive-force film 142 consisting of, e.g., Co, a 3-nm thick interlayer 143 consisting of, e.g., Cu, and a 4.6-nm thick ferromagnetic film 144 consisting of, e.g., NiFe were formed in sequence on a support substrate 140. Electrode terminals 145 were then formed on the resultant structure, thereby manufacturing a magnetoresistance effect element with a spin valve structure. Note that the film formation was performed by ultra-high-vacuum E gun vapor deposition. During the film formation, the substrate temperature was set at approximately 100° C., and a vacuum chamber was evacuated to $1 \times 10^{-8}$ Pa or less.

Figure 78:
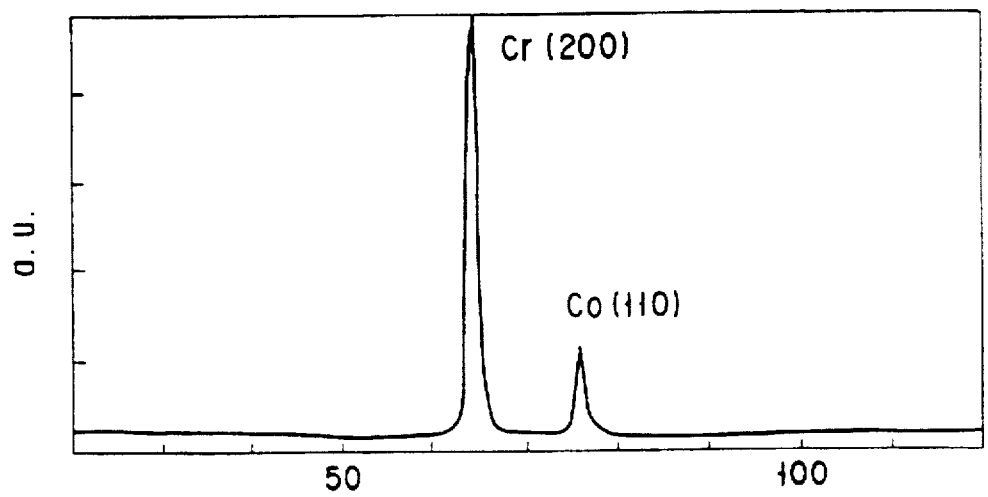
FIG. 78 is a graph showing the X-ray diffraction pattern of a Co/Cr stacked film.

The X-ray diffraction pattern of the Co/Cr film was measured when the substrate temperature was about 100° C. The result is shown in FIG. 78. As is apparent from FIG. 78, the Cr (200) plane had a high orientation in this film, and the (110) plane had a high orientation in the Co film having this Cr film as an undercoating film. The rocking curve half-width of the Co (110) peak was about 3°.

FIG. 79 shows the R-H curve in the direction of the axis of hard magnetization of the stacked film with the structure of NiFe/Cu/Co/Cr/substrate shown in FIG. 77 manufactured at a substrate temperature of about 100° C. This R-H curve was formed on the basis of values measured by a four-terminal method by processing the stacked film into a 2 mm×6 µm pattern through regular resist process and ion milling. During the measurement, the axis of easy magnetization was arranged in the longitudinal direction of the pattern, and a magnetic field was applied in the pattern widthwise direction.

As shown in FIG. 79, when the applied magnetic field was ±80 Oe, the resistance change rate was approximately 6.5%, and the saturation magnetic field was approximately 3.6 kA/m.

Since the Hc of the high-coercive-force film was about 8 kA/m in this structure, no problem arises if a magnetic field from a medium is less than 8 kA/m. However, this stacked film is unsuitable for a structure in which a head and a medium are set close, i.e., a structure in which a magnetic field from a medium is 8 kA/m or more. Therefore, another stacked film with the same structure and film thicknesses as those of the stacked film shown in FIG. 77 was formed at a substrate temperature of about 200° C. in a magnetic field of about 8 kA/m.

The X-ray diffraction pattern of Co/Cr when the substrate temperature was approximately 200° C. was almost the same as that shown in FIG. 78. In addition, this stacked film also had a rocking curve half-width of about 3° at the Co (110) peak. Furthermore, offset of the hexagonal C axis was found in the direction of a magnetic field when the film was measured by using a pole figure. Therefore, single-crystal-like Co was obtained in this stacked film, unlike in the stacked film formed at a substrate temperature of 100° in the absence of a magnetic field.

FIG. 80 shows the R-H curve in the direction of the axis of hard magnetization of the stacked film with the same structure as in FIG. 77 formed at a substrate temperature of about 200° C. in a magnetic field. Similar to the R-H curve shown in FIG. 79, this R-H curve was also formed on the basis of values measured by the four-terminal method by processing the stacked film into a 2 mm×6 μm pattern. During the measurement, the axis of easy magnetization (the direction of the C axis) was set along the longitudinal direction of the pattern, and a magnetic field was applied in the direction of the pattern width.

As shown in FIG. 80, even when an external magnetic field of ±1.6 kA/m was applied, the magnetization of the high-coercive-force film was almost not moved by the applied magnetic field. In addition, the saturation magnetic field of the NiFe film could be held at a low value of approximately 2.8 kA/m, and the resistance change rate was approximately 7.5%.

In the stacked film with the above arrangement, the magnetization of the high-coercive-force film was stable even with an external magnetic field of 1.6 kA/m. Therefore, a pattern was formed in which the axis of easy magnetization of the NiFe film was in the widthwise direction and the C axis of Co was in substantially the longitudinal direction. This arrangement makes an operating point bias unnecessary. In this arrangement, a magnetic field was applied in the longitudinal direction of the pattern to measure a consequent R-H curve. Note that the pattern dimensions were 2 mm×6 μm like in the above structure. The measurement result is shown in FIG. 81. As can be seen from FIG. 81, a good R-H curve free from hysteresis could be obtained, and the Hk showed a low value of about 1.6 kA/m.

Although the Co film was used as the high-coercive-force film in this example, a CoNi film and a CoCr film are also usable. In addition, a W film can also be used as the undercoating film in place of the Cr film, and other elements may be added to these Cr and W films. Note that this undercoating film is applicable to an undercoating film of a so-called hard film throughout the present invention. This allows the C axis to exist in the plane of the hard film (i.e., the C axis is aligned in a particular direction). When magnetization of the hard film is locked, therefore, magnetization of a ferromagnetic film formed on it can be prevented from being locked.

Figure 82:
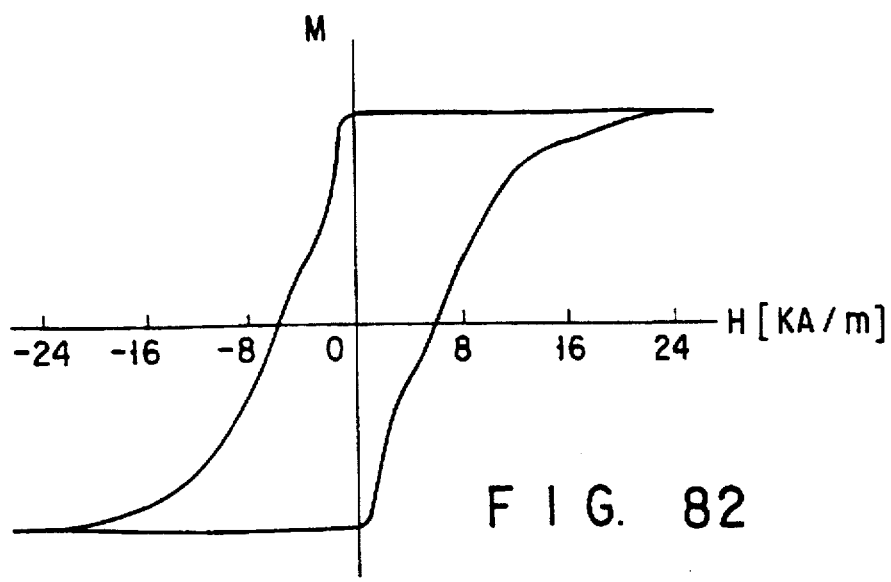
FIG. 82 is a graph showing the R-H curves of a stacked film according to the 13th invention of the present invention when an undercoating film is not formed.

As a reference. FIG. 82 shows the M-H curves of a stacked film having no undercoating film. FIG. 82 reveals that a leakage magnetic field is generated from a vertical component of the magnetization of Co, and this degrades the soft magnetic characteristics of an NiFe film. The reason for this is assumed that the magnetizations of NiFe and Co are partially integrated.

EXAMPLE 44

Figure 83:
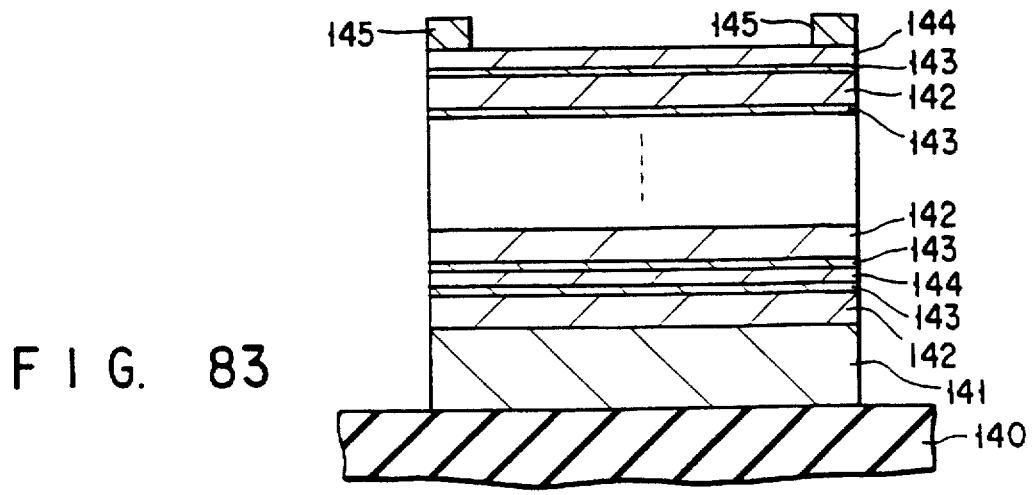

As explained in Example 43, since a high-coercive-force film formed at a substrate temperature of about 200° C. is a single-crystal-like film with a low resistance, the mean free path of electrons can be extended to be much longer than the thickness of the high-coercive-force film. Therefore, as shown in FIG. 83, high-coercive-force films 142 and ferromagnetic films 144 were stacked via Cu interlayers 143. The resistance change rate of this stacked film exhibited a high value of approximately 15%. To manufacture a stacked film with such a structure, it is desirable to form an undercoating film in order to control the orientation of the first high-coercive-force film 142. In this example, a Cr film 141 with a thickness of 20 nm was formed as an undercoating film.

An example in which a high-coercive-force film for orientation control was used as the bias film in Example 34 will be described below.

EXAMPLE 45

Figure 84:
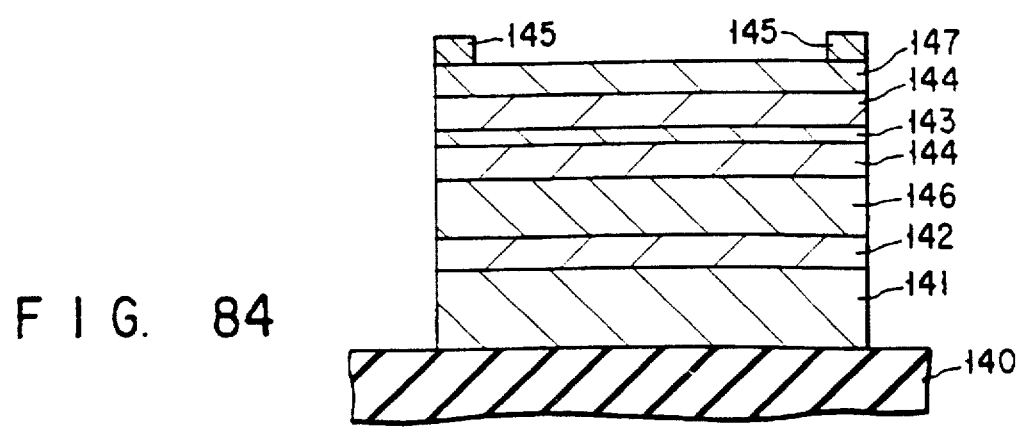

In this example, as shown in FIG. 84, a magnetoresistance effect element with a spin valve structure was formed on an orientation controlling high-coercive-force film 142 via a magnetic insulating layer 146. When the orientation controlling high-coercive-force film 142 is used in this manner, the high-coercive-force film 142 and an NiFe film 144 are statically coupled in a film edge portion, and this makes it possible to lock a domain wall which causes Barkhausen noise at the NiFe film edge portion. In addition, an influence that the high-coercive-force film has on the NiFe film, e.g., a leakage magnetic field inside the film can be avoided by the use of the orientation controlling high-coercive-force film. Consequently, a high-quality element can be manufactured without deteriorating the soft magnetic characteristics of the NiFe film. Note that an antiferromagnetic film or the like is also usable as an exchange bias film of this spin valve structure.

As has been described above, the magnetoresistance effect element of the present invention can achieve a high resistance change rate and excellent soft magnetic characteristics regardless of whether the element comprises a film with a spin valve structure or an artificial lattice film. In addition, the magnetoresistance effect element of the present invention makes an operating point bias unnecessary.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A magnetoresistance effect element comprising:

a substrate;

a spin valve unit comprising a stacked film formed on said substrate, said stacked film including a first ferromagnetic film a direction of magnetization of which is pinned, a second ferromagnetic film the magnetization of which rotates with a signal magnetic field, and a non-magnetic film disposed between said first and second ferromagnetic films, wherein each of said first ferromagnetic film and said second ferromagnetic films, independently, contains a material selected from the group consisting of Co, CoFe, a CoNi alloy, a CoFeNi alloy and a NiFe alloy, and said non-magnetic film contains a material selected from the group consisting of Cu, Al, Pd, Pt, Rh, Ru, Ir, Au, Ag, CuPd, CuAu and CuNi;

a magnetic film having a higher specific resistance than that of said second ferromagnetic film, formed so as to be in direct magnetic contact with a surface of said second ferromagnetic film, opposite to a surface which is in contact with said non-magnetic film; and a pair of leads for supplying a current to said stacked film.

2. A magnetoresistance effect element according to claim 1, wherein the specific resistance of said magnetic film is sufficiently high to suppress the reduction in the rate of change in magnetic resistance caused by a shunt effect.

3. An element according to claim 1, wherein said high-resistance magnetic film contains fine crystals containing at least one of nitrogen and carbon, and comprising at least one of Fe and Co as a main component.

4. An element according to claim 1, wherein said magnetic film contains an alloy made by adding at least one metal selected from the group consisting of Rh, Nb, Zr, Hf, Ta, Re, Ir, Ag, Pd, Pt, Cu, Mo, W, Ti, Cr and Au, to NiFe.

5. An element according to claim 1, wherein said magnetic film is made of an amorphous material.

6. An element according to claim 5, wherein said amorphous material is a material containing Co.

7. An element according to claim 1, wherein said first and second ferromagnetic films are not substantially magnetically coupled.

8. An element according to claim 1, wherein said magnetic film has an fcc phase.

9. An element according to claim 1, wherein said first or second ferromagnetic film contains Co.

10. An element according to claim 1, wherein said high-resistance magnetic film has a thickness of about 0.5 to about 10 nm.

11. An element according to claim 1, wherein said substrate has a surface roughness of about 5 nm or less.

12. An element according to claim 1, wherein the magnetization easy axis of said magnetic film is substantially perpendicular to the magnetization direction of said first ferromagnetic film.

13. A magnetoresistance effect element comprising:

a substrate;

a spin valve unit comprising a stacked film formed on said substrate, said stacked film including a first ferromagnetic film a direction of magnetization of which is pinned, a second ferromagnetic film the magnetization of which rotates with a signal magnetic field, and a non-magnetic film disposed between said first and second ferromagnetic films, wherein each of said first ferromagnetic film and said second ferromagnetic films, independently, contains a material selected from the group consisting of Co, CoFe, a CoNi alloy, a CoFeNi alloy and a NiFe alloy, and said non-magnetic film contains a material selected from the group consisting of Cu, Al, Pd, Pt, Rh, Ru, Ir, Au, Ag, CuPd, CuAu and CuNi;

a magnetic film having a higher specific resistance than that of said second ferromagnetic film, formed so as to be in direct magnetic contact with a surface of said second ferromagnetic film, opposite to a surface which is in contact with said non-magnetic film, wherein said magnetic film has a specific resistance of about 50 $\mu\Omega$.cm or more; and a pair of leads for supplying a current to said stacked film.

14. A magnetoresistance effect element comprising:

a substrate;

a spin valve unit comprising a stacked film formed on said substrate, said stacked film including a first ferromagnetic film a direction of magnetization of which is pinned, a second ferromagnetic film the magnetization of which rotates with a signal magnetic field, and a non-magnetic film disposed between said first and second ferromagnetic films, wherein each of said first ferromagnetic film and said second ferromagnetic films, independently, contains a material selected from the group consisting of Co, CoFe, a CoNi alloy, a CoFeNi alloy and a NiFe alloy, and said non-magnetic film contains a material selected from the group consisting of Cu, Al, Pd, Pt, Rh, Ru, Ir, Au, Ag, CuPd, CuAu and CuNi;

a magnetic film having a higher specific resistance than that of said second ferromagnetic film, formed so as to be in direct magnetic contact with a surface of said second ferromagnetic film, opposite to a surface which is in contact with said non-magnetic film, wherein said magnetic film contains a material selected from the group consisting of CoZrNb, FeZr, FeZrN, CoZrN, FeTaC and NiFeX, where X is selected from the group consisting of Rh, Nb, Zr, Hf, Ta, Re, Ir, Pd, Pt, Cu, Mo, Mn, W, Ti, Cr, Au and Ag; and a pair of leads for supplying a current to said stacked film.

* * * * *